US006996764B2

(12) United States Patent
Yamada

(10) Patent No.: US 6,996,764 B2
(45) Date of Patent: *Feb. 7, 2006

(54) CODING METHOD, RECORDING MEDIUM, DECODING METHOD, AND RECORDING-MEDIUM REPRODUCING APPARATUS

(75) Inventor: Eiji Yamada, Tenri (JP)

(73) Assignee: Sharp Kabushiki Kaisha, Osaka (JP)

(*) Notice: Subject to any disclaimer, the term of this patent is extended or adjusted under 35 U.S.C. 154(b) by 555 days.

This patent is subject to a terminal disclaimer.

(21) Appl. No.: 10/125,037

(22) Filed: Apr. 18, 2002

(65) Prior Publication Data

US 2003/0014714 A1  Jan. 16, 2003

(30) Foreign Application Priority Data

Apr. 18, 2001 (JP) .............................. 2001-119399
Apr. 18, 2001 (JP) .............................. 2001-119400

(51) Int. Cl.
*G11B 20/18* (2006.01)
*H03M 13/45* (2006.01)

(52) U.S. Cl. ...................... 714/755; 714/769; 714/780; 714/792

(58) Field of Classification Search ............... 714/755, 714/780, 792, 769
See application file for complete search history.

(56) References Cited

U.S. PATENT DOCUMENTS

| | | | | |
|---|---|---|---|---|
| 6,353,911 B1 * | 3/2002 | Brink | ........................... | 714/780 |
| 6,377,610 B1 * | 4/2002 | Hagenauer et al. | ......... | 375/136 |
| 6,405,342 B1 * | 6/2002 | Lee | ............................ | 714/792 |
| 6,516,136 B1 * | 2/2003 | Lee | ............................ | 386/124 |
| 6,532,272 B1 * | 3/2003 | Ryan et al. | .................. | 375/348 |
| 6,744,580 B2 * | 6/2004 | Hattori et al. | ................ | 360/40 |
| 6,795,947 B1 * | 9/2004 | Siegel et al. | ................ | 714/802 |
| 2001/0048564 A1 | 12/2001 | Hattori et al. | ................ | 360/39 |
| 2001/0050889 A1 | 12/2001 | Hattori et al. | ........... | 369/59.24 |
| 2001/0052098 A1 | 12/2001 | Miyauchi et al. | ........... | 714/746 |

FOREIGN PATENT DOCUMENTS

| | | |
|---|---|---|
| EP | 1143440 A2 | 10/2001 |
| JP | 2001-266498 | 9/2001 |
| JP | 2001-266499 | 9/2001 |
| JP | 2001-266500 | 9/2001 |
| JP | 2001-266501 | 9/2001 |

OTHER PUBLICATIONS

Oberg, M. et al., "Parity Check Codes for Partial Response Channels", IEEE Globecom 99, Dec. 1999, pp. 717-722.*

(Continued)

*Primary Examiner*—Stephen M. Baker
(74) *Attorney, Agent, or Firm*—David G. Conlin; Peter J. Manus; Edwards & Angell, LLP

(57) ABSTRACT

At a preceding stage of a PR-channel APP decoder out of two APP decoders constituting a turbo decoder is disposed a logarithmic-likelihood computing circuit that computes logarithmic likelihoods $L(y'_i|y_i)$ of a reproduced signal $y'_i$, which is soft information. At a succeeding stage of the PR-channel APP decoder, on the other hand, a likelihood-transform RLL demodulator and a likelihood-transform RLL modulator capable of treating logarithmic likelihood ratios, which are soft information, are disposed between this APP decoder and a convolutional-code APP decoder. Thus, both RLL demodulation and turbo decoding can be fulfilled, and a turbo decoding of high error-correcting capability can be used to reproduce channel data $a_i$ recorded on a recording medium. As a result, the recording density of the recording medium is enhanced.

38 Claims, 29 Drawing Sheets

OTHER PUBLICATIONS

Souvignier, T., et al., "Turbo Codes for PR4: Partallel Versus Serial Concatenation", IEEE ICC 99, Jun. 1999, pp. 1638-1642.*

Fan, J., et al., "Constrained Coding Techniques for Soft Iterative Decoders", IEEE Globecom 99, Dec. 1999, pp. 723-727.*

Catherine Douillard, et al.; Iterative Correction of Intersymbol Interference: Turbo-Equalization; vol. 6, No. 5; Sep.-Oct. 1995; pp 507-511.

Laura L. McPheters, et al.; Concatenated Codes and Iterative (Turbo) Decoding for PRML Optical Recording Channels; SPIE vol. 3864; Jul. 1999; pp 342-344.

* cited by examiner

Fig.4

| PRECEDING CHANNEL BITS | CURRENT CHANNEL BITS | SUCCEEDING CHANNEL BITS | CODE BITS AFTER DEMODULATION |
|---|---|---|---|
| 10 | 000 | XX | 00 |
| 0X | 000 | XX | 01 |
| 00 | 001 | 0X | 01 |
| 01 OR 10 | 001 | 0X | 00 |
| X0 | 010 | 00 | 11 |
| X0 | 010 | 01 OR 10 | 10 |
| 01 | 010 | 00 | 01 |
| 01 | 010 | 01 OR 10 | 00 |
| X0 | 100 | XX | 11 |
| X0 | 101 | 0X | 10 |

| h | $B_{h,1}$ | $B_{h,2}$ | $B_{h,3}$ | $B_{h,4}$ | $B_{h,5}$ | $B_{h,6}$ | $B_{h,7}$ | $B_{h,8}$ | $D_{h,1}$ | $D_{h,2}$ |
|---|---|---|---|---|---|---|---|---|---|---|
| 1 | 0 | 1 | 1 | 1 | 1 | 1 | 1 | 1 | 0 | 0 |
| 2 | 1 | 0 | 0 | 0 | 0 | 0 | 0 | 0 | 0 | 0 |
| 3 | 0 | 1 | 1 | 1 | 1 | 1 | 1 | 0 | 0 | 0 |
| 4 | 1 | 0 | 0 | 0 | 0 | 0 | 0 | 1 | 0 | 0 |
| 5 | 0 | 1 | 1 | 1 | 1 | 1 | 0 | 0 | 0 | 0 |
| 6 | 1 | 0 | 0 | 0 | 0 | 0 | 1 | 1 | 0 | 0 |
| 7 | 0 | 0 | 0 | 0 | 0 | 0 | 0 | 0 | 0 | 1 |
| 8 | 1 | 1 | 1 | 1 | 1 | 1 | 1 | 1 | 0 | 1 |
| 9 | 0 | 0 | 1 | 1 | 1 | 1 | 1 | 1 | 0 | 1 |
| 10 | 1 | 1 | 0 | 0 | 0 | 0 | 0 | 0 | 0 | 1 |
| 11 | 0 | 0 | 0 | 0 | 0 | 0 | 0 | 1 | 0 | 1 |
| 12 | 1 | 1 | 1 | 1 | 1 | 1 | 1 | 0 | 0 | 1 |
| 13 | 0 | 0 | 1 | 1 | 1 | 1 | 1 | 0 | 0 | 1 |
| 14 | 1 | 1 | 0 | 0 | 0 | 0 | 0 | 1 | 0 | 1 |
| 15 | 0 | 0 | 0 | 0 | 0 | 0 | 1 | 1 | 0 | 1 |
| 16 | 1 | 1 | 1 | 1 | 1 | 1 | 0 | 0 | 0 | 1 |
| 17 | 0 | 0 | 1 | 1 | 1 | 1 | 0 | 0 | 0 | 1 |
| 18 | 1 | 1 | 0 | 0 | 0 | 0 | 1 | 1 | 0 | 1 |
| 19 | 0 | 0 | 0 | 0 | 0 | 1 | 1 | 1 | 0 | 1 |
| 20 | 1 | 1 | 1 | 1 | 1 | 0 | 0 | 0 | 0 | 1 |
| 21 | 0 | 0 | 0 | 0 | 0 | 1 | 1 | 0 | 0 | 1 |
| 22 | 1 | 1 | 1 | 1 | 1 | 0 | 0 | 1 | 0 | 1 |
| 23 | 0 | 0 | 1 | 1 | 1 | 0 | 0 | 0 | 0 | 0 |
| 24 | 1 | 1 | 0 | 0 | 0 | 1 | 1 | 1 | 0 | 0 |
| 25 | 0 | 0 | 1 | 1 | 1 | 0 | 0 | 1 | 0 | 0 |
| 26 | 1 | 1 | 0 | 0 | 0 | 1 | 1 | 0 | 0 | 0 |
| 27 | 0 | 1 | 1 | 1 | 1 | 0 | 0 | 0 | 0 | 0 |
| 28 | 1 | 0 | 0 | 0 | 0 | 1 | 1 | 1 | 0 | 0 |
| 29 | 0 | 1 | 1 | 1 | 1 | 0 | 0 | 1 | 0 | 0 |
| 30 | 1 | 0 | 0 | 0 | 0 | 1 | 1 | 0 | 0 | 0 |
| 31 | 0 | 0 | 0 | 0 | 1 | 1 | 1 | 1 | 1 | 1 |
| 32 | 1 | 1 | 1 | 1 | 0 | 0 | 0 | 0 | 1 | 1 |
| 33 | 0 | 1 | 1 | 1 | 0 | 0 | 0 | 0 | 1 | 1 |
| 34 | 1 | 0 | 0 | 0 | 1 | 1 | 1 | 1 | 1 | 1 |

Fig.6

| $h$ | $B_{h,1}$ | $B_{h,2}$ | $B_{h,3}$ | $B_{h,4}$ | $B_{h,5}$ | $B_{h,6}$ | $B_{h,7}$ | $B_{h,8}$ | $D_{h,1}$ | $D_{h,2}$ |
|---|---|---|---|---|---|---|---|---|---|---|
| 35 | 0 | 0 | 0 | 0 | 1 | 1 | 1 | 0 | 1 | 0 |
| 36 | 1 | 1 | 1 | 1 | 0 | 0 | 0 | 1 | 1 | 0 |
| 37 | 0 | 1 | 1 | 1 | 0 | 0 | 0 | 1 | 1 | 0 |
| 38 | 1 | 0 | 0 | 0 | 1 | 1 | 1 | 0 | 1 | 0 |
| 39 | 0 | 0 | 0 | 0 | 1 | 1 | 0 | 0 | 1 | 0 |
| 40 | 1 | 1 | 1 | 1 | 0 | 0 | 1 | 1 | 1 | 0 |
| 41 | 0 | 1 | 1 | 1 | 0 | 0 | 1 | 1 | 1 | 0 |
| 42 | 1 | 0 | 0 | 0 | 1 | 1 | 0 | 0 | 1 | 0 |
| 43 | 0 | 0 | 1 | 1 | 0 | 0 | 0 | 0 | 0 | 1 |
| 44 | 1 | 1 | 0 | 0 | 1 | 1 | 1 | 1 | 0 | 1 |
| 45 | 0 | 0 | 1 | 1 | 0 | 0 | 0 | 1 | 0 | 0 |
| 46 | 1 | 1 | 0 | 0 | 1 | 1 | 1 | 0 | 0 | 0 |
| 47 | 0 | 0 | 1 | 1 | 0 | 0 | 1 | 1 | 0 | 0 |
| 48 | 1 | 1 | 0 | 0 | 1 | 1 | 0 | 0 | 0 | 0 |
| 49 | 0 | 0 | 0 | 1 | 1 | 1 | 1 | 1 | 1 | 1 |
| 50 | 1 | 1 | 1 | 0 | 0 | 0 | 0 | 0 | 1 | 1 |
| 51 | 0 | 1 | 1 | 0 | 0 | 0 | 0 | 0 | 1 | 1 |
| 52 | 1 | 0 | 0 | 1 | 1 | 1 | 1 | 1 | 1 | 1 |
| 53 | 0 | 0 | 0 | 1 | 1 | 1 | 1 | 0 | 1 | 1 |
| 54 | 1 | 1 | 1 | 0 | 0 | 0 | 0 | 1 | 1 | 1 |
| 55 | 0 | 1 | 1 | 0 | 0 | 0 | 0 | 1 | 1 | 1 |
| 56 | 1 | 0 | 0 | 1 | 1 | 1 | 1 | 0 | 1 | 1 |
| 57 | 0 | 0 | 0 | 1 | 1 | 1 | 0 | 0 | 1 | 1 |
| 58 | 1 | 1 | 1 | 0 | 0 | 0 | 1 | 1 | 1 | 1 |
| 59 | 0 | 1 | 1 | 0 | 0 | 0 | 1 | 1 | 1 | 1 |
| 60 | 1 | 0 | 0 | 1 | 1 | 1 | 0 | 0 | 1 | 1 |
| 61 | 1 | 1 | 1 | 0 | 0 | 1 | 1 | 1 | 1 | 0 |
| 62 | 0 | 0 | 0 | 1 | 1 | 0 | 0 | 0 | 1 | 0 |
| 63 | 0 | 0 | 0 | 1 | 1 | 0 | 0 | 1 | 1 | 0 |
| 64 | 1 | 1 | 1 | 0 | 0 | 1 | 1 | 0 | 1 | 0 |
| 65 | 0 | 1 | 1 | 0 | 0 | 1 | 1 | 1 | 1 | 0 |
| 66 | 1 | 0 | 0 | 1 | 1 | 0 | 0 | 0 | 1 | 0 |
| 67 | 0 | 1 | 1 | 0 | 0 | 1 | 1 | 0 | 1 | 0 |
| 68 | 1 | 0 | 0 | 1 | 1 | 0 | 0 | 1 | 1 | 0 |

Fig.11

| $a_{i-1}$ | $a_i$ | $z_i$ |
|---|---|---|
| $-1$ | $-1$ | $-1$ |
| $-1$ | $+1$ | $+1$ |
| $+1$ | $-1$ | $+1$ |
| $+1$ | $+1$ | $-1$ |

Fig.13

| h | $B_{h,1}$ | $B_{h,2}$ | $B_{h,3}$ | $B_{h,4}$ | $B_{h,5}$ | $B_{h,6}$ | $B_{h,7}$ | $D_{h,1}$ | $D_{h,2}$ |
|---|---|---|---|---|---|---|---|---|---|
| 1 | 1 | 0 | 0 | 0 | 0 | 0 | 0 | 0 | 0 |
| 2 | 1 | 0 | 0 | 0 | 0 | 0 | 1 | 0 | 0 |
| 3 | 1 | 0 | 0 | 0 | 0 | 1 | 0 | 0 | 0 |
| 4 | 0 | 0 | 0 | 0 | 0 | 0 | 0 | 0 | 1 |
| 5 | 0 | 1 | 0 | 0 | 0 | 0 | 0 | 0 | 1 |
| 6 | 0 | 0 | 0 | 0 | 0 | 0 | 1 | 0 | 1 |
| 7 | 0 | 1 | 0 | 0 | 0 | 0 | 1 | 0 | 1 |
| 8 | 0 | 0 | 0 | 0 | 0 | 1 | 0 | 0 | 1 |
| 9 | 0 | 1 | 0 | 0 | 0 | 1 | 0 | 0 | 1 |
| 10 | 0 | 0 | 0 | 0 | 1 | 0 | 0 | 0 | 1 |
| 11 | 0 | 0 | 0 | 0 | 1 | 0 | 1 | 0 | 1 |
| 12 | 0 | 1 | 0 | 0 | 1 | 0 | 0 | 0 | 0 |
| 13 | 0 | 1 | 0 | 0 | 1 | 0 | 1 | 0 | 0 |
| 14 | 1 | 0 | 0 | 0 | 1 | 0 | 0 | 0 | 0 |
| 15 | 1 | 0 | 0 | 0 | 1 | 0 | 1 | 0 | 0 |
| 16 | 0 | 0 | 0 | 1 | 0 | 0 | 0 | 1 | 1 |
| 17 | 1 | 0 | 0 | 1 | 0 | 0 | 0 | 1 | 1 |
| 18 | 0 | 0 | 0 | 1 | 0 | 0 | 1 | 1 | 0 |
| 19 | 1 | 0 | 0 | 1 | 0 | 0 | 1 | 1 | 0 |
| 20 | 0 | 0 | 0 | 1 | 0 | 1 | 0 | 1 | 0 |
| 21 | 1 | 0 | 0 | 1 | 0 | 1 | 0 | 1 | 0 |
| 22 | 0 | 1 | 0 | 1 | 0 | 0 | 0 | 0 | 1 |
| 23 | 0 | 1 | 0 | 1 | 0 | 0 | 1 | 0 | 0 |
| 24 | 0 | 1 | 0 | 1 | 0 | 1 | 0 | 0 | 0 |
| 25 | 0 | 0 | 1 | 0 | 0 | 0 | 0 | 1 | 1 |
| 26 | 1 | 0 | 1 | 0 | 0 | 0 | 0 | 1 | 1 |
| 27 | 0 | 0 | 1 | 0 | 0 | 0 | 1 | 1 | 1 |
| 28 | 1 | 0 | 1 | 0 | 0 | 0 | 1 | 1 | 1 |
| 29 | 0 | 0 | 1 | 0 | 0 | 1 | 0 | 1 | 1 |
| 30 | 1 | 0 | 1 | 0 | 0 | 1 | 0 | 1 | 1 |
| 31 | 0 | 0 | 1 | 0 | 1 | 0 | 0 | 1 | 0 |
| 32 | 0 | 0 | 1 | 0 | 1 | 0 | 1 | 1 | 0 |
| 33 | 1 | 0 | 1 | 0 | 1 | 0 | 0 | 1 | 0 |
| 34 | 1 | 0 | 1 | 0 | 1 | 0 | 1 | 1 | 0 |

*Fig.14*

| PRECEDING CHANNEL BIT | CURRENT INPUT BITS | SUCCEEDING INPUT BITS | CHANNEL BITS RLL(1,7) |
|---|---|---|---|
| X | 00 | 0X | 001 |
| 0 | 00 | 1X | 000 |
| 1 | 00 | 1X | 010 |
| 0 | 01 | 0X | 001 |
| 0 | 01 | 1X | 000 |
| 1 | 01 | 00 | 010 |
| 1 | 01 | NON-00 | 000 |
| 0 | 10 | 0X | 101 |
| 0 | 10 | 1X | 010 |
| 0 | 11 | 00 | 010 |
| 0 | 11 | NON-00 | 100 |

NON-00 : 01, 10, 11
X : 1 OR 0

Fig.15

| h | $D''_{h,1}$ | $D''_{h,2}$ | $D''_{h,3}$ | $D''_{h,4}$ | $D''_{h,5}$ | $B''_{h,1}$ | $B''_{h,2}$ | $B''_{h,3}$ | $B''_{h,4}$ |
|---|---|---|---|---|---|---|---|---|---|
| 1 | 0 | 0 | 0 | 0 | 0 | 0 | 0 | 1 | 1 |
| 2 | 0 | 0 | 0 | 1 | 0 | 0 | 0 | 1 | 1 |
| 3 | 0 | 0 | 0 | 0 | 1 | 0 | 0 | 1 | 1 |
| 4 | 0 | 0 | 0 | 1 | 1 | 0 | 0 | 1 | 1 |
| 5 | 0 | 0 | 1 | 0 | 0 | 0 | 0 | 0 | 0 |
| 6 | 0 | 0 | 1 | 1 | 0 | 0 | 0 | 0 | 0 |
| 7 | 0 | 0 | 1 | 0 | 1 | 0 | 1 | 0 | 0 |
| 8 | 0 | 0 | 1 | 1 | 1 | 0 | 1 | 0 | 0 |
| 9 | 0 | 1 | 0 | 0 | 0 | 0 | 0 | 1 | 1 |
| 10 | 0 | 1 | 0 | 1 | 0 | 0 | 0 | 1 | 1 |
| 11 | 0 | 1 | 1 | 0 | 0 | 0 | 0 | 0 | 0 |
| 12 | 0 | 1 | 1 | 1 | 0 | 0 | 0 | 0 | 0 |
| 13 | 0 | 1 | 0 | 0 | 1 | 0 | 1 | 0 | 0 |
| 14 | 0 | 1 | 0 | 1 | 1 | 0 | 0 | 0 | 0 |
| 15 | 0 | 1 | 1 | 0 | 1 | 0 | 0 | 0 | 0 |
| 16 | 0 | 1 | 1 | 1 | 1 | 0 | 0 | 0 | 0 |
| 17 | 1 | 0 | 0 | 0 | 0 | 1 | 0 | 1 | 1 |
| 18 | 1 | 0 | 0 | 1 | 0 | 1 | 0 | 1 | 1 |
| 19 | 1 | 0 | 1 | 0 | 0 | 0 | 1 | 0 | 0 |
| 20 | 1 | 0 | 1 | 1 | 0 | 0 | 1 | 0 | 0 |
| 21 | 1 | 1 | 0 | 0 | 0 | 0 | 1 | 0 | 0 |
| 22 | 1 | 1 | 0 | 1 | 0 | 1 | 0 | 0 | 0 |
| 23 | 1 | 1 | 1 | 0 | 0 | 1 | 0 | 0 | 0 |
| 24 | 1 | 1 | 1 | 1 | 0 | 1 | 0 | 0 | 0 |

US 6,996,764 B2

1

CODING METHOD, RECORDING MEDIUM, DECODING METHOD, AND RECORDING-MEDIUM REPRODUCING APPARATUS

BACKGROUND OF THE INVENTION

The present invention relates to a coding method and recording medium, a decoding method, a demodulation method, an error-correcting method, and a recording-medium reproducing apparatus, for subjecting information data to an error-correcting coding and a modulation based on symbol correspondence rules to create channel data, recording the channel data onto a recording medium, and subjecting channel data reproduced from the recording medium to a demodulation based on symbol correspondence rules and an error-correcting decoding to reconstruct the information data.

Among error-correcting methods, the turbo code method has been capturing the spotlight mainly in the communication field by virtue of its having such high performance as to approach the theoretical limit of the transmission rate at which transmission can be achieved without errors (namely, Shannon limit).

Further, studies on applications of the turbo code method to the recording medium field as well, not only the above-noted communication field, have energetically been published.

A recording and reproducing apparatus using this turbo code is explained briefly. FIG. 27 is a schematic diagram of a recording and reproducing apparatus which performs coding and decoding processes of turbo codes. A convolutional coder 1 performs convolutional coding on inputted information data $u_i$ to output code data $c_i$. An interleaver 2 performs a pseudo-random substitution on the inputted code data $c_i$ to output channel data $a_i$. The channel data $a_i$ outputted in this way is transmitted to a partial response (hereinafter, abbreviated as PR) channel 3. This PR channel 3 has a property that adjacent channel data $a_i$ interfere with each other. As a result of this, an intersymbol interference occurs to a reproduced signal $y'_i$ reproduced from the PR channel 3. Also, the channel data $a_i$, when passing the PR channel 3, undergoes deformation such as noise addition, band limiting or crosstalk. Therefore, the reproduced signal $y'_i$ reproduced from the PR channel 3 has errors added thereto.

A logarithmic-likelihood computing unit 4, to which the reproduced signal $y'_i$ is inputted, computes logarithmic likelihoods $L(y'_i|y_i)$, outputting the logarithmic likelihoods $L(y'_i|y_i)$ of the reproduced signal $y'_i$. It is noted here that $y_i$ is a reproduced signal resulting when the PR channel 3 is ideal. The term 'ideal' refers to a case where there occurs no deformation due to noise or the like so that transfer characteristics of the PR channel 3 are equal to PR transfer characteristics. The logarithmic likelihoods $L(y'_i|y_i)$ are inputted to a code input terminal c;I of an a posteriori probability (hereinafter, abbreviated as APP) decoder 5 for the PR channel. It is noted here that a symbol with a prime (') indicates that the symbol is data reconstructed after reproduction, and a symbol without a prime (') indicates that the symbol is data before recording.

Generally, an APP decoder has 2-input and 2-output terminals, i.e., an information input terminal u;I into which the likelihood of information data is inputted, a code input terminal c;I into which the likelihood of code data is inputted, an information output terminal u;O from which the likelihood of information data is outputted, and a code

2 output terminal c;O from which the likelihood of code data is outputted. The APP decoder, receiving inputs of an information-data likelihood and a code-data likelihood, updates those likelihoods in compliance with constraints concerning codes. It is noted that a likelihood inputted to the information input terminal u;I is called a priori information. From the information output terminal u;O, a likelihood of updated information data is outputted. From the code output terminal c;O, a likelihood of updated code data is outputted. It is noted that the terms "information data" refers to data inputted to a coder corresponding to an APP decoder, and the terms "code data" refers to data outputted from the coder.

Therefore, in the PR-channel APP decoder 5, logarithmic likelihoods $L(y'_i|y_i)$ of the reproduced signal $y'_i$ are inputted to the code input terminal c;I, and an output $L(a'_i;I)$ of an interleaver 11 is inputted to the information input terminal u;I. Further, from the information output terminal u;O, logarithmic-likelihood ratios $L(a'_i;O)$ of channel data $a'_i$ are outputted. It is noted that the code output terminal c;O, from which the logarithmic likelihoods $L(y'_i;O)$ of the PR channel data $y'_i$ are outputted, is connected to none.

A subtracter 6 subtracts the output $L(a'_i;I)$ of the interleaver 11 from the logarithmic-likelihood ratios $L(a'_i;O)$ of the channel data $a'_i$ derived from the PR-channel APP decoder 5, outputting a subtraction result thereof as an Lext($a'_i$). That is, the subtracter 6 calculates a logarithmic-likelihood ratio difference with respect to the channel data $a'_i$.

A deinterleaver 7 performs an inverse substitution of the aforementioned pseudo-random substitution on the Lext($a'_i$) inputted from the subtracter 6, outputting logarithmic-likelihood ratios $L(c'_i;I)$ of the code data $c'_i$. In an APP decoder 8 for convolutional codes, the logarithmic-likelihood ratio $L(c'_i;I)$ derived from the deinterleaver 7 is inputted to the code input terminal c;I, while a zero is inputted to the information input terminal u;I. Then, a logarithmic-likelihood ratio $L(u'_i;O)$ of the information data $u'_i$ is outputted from the information output terminal u;O to information data $u'_i$, while a logarithmic-likelihood ratio $L(c'_i;O)$ of the code data $c'_i$ is outputted from the code output terminal c;O. Thus, the logarithmic-likelihood ratio $L(u'_i;O)$ of the information data $u'_i$ outputted from the information output terminal u;O of the convolutional-code APP decoder 8 is binarized by a comparator 9 and outputted as reconstructed information data $u'_i$.

A subtracter 10 receives an input of the logarithmic-likelihood ratio $L(c'_i;O)$ of the code data $c'_i$ outputted from the code output terminal c;O of the APP decoder 8 for convolutional codes as well as an input of the logarithmic-likelihood ratio $L(c'_i;I)$ of the code data $c'_i$ derived from the deinterleaver 7. Then, the logarithmic-likelihood ratio $L(c'_i;I)$ is subtracted from the logarithmic-likelihood ratio $L(c'_i;O)$, and a subtraction result thereof is outputted as an Lext($c'_i$). That is, the subtracter 10 calculates a logarithmic-likelihood ratio difference with respect to the code data $c'_i$.

The interleaver 11 performs the aforementioned pseudo-random substitution on the Lext($c'_i$) inputted from the subtracter 10, outputting logarithmic-likelihood ratios $L(a'_i;I)$ of the channel data $a'_i$. The logarithmic-likelihood ratio $L(a'_i;I)$ of the channel data $a'_i$ outputted from the interleaver 11 in this way is inputted to the information input terminal u;I of the PR-channel APP decoder 5 as described above.

The operation of performing iterative decoding by repeatedly delivering logarithmic-likelihood ratios between the two APP decoders of the PR-channel APP decoder 5 and the convolutional-code APP decoder 8 as described above is referred to as turbo decoding. With the use of this turbo decoding, errors of the reconstructed information data $u'_i$ can be decreased. In this case, at a first-time decoding operation, the $L(a'_i;I)$ to be inputted to the information input terminal u;I of the PR-channel APP decoder 5 is assumed to be zero.

It is noted that the principle of operation of the turbo decoding is described in detail, for example, in Reference 1 "Iterative Correction of Intersymbol Interference: Turbo-Equalization," European Transactions on Telecommunications, Vol. 6, No. 5, pp. 507–511, September–October 1995," and Reference 2 "Concatenated Codes and Iterative (Turbo) Decoding for PRML Optical Recording Channels," Joint International Symposium on Optical Memory and Optical Data Storage 1999, SPIE Vol. 3864, pp. 342–344, July 1999."

In that case, as described above, information to be inputted to the code input terminal c;I of the PR-channel APP decoder 5 needs to be soft information like the logarithmic likelihoods $L(y'_i|y_i)$ Each piece of information to be delivered between the two APP decoders 5, 8 also needs to be soft information like $L(a'_i;O)$, $Lext(c'_i)$, $L(a'_i;I)$, $L(c'_i;O)$, $Lext(a'_i)$ and $L(c'_i;I)$ In the case where the PR channel 3 is a recording medium, i.e., in the case of a system which performs recording and reproduction on media such as magnetic recording, magneto-optical recording and optical recording, there exist constraints such as band limiting of the PR channel 3, intersymbol interference, clock synchronization and the like. Therefore, the Run Length Limited (hereinafter, referred to as RLL) method is usually used for the modulation method. Generally, RLL data is expressed as RLL(d, k). It is noted here that "d" and "k" represents minimum and maximum run lengths of 0's in a channel data train according to the NRZI (non-return-to-zero-inverted) rules.

Referring to the RLL in more detail, polarity inversion intervals of recording waveform trains are limited to a minimum polarity-inversion interval Tmin and a maximum polarity-inversion interval Tmax. That is, inversion intervals T of recording waveform trains are within the limits of Tmin≦T≦Tmax. Generally, the minimum polarity-inversion interval Tmin is expressed as (d+1)×Tw. The maximum polarity-inversion interval Tmax is expressed as (k+1)×Tw. It is noted here that "Tw," which denotes the width of a detection window for reproduced signals, is Tw=η×Tb, equal to the greatest common measure of polarity-inversion intervals. It is noted that "Tb" denotes a data interval before modulation. The symbol "η," called code rate, is equal to m/n. That is, pre-modulation m bits are transformed into post-modulation n bits.

These RLL modulation and RLL demodulation are performed generally by logical operation circuits. Otherwise, those modulation and demodulation are achieved by preparatorily storing results of logical operations in ROM (Read-Only Memory) and referring to this ROM as a table. Therefore, input data of the RLL demodulation is hard information, and output data of the RLL demodulation is also hard information.

FIG. 28 is a schematic diagram of a prior-art recording and reproducing apparatus in which the RLL modulation method is applied to transmission and reproduction of information to the PR channel. An error-correcting coder 15 performs error-correcting coding on inputted information data $u_i$, and outputs code data $c_i$. An RLL modulator 16 performs RLL modulation on inputted code data $c_i$, and outputs channel data $a_i$. The channel data $a_i$ outputted in this way is transmitted to a PR channel 17.

As described above, a reproduced signal $y'_i$ reproduced from the PR channel 17 has errors added thereto. The maximum likelihood (hereinafter, abbreviated as ML) decoder 18 presumes and outputs channel data $a'_i$ from the inputted reproduced signal $y'_i$ based on intersymbol interference due to characteristics of the PR channel 17 and on the RLL condition. It is noted here that the terms "RLL condition" mean that inversion intervals T of recording waveform trains are within the limits of Tmin≦T≦Tmax. The ML decoding, which is generally calculated according to Viterbi algorithms, is often called Viterbi decoding. It is noted here that the ML decoder 18 in principle outputs presuming results as hard information. That is, the presumed channel data $a'_i$ is binary data.

An RLL demodulator 19 performs a demodulation on the reconstructed channel data $a'_i$, outputting reconstructed code data $c'_i$. An error-correcting decoder 20 performs on the inputted code data $c'_i$ correction of the errors added in the PR channel 17, outputting reconstructed information data $u'_i$.

The method in which data reproduced from the PR channel 17 is processed for ML decoding in the manner as described above is called PRML (Partial Response Maximum Likelihood) method, and is widely used for recording-medium reproducing apparatus.

FIG. 29 is a block diagram showing the construction of a prior-art RLL demodulator 19. Reconstructed channel data $a'_i$ outputted from the ML decoder 18 shown in FIG. 28 is inputted to a p-stage shift register 21. Generally, the number p of stages of this shift register 21 is not less than n. The p-stage shift register 21 shifts data in steps of the interval Tw, outputting parallel data $(a'_1, a'_2, \ldots, a'_k, \ldots, a'_p)$. A logical operation circuit 22, receiving inputs of the parallel data $(a'_1, a'_2, \ldots, a'_k, \ldots, a'_p)$, performs the above-described logical operations, outputting post-demodulation parallel data $(c'_1, c'_2, \ldots, c'_j, \ldots, c'_m)$. An m-stage shift register 23 with a parallel load function performs parallel loading of the post-demodulation parallel data $(c'_1, c'_2, \ldots, c'_j, \ldots, c'_m)$, and shifts the data in steps of the interval Tb, outputting post-demodulation serial data $c'_i$. The above logical operation and parallel loading are performed synchronously every interval (m×Tb).

As described above, the RLL demodulator 19, receiving an input of hard-information (i.e., binarized) channel data $a'_i$, performs demodulation on the data, outputting hard-information (i.e., binarized) post-demodulation code data $c'_i$.

However, the above-described prior-art recording and reproducing apparatus has problems shown below.

As described above, in the case where the RLL modulation method is used, the RLL demodulator 19 outputs code data $c'_i$ as hard information. On one hand, channel data $a'_i$ to be inputted to the RLL demodulator 19 needs to be hard information. On the other hand, for the turbo decoding method that uses two APP decoders, the PR-channel APP decoder 5 and the convolutional-code APP decoder 8, as shown in FIG. 27, it is necessary to input reconstructed code data $c'_i$ as soft information.

Therefore, in making up a recording and reproducing apparatus which adopts the above PR channel 17 as a recording medium, the turbo decoder is unusable and the PRML has to be used since the RLL demodulator 19 is used. Therefore, as compared with the case where a turbo decoder is used, there is a problem that recording density to the recording medium lowers.

SUMMARY OF THE INVENTION

Accordingly, an object of the present invention is to provide a coding method in the RLL modulation method to which turbo decoding can be applied, a recording medium on which channel data provided by this coding method has been recorded, a decoding method for turbo-decoding a reproduced signal reproduced from the recording medium, and a recording-medium reproducing apparatus using this decoding method.

A further object of the invention is to provide a demodulation method capable of outputting post-demodulation code data as soft information so that turbo decoding becomes applicable, as well as an error-correcting method using this demodulation method, and a recording-medium reproducing apparatus using this error-correcting method.

In order to achieve the above object, in a first aspect of the invention, there is provided a coding method comprising: subjecting information data sequentially to a convolutional coding by coding means, a pseudo-random substitution by interleaving means and a Run Length Limited modulation by modulation means to thereby create channel data.

With this constitution, a turbo coding method to which convolutional coding, pseudo-random substitution and RLL modulation are applied is implemented.

In a second aspect of the invention, there is provided a recording medium on which channel data created by the coding method is recorded.

With this constitution, there can be obtained a recording medium capable of reconstructing the information data recorded thereon by the turbo decoding method to which RLL demodulation and RLL modulation are applied.

In a third aspect of the invention, there is provided a decoding method for decoding of information data which has been subjected sequentially to an error-correcting coding, a pseudo-random substitution and a modulation so as to be formed into channel data, the channel data being to be reproduced over a passage through a channel, where the information data is decoded based on reproduced data of the channel data, the decoding method comprising the steps of:

computing bit-wise probabilities of the reproduced data by probability computing means;

performing a first APP (A Posteriori Probability) decoding process for, upon receiving inputs of bit-wise probabilities of the reproduced data and a priori information concerning channel data, creating and outputting a posteriori probabilities of the channel data in compliance with constraints concerning the channel data by a first APP (A Posteriori Probability) decoding means;

performing a second APP (A Posteriori Probability) decoding process for, upon receiving inputs of a priori information concerning code data, creating and outputting a posteriori probabilities of the information data and a posteriori probabilities of the code data in compliance with constraints concerning error-correcting codes by a second APP (A Posteriori Probability) decoding means; and performing a transform process for, upon receiving inputs of the a posteriori probabilities of channel data created by the first APP decoding process and the a posteriori probabilities of code data created by the second APP decoding process, performing by information transform means a demodulation on information concerning the a posteriori probabilities of channel data as well as a modulation on information concerning the a posteriori probabilities of code data and moreover creating extrinsic information concerning code data updated by the first APP decoding process and outputting the extrinsic information as a priori information concerning the code data to the second APP decoding process while creating extrinsic information concerning channel data updated by the second APP decoding process and outputting the extrinsic information as a priori information concerning the channel data to the first APP decoding process, where the first APP decoding process, second APP decoding process and transform process iteratively performed to implement an iterative decoding.

With this constitution, by the transform process, the demodulation of a posteriori probabilities of channel data resulting from the first APP decoding process, as well as extrinsic information concerning code data based thereon, is carried out, and the modulation of extrinsic information concerning channel data based on a posteriori probabilities of code data resulting from the second APP decoding process is carried out. Thus, there can be implemented a turbo decoding method to which demodulation and modulation capable of treating soft information are applied, that is, a turbo decoding method suitable for reproduction of recording media.

In an embodiment, the transform process comprising:

a first process of subjecting the inputted a posteriori probabilities of channel data sequentially to a demodulation by a probability transform method and an inverse substitution of pseudo-random substitution;

a second process of subjecting the inputted a posteriori probabilities of code data sequentially to the pseudo-random substitution and a modulation by a probability transform method;

a third process of, based on intermediate results of the first process for the a posteriori probabilities of channel data as well as intermediate results of the second process for the a posteriori probabilities of code data, transforming a posteriori probabilities obtained as the intermediate results of the first process into extrinsic information, and moreover making the first process proceed with the resulting extrinsic information, during the first and second processes; and a fourth process of, based on intermediate results of the second process for the a posteriori probabilities of code data as well as intermediate results of the first process for the a posteriori probabilities of channel data, transforming a posteriori probabilities obtained as the intermediate results of the second process into extrinsic information, and moreover making the second process proceed with the resulting extrinsic information, during the first and second processes, whereby extrinsic information concerning the code data and extrinsic information concerning the channel data are created.

According to this embodiment, by the arrangement that the transform process fulfills the functions of demodulation by the probability transform method and modulation by the probability transform method as well as the function of creating extrinsic information concerning data updated by the first and second APP decoding processes, creation of the extrinsic information is enabled even in cases where demodulation and modulation are applied to the turbo decoding method.

In an embodiment, the demodulation by the probability transform method comprises the steps of:

calculating post-demodulation data from pre-demodulation data according to symbol correspondence rules between pre-demodulation data and post-demodulation data by demodulation computing means, where a unit of concatenated bits in digital data is taken as a symbol; and computing symbol-wise probabilities of post-demodulation data from bit-wise probabilities of the pre-demodulation data according to the symbol correspondence rules and computing bit-wise probabilities of the post-demodulation data from symbol-wise probabilities of the post-demodulation data, by the demodulation computing means, to thereby obtain bit-wise probabilities of the post-demodulation data from bit-wise probabilities of the pre-demodulation data.

In an embodiment, the demodulation by the probability transform method comprises the steps of:

calculating post-demodulation data from pre-demodulation data by demodulation computing means according to correspondence rules between symbols of pre-demodulation data as well as current internal states of the demodulation computing means and symbols of post-demodulation data as well as succeeding internal states of the demodulation computing means, where a unit of concatenated bits in digital data is taken as a symbol; and computing symbol-wise probabilities of post-demodulation data and symbol-wise probabilities of succeeding internal states from bit-wise probabilities of the pre-demodulation data and bit-wise probabilities of current internal states according to the symbol correspondence rules, computing bit-wise probabilities of the post-demodulation data from symbol-wise probabilities of the post-demodulation data, and computing bit-wise probabilities of the succeeding internal states from symbol-wise probabilities of the succeeding internal states, by the demodulation computing means, to thereby obtain bit-wise probabilities of the post-demodulation data from bit-wise probabilities of the pre-demodulation data.

According to these embodiments, upon inputs of bit-wise probabilities of pre-demodulation data, bit-wise probabilities of post-demodulation data can be obtained by the demodulation computing means. The bit-wise probabilities of these pre- and post-demodulation data are real numbers, which are soft information. Thus, there can be implemented a decoding method to which demodulation capable of inputting and outputting soft information is applied.

In an embodiment, the modulation by the probability transform method comprises the steps of:

calculating post-modulation data from pre-modulation data according to symbol correspondence rules between pre-modulation data and post-modulation data by modulation computing means, where a unit of concatenated bits in digital data is taken as a symbol; and computing symbol-wise probabilities of post-modulation data from bit-wise probabilities of the pre-modulation data according to the symbol correspondence rules and computing bit-wise probabilities of post-modulation data from symbol-wise probabilities of the post-modulation data, by the modulation computing means, to thereby obtain bit-wise probabilities of the post-modulation data from bit-wise probabilities of the pre-modulation data.

In an embodiment, the modulation by the probability transform method comprises the steps of:

calculating post-modulation data from pre-modulation data according to correspondence rules between symbols of pre-modulation data as well as current internal states of modulation computing means and symbols of post-modulation data as well as succeeding internal states of the modulation computing means by the modulation computing means, where a unit of concatenated bits in digital data is taken as a symbol; and computing symbol-wise probabilities of post-modulation data and symbol-wise probabilities of succeeding internal states from bit-wise probabilities of the pre-modulation data and bit-wise probabilities of current internal states according to the symbol correspondence rules, computing bit-wise probabilities of the post-modulation data from symbol-wise probabilities of the post-modulation data, and computing bit-wise probabilities of the succeeding internal states from symbol-wise probabilities of the succeeding internal states, by the modulation computing means, to thereby obtain bit-wise probabilities of the post-modulation data from bit-wise probabilities of the pre-modulation data.

According to these embodiments, upon inputs of bit-wise probabilities of pre-modulation data, bit-wise probabilities of post-modulation data can be obtained by the modulation computing means. The bit-wise probabilities of these pre- and post-modulation data are real numbers, which are soft information. Thus, there can be implemented a decoding method to which modulation capable of inputting and outputting soft information is applied.

In an embodiment, the symbol correspondence rules are given by a rule table.

According to this embodiment, the transform of bit-wise probabilities of the demodulation data or the modulation data by the demodulation computing means or the modulation computing means is implemented by arithmetic operations derived according to the rule table.

In an embodiment, the symbol correspondence rules are given by a logical expression.

According to this embodiment, the transform of bit-wise probabilities of the demodulation data or the modulation data by the demodulation computing means or the modulation computing means is implemented by arithmetic operations derived according to the logical expression.

In an embodiment, the probabilities are given by using logarithmic-likelihood ratios.

According to this embodiment, in the processes that the bit-wise probabilities of the demodulation data or the modulation data are transformed by the demodulation computing means or the modulation computing means, computing amount for the transform is reduced.

In an embodiment, the modulation to which the information data is subjected to create channel data to be passed through the channel is RLL (Run Length Limited) modulation, and the symbol correspondence rules are symbol correspondence rules based on an RLL modulation method.

According to this embodiment, modulation and demodulation methods by the RLL method is implemented. Thus, the decoding method becomes applicable to the decoding of reproduced signals from recording media that require the RLL modulation method.

In an embodiment, the probabilities and the a posteriori probabilities are given by using logarithmic-likelihood ratios, and the a priori information and the extrinsic information are given by using values of the logarithmic-likelihood ratios.

According to this embodiment, in the processes of computation, creation and transform by the probability computing means, the first APP decoding means, the second APP decoding means and the information transform means, the computing amount is reduced.

In an embodiment, the constraints concerning channel data applied to the first APP decoding process are at least one of either constraints concerning the modulation method of the modulation to which the information data is subjected or constraints concerning the channel.

According to this embodiment, the first APP decoding process suitable for the applicable modulation method or channel is implemented.

In an embodiment, the constraints concerning the modulation method are given by an RLL.

According to this embodiment, the modulation method is an RLL modulation method. With the channel given by a recording medium, the first APP decoding process matching the recording medium is performed.

In an embodiment, the constraints concerning the channel are given by constraints concerning PR transfer characteristics.

According to this embodiment, the first APP decoding process matching the PR channel is implemented.

In an embodiment, the error-correcting coding to which the information data is subjected to create channel data to be passed through the channel is convolutional coding.

According to this embodiment, an error-correcting coding suitable for turbo decoding is implemented.

In a fourth aspect of the invention, there is provided a recording-medium reproducing apparatus comprising:

reproduction means for, from a recording medium on which channel data is recorded, the channel data resulting from subjecting information data sequentially to error-correcting coding, pseudo-random substitution and modulation, reproducing the recorded channel data and outputting the reproduced data; and decoding means for obtaining a posteriori probabilities of the information data from the reproduced data by the decoding method as defined in claim 3 and reconstructing the information data according to the a posteriori probabilities of the information data.

With this constitution, by applying the RLL demodulation method and the RLL modulation method to the demodulation and modulation by the information transform means of the decoding means, a recording medium on which channel data created by a coding method to which RLL modulation and turbo coding are applied has been recorded becomes becomes reproducible. As a result, the recording density of the recording medium is enhanced.

In a fifth aspect of the invention, there is provided a decoding method for calculating post-demodulation data from pre-demodulation data by demodulation computing means according to symbol correspondence rules between pre-demodulation data and post-demodulation data, where a unit of concatenated bits in digital data is taken as a symbol, the demodulation method comprising the steps of:

computing bit-wise likelihoods of the inputted pre-demodulation data by likelihood computing means; and computing symbol-wise likelihoods of post-demodulation data from bit-wise likelihoods of the pre-demodulation data by the demodulation computing means according to the symbol correspondence rules, and computing bit-wise likelihoods of post-demodulation data from the symbol-wise likelihoods of the post-demodulation data, to thereby obtain bit-wise likelihoods of the post-demodulation data from the bit-wise likelihoods of the pre-demodulation data.

With this constitution, bit-wise likelihoods of post-demodulation data are obtained by the demodulation computing means. The bit-wise probabilities of the post-demodulation data are real numbers, which are soft information. Thus, there can be implemented a demodulation method which is capable of outputting soft information and, therefore, which enables turbo decoding.

In a sixth aspect of the invention, there is provided a demodulation method for calculating post-demodulation data from pre-demodulation data by demodulation computing means according to correspondence rules between symbols of pre-demodulation data as well as current internal states of the demodulation computing means and symbols of post-demodulation data as well as succeeding internal states of the demodulation computing means, where a unit of concatenated bits in digital data is taken as a symbol, the demodulation method comprising the steps of:

computing bit-wise likelihoods of the inputted pre-demodulation data by likelihood computing means; and by the demodulation computing means, computing symbol-wise likelihoods of post-demodulation data and symbol-wise likelihoods of succeeding internal states from bit-wise likelihoods of the pre-demodulation data and bit-wise likelihoods of current internal states according to the symbol correspondence rules, computing bit-wise likelihoods of post-demodulation data from the symbol-wise likelihoods of the post-demodulation data, and computing bit-wise likelihoods of succeeding internal states from the symbol-wise likelihoods of the succeeding internal states, to thereby obtain bit-wise likelihoods of the post-demodulation data from the bit-wise likelihoods of the pre-demodulation data.

With this constitution, bit-wise likelihoods of post-demodulation data are obtained by the demodulation computing means. The bit-wise likelihoods of the post-modulation data are real numbers, which are soft information. Thus, there can be implemented a demodulation method which is capable of outputting soft information and in which internal states are held.

Also, in the above demodulation methods, the symbol correspondence rules may be given by a rule table.

In this case, the transform from bit-wise likelihoods of the pre-demodulation data to bit-wise likelihoods of the post-demodulation data by the demodulation computing means is implemented by arithmetic operations derived according to the rule table.

Also, in the above demodulation methods, the symbol correspondence rules may be given by a logical expression.

In this case, the transform from bit-wise likelihoods of the pre-demodulation data to bit-wise likelihoods of the post-demodulation data by the demodulation computing means is implemented by arithmetic operations derived according to the logical expression.

Also, in the above demodulation methods, the bit-wise likelihoods may be given by using logarithmic-likelihood ratios.

In this case, bit-wise logarithmic-likelihood ratios of post-demodulation data are obtained by the demodulation computing means. Therefore, a turbo decoding method which takes inputs of the logarithmic-likelihood ratios can be used as a post-demodulation error-correction decoding method.

Also, in the above demodulation methods, the symbol correspondence rules may be symbol correspondence rules based on an RLL modulation method.

In this case, a demodulation method by the RLL method is implemented. Thus, the demodulation method becomes applicable to the decoding of reproduced signals from recording media that require the RLL modulation method.

In a seventh aspect of the invention, there is provided an error-correcting method comprising the step of performing error correction by error-correcting means on the bit-wise likelihoods of the post-demodulation data obtained from the pre-demodulation data by the demodulation method.

With this constitution, error correction on bit-wise likelihoods of the post-demodulation data obtained as soft information is performed. Therefore, error correction by turbo decoding becomes implementable, and the error-correcting capability is improved.

In an eighth aspect of the invention, there is provided a recording-medium reproducing apparatus comprising:

reproduction means for reproducing channel data recorded on a recording medium;

demodulation means for obtaining bit-wise likelihoods of post-demodulation data from the reproduced channel data by the demodulation methods; and error-correction decoding means for correcting any errors of the bit-wise likelihoods of the post-demodulation data and reconstructing the data to information data.

With this constitution, demodulation means by the RLL demodulation method is used as the demodulation means, and turbo decoding means is used as the error-correction decoding means, by which the error-correcting capability on reproduced signals reproduced from the recording medium is improved. As a result, the recording density of the recording medium is enhanced.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 4 shows a demodulation table of RLL(1, 7) standardized by standard ECMA-195;

FIG. 5 shows a demodulation table based on a reproduced signal in which X's in FIG. 4 are developed to 0's and 1's;

FIG. 6 shows a demodulation table subsequent to FIG. 5;

FIG. 11 shows a conversion table in the NRZI transform unit in FIG. 10;

FIG. 13 shows a demodulation table for determining post-demodulation data from channel data according to NRZI rules;

FIG. 14 shows a modulation table of RLL(1, 7) standardized by standard ECMA-195;

FIG. 15 shows a modulation table in which X's in FIG. 14 are developed to 0's and 1's;

DETAILED DESCRIPTION OF THE PREFERRED EMBODIMENT

Hereinbelow, the present invention is described in detail by way of embodiments thereof illustrated in the accompanying drawings.

(First Embodiment)

Figure 1:
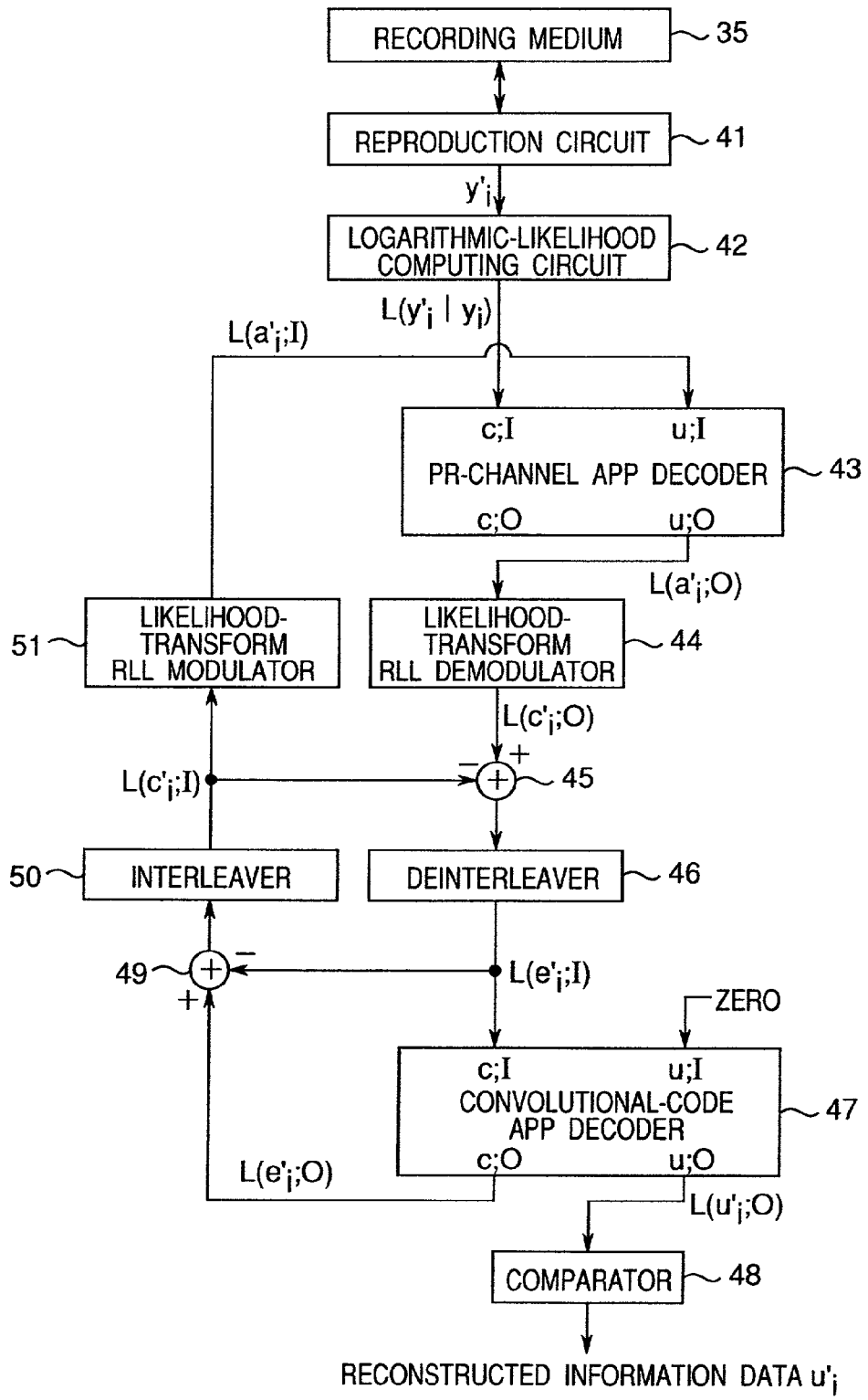
FIG. 1 is a block diagram of a recording-medium reproducing apparatus in a first embodiment of the present invention.
Figure 2:
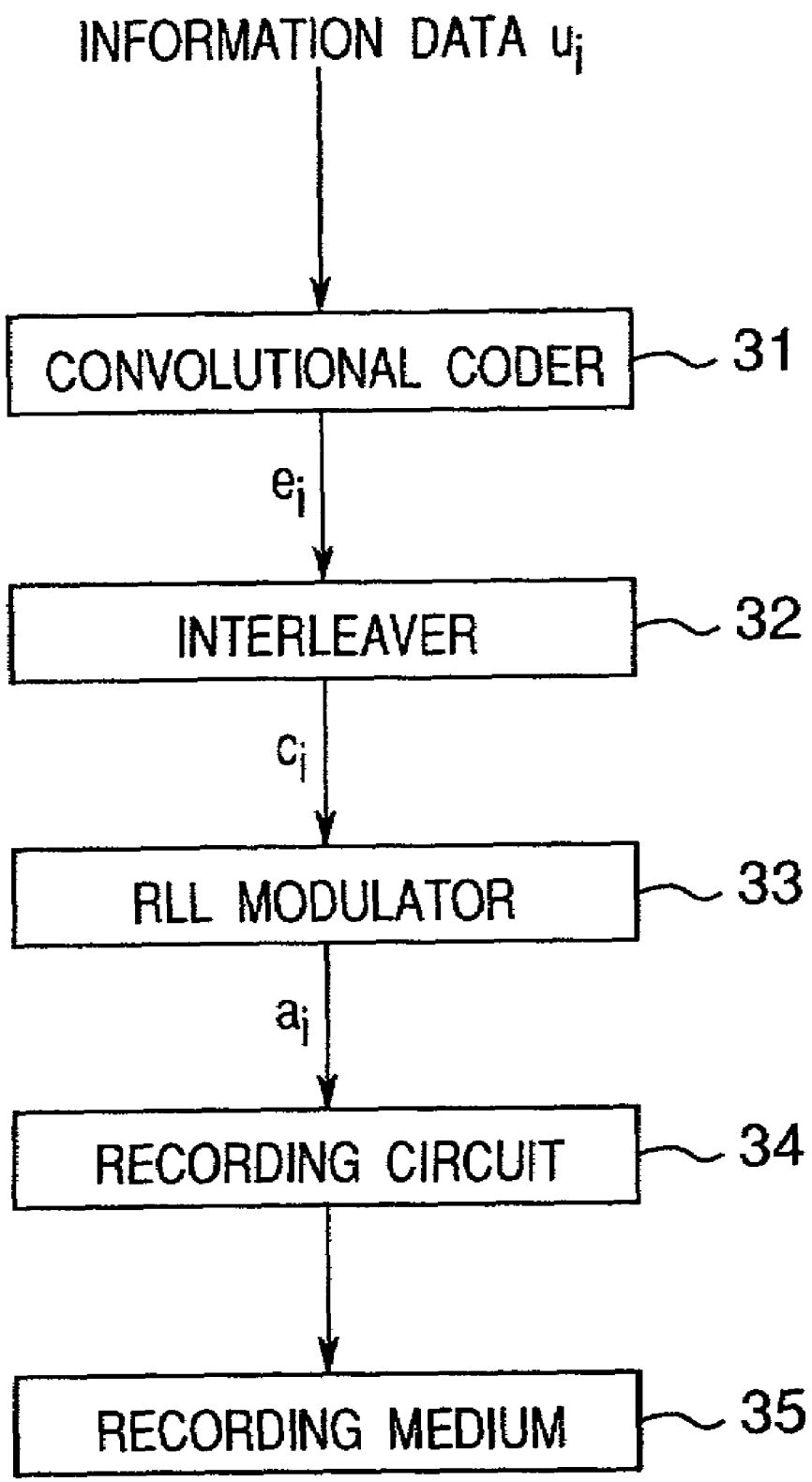
FIG. 2 is a block diagram of a recording-medium recording apparatus to which the coding method of the invention is applied.

FIG. 1 is a block diagram of a recording-medium reproducing apparatus of the present invention. FIG. 2 is a block diagram of a recording-medium recording apparatus which records, on a recording medium, channel data $a_i$ reproduced by the recording-medium reproducing apparatus shown in FIG. 1. First, the recording-medium recording apparatus is explained.

In the recording-medium recording apparatus shown in FIG. 2, a convolutional coder 31 performs convolutional coding on inputted information data $u_i$, outputting code data $e_i$. An interleaver 32 performs pseudo-random substitution on the inputted code data $e_i$, outputting interleaved code data $c_i$. An RLL modulator 33 performs RLL modulation on the inputted interleaved code data $c_i$, outputting channel data $a_i$. The channel data $a_i$ outputted in this way are recorded on a recording medium 35 by a recording circuit 34. It is noted that the recording circuit 34 implements the recording by magnetic recording, magneto-optical recording, optical recording or the like. Thus, this recording-medium recording apparatus performs both turbo coding and RLL modulation.

Next, the recording-medium reproducing apparatus shown in FIG. 1 is explained. A reproduction circuit 41 reproduces channel data recorded on the recording medium 35, outputting a reproduced signal $y'_i$. The recording circuit 34, the recording medium 35 and the reproduction circuit 41, which constitute a PR channel, have a property that adjacent pieces of channel data $a_i$ interfere with each other. Due to this, intersymbol interference has occurred to the reproduced signal $y'_i$. Besides, the reproduced signal $y'_i$, when passing the PR channel, undergoes deformation such as noise addition, band limiting or crosstalk. Therefore, the reproduced signal $y'_i$ has errors added therein.

A logarithmic-likelihood computing circuit 42 serving as the probability computing means computes a logarithmic likelihood $L(y'_i|y_i)$ based on the inputted reproduced signal $y'_i$, outputting a logarithmic likelihood $L(y'_i|y_i)$ of the reproduced signal $y'_i$. This logarithmic likelihood $L(y'_i|y_i)$ is then inputted to a code input terminal c;I of a PR-channel APP decoder 43 serving as the first APP decoding means. It is noted that contents of the computation by the logarithmic-likelihood computing circuit 42 will be described later. Further, an output $L(a'_i;I)$ of a likelihood-transform RLL modulator 51 is inputted to an information input terminal u;I of the PR-channel APP decoder 43. Also, a logarithmic-likelihood ratio $L(a'_i;O)$ of channel data $a'_i$ is outputted from the information output terminal u;O of the PR-channel APP decoder 43. In this process, the PR-channel APP decoder 43 updates each likelihood in compliance with constraints concerning channel data $a_i$ and constraints concerning PR transfer characteristics. The constraints concerning channel data $a_i$ are RLL conditions. It is noted that the code output terminal c;O, from which the logarithmic likelihood $L(y'_i|O)$ of the PR channel data $y'_i$ is outputted, is connected to none.

A likelihood-transform RLL demodulator 44 performs RLL demodulation by a likelihood transform method serving as the probability transform method on the logarithmic-likelihood ratio $L(a'_i;O)$ of pre-demodulation channel data a'inputted from the PR-channel APP decoder 43, outputting a logarithmic-likelihood ratio $L(c'_i;O)$ of post-modulation code data. It is noted that details of the RLL demodulation by the likelihood transform method will be described later. A subtracter 45 subtracts the output $L(c'_i;I)$ of an interleaver 50 from the logarithmic-likelihood ratio $L(c'_i;O)$ of the post-demodulation code data, outputting a subtraction result thereof as $Lext(c'_i)$. That is, the subtracter 45 operates immediately after the logarithmic-likelihood ratio $L(c'_i;O)$ is outputted from the likelihood-transform RLL demodulator 44. Then, a logarithmic-likelihood ratio difference with respect to the code data $c'_i$ updated by the PR-channel APP decoder 43 is calculated. This difference is called extrinsic information.

A deinterleaver 46 performs an inverse substitution of the aforementioned pseudo-random substitution on the $Lext(c'_i)$ inputted from the subtracter 45, outputting a logarithmic-likelihood ratio $L(e'_i;I)$ of deinterleaved (i.e., pre-interleaved) code data $e'_i$. In a convolutional-code APP decoder 47 serving as the second APP decoding means, the logarithmic-likelihood ratio $L(e'_i;I)$ derived from the deinterleaver 46 is inputted to a code input terminal c;I, while a zero is inputted to an information input terminal u;I. Then, the logarithmic-likelihood ratio $L(u'_i;O)$ of the information data $u'_i$ is outputted from an information output terminal u;O, while the logarithmic-likelihood ratio $L(e'_i;O)$ of the code data $e'_i$ is outputted from a code output terminal c;O. That is, the convolutional-code APP decoder 47 updates each likelihood in compliance with constraints concerning convolutional codes. Thus, the logarithmic-likelihood ratio $L(u'_i;O)$ of the information data $u'_i$ outputted from the information output terminal u;O of the convolutional-code APP decoder 47 is binarized by a comparator 48 and outputted as reconstructed information data $u'_i$.

A subtracter 49 operates immediately after the logarithmic-likelihood ratio $L(e'_i;O)$ of code data $e'_i$ is outputted from the code output terminal c;O of the convolutional-code APP decoder 47. Then, upon receiving inputs of the logarithmic-likelihood ratio $L(e'_i;I)$ of the code data $e'_i$ derived from the deinterleaver 46 and the logarithmic-likelihood ratio $L(e'_i;O)$, the subtracter 49 subtracts the logarithmic-likelihood ratio $L(e'_i;I)$ from the logarithmic-likelihood ratio $L(e'_i;O)$, outputting a subtraction result $Lext(e'_i)$. That is, the subtracter 49 computes a difference with respect to a logarithmic-likelihood ratio of the code data $e'_i$ updated by the convolutional-code APP decoder 47. This difference is also called extrinsic information.

The interleaver 50 performs the pseudo-random substitution on the $Lext(e'_i)$ inputted from the subtracter 49, outputting a logarithmic-likelihood ratio $L(c'_i;I)$ of the code data $c'_i$. The likelihood-transform RLL modulator 51 performs RLL modulation by the likelihood transform method on the logarithmic-likelihood ratio $L(c'_i;I)$ of inputted, pre-modulation code data $c'_i$, outputting a logarithmic-likelihood ratio $L(a'_i;I)$ of post-modulation channel data $a'_i$. It is noted that details of the RLL modulation by the likelihood transform method will be described later. The logarithmic-likelihood ratio $L(a'_i;I)$ of the channel data $a'_i$ outputted from the likelihood-transform RLL modulator 51 is inputted to the information input terminal u;I of the PR-channel APP decoder 43 as described above.

In this way, turbo decoding is performed by repeatedly delivering logarithmic-likelihood ratios between the PR-channel APP decoder 43 and the convolutional-code APP decoder 47, allowing the reconstructed information data $u'_i$ to be reduced in errors. In this case, at a first-time decoding operation, a zero $L(a'_i;I)$ is inputted to the information input terminal u;I of the PR-channel APP decoder 43.

Next, contents of the operation by the logarithmic-likelihood computing circuit 42 is explained in detail. Generally, this operation is carried out on the assumption that the channel is a simple noise-addition source. That is, a reproduced signal $y'_i$ outputted from the reproduction circuit 41 is defined by Equation (1):

$$y'_i = y_i + n_i \tag{1}$$

where $y_i$ is an ideal reproduced signal that is not affected by the channel, and $n_i$ is noise, where the term "ideal" means that the signal, when passing the channel, which is the recording medium 35, never undergoes any deformation such as noise, band limiting, crosstalk or jitter. Therefore, an ideal reproduced signal $y_i$ can be regarded as a signal train transmitted to a noise addition source.

It is to be noted that $n_i$ represents noise components added to the ideal reproduced signal $y_i$. Then, the logarithmic likelihood $L(y'_i|y_i)$ of the reproduced signal $y'_i$ is defined as follows:

$$L(y'_i|y_i) = \ln[P(y'_i|y_i)] \tag{2}$$

where $P(y'_i|y_i)$ is a conditional probability of reception of the reproduced signal $y'_i$ in transmission of a signal train $y_i$. In addition, ln represents a natural logarithm function.

First, a description is given on a case where the channel has other than PR transfer characteristics. In this case, there is absolutely no intersymbol interference to the channel, hence an equalized state that the channel meets Nyquist's first criteria. It is also assumed that $y_i$ is so normalized as to take a value of either "+1" or "−1." Thus, since $y_i$ is a value of either "+1" or "−1," two cases of $L(y'_i|y_i=+1)$ and $L(y'_i|y_i=-1)$ are computed as the logarithmic likelihood of Equation (2). Accordingly, the logarithmic-likelihood computing circuit 42 has only to compute and output these two logarithmic likelihoods. In this case, in particular, the logarithmic-likelihood ratio is often used. The logarithmic-likelihood ratio is defined by the following equation:

$$L(y'_i) = \ln P(y'_i|y_i = +1 \frac{)}{P(y'_i|y_i = -1)} \tag{3}$$

In this case, assuming that the channel is a white Gaussian channel, the probability density at which $y'_i$ is received in the case of transmission of $y_i$ can be expressed as:

$$P(y'_i|y_i) = \frac{1}{\sigma_n\sqrt{2\pi}} \cdot \exp\left[-\frac{(y'_i - y_i)^2}{2\sigma_n^2}\right] \quad (4)$$

where, in Equation (4), $\sigma_n$ is an effective amplitude (standard deviation) of this noise. Also, exp is an exponential function. Then, from Equation (4), the logarithmic-likelihood ratio of the reproduced signal $y'_i$ can be calculated by the following Equation (5):

$$L(y'_i) = Lc \cdot y'_i \quad (5)$$

Lc: constant determined by power of noise $n_i$, where the power of noise $n_i$ is the square of $\sigma_n$. Therefore, the constant Lc is expressed by the following Equation (6):

$$Lc = 2/\sigma_n^2 \quad (6)$$

Accordingly, by multiplying the inputted reproduced signal $y'_i$ by the constant Lc, the logarithmic-likelihood computing circuit 42 can obtain the logarithmic-likelihood ratio $L(y'_i)$ of the reproduced signal $y'_i$. Like this, the logarithmic-likelihood computing circuit 42 may also be designed so as to output one value $L(y'_i)$ for each one received value $y'_i$.

Next, a case where the channel is of the PR transfer characteristic is described. In a case of a PR transfer characteristic (1,2,1) and a modulation method RLL(1, 7) as an example, here is explained contents of computation by the logarithmic-likelihood computing circuit 42. Now assume that an ideal reproduced signal $y_i$ in the case of the PR transfer characteristic (1,2,1) is referred to as PR channel data. Then, the relationship between this PR channel data $y_i$ and the channel data $a_i$ becomes $$y_i = a_i + 2 \cdot a_{i-1} + a_{i-2} \quad (7)$$

In this case, as described later, if the channel data $a_i$ is assumed to be either value of "+1" or "−1," with the minimum run length limit (d=1) taken into consideration, the PR channel data $y_i$ results in one of four values, −4, −2, +2 and +4. Consequently, the logarithmic-likelihood computing circuit 42 has only to compute the logarithmic likelihood $L(y'_i|y_i)$ in four ways from Equation (4) based on Equation (8):

$$L(y'_i|y_i) = (1/2\sigma_n^2)(2y_iy'_i - y_i^2) + \text{Const}_i \quad (8)$$

where $\text{Const}_i$, which is a constant value in four ways logarithmic likelihoods $L(y'_i|y_i)$, is determined so that a total of conditional probabilities $P(y'_i|y_i)$ at which four pieces of PR channel data $y_i$ are received becomes 1. However, since computation is performed in the PR-channel APP decoder 43 so as to offset the $\text{Const}_i$, computation results of the PR-channel APP decoder 43 remain unchanged even under the condition that $\text{Const}_i = 0$. Accordingly, with $\text{Const}_i = 0$ as described above, four ways of logarithmic likelihoods $L(y'_i|y_i)$ can be specifically expressed as shown in Equation (9):

$$L(y'_i|y_i=+4) = (1/\sigma_n^2)(4y'_i - 8)$$

$$L(y'_i|y_i=+2) = (1/\sigma_n^2)(2y'_i - 2)$$

$$L(y'_i|y_i=-2) = (1/\sigma_n^2)(-2y'_i - 2)$$

$$L(y'_i|y_i=-4) = (1/\sigma_n^2)(-4y'_i - 8) \quad (9)$$

The logarithmic-likelihood computing circuit 42 has only to compute these four ways of logarithmic likelihoods $L(y'_i|y_i)$.

Therefore, the logarithmic-likelihood computing circuit 42 in FIG. 1, receiving inputs of the reproduced signals $y'_i$ from the recording medium 35 and the reproduction circuit 41 which form the PR channel, computes and outputs logarithmic likelihoods $L(y'_i|y_i)$ as described above.

Next, the likelihood-transform RLL demodulator 44, which performs RLL demodulation by the above likelihood transform method, is described in detail. First, a likelihood-transform RLL demodulator that performs demodulation by the likelihood transform method only from inputted channel-data p bits is explained.

Generally, the RLL demodulation can be regarded as a function that performs the following Equations (10), (11) and (12):

$$\vec{c}'_t = f_1(\vec{a}'_t) \quad (10)$$

$$\vec{c}'_t = (c'_{1,t}, c'_{2,t}, \ldots, c'_{j,t}, \ldots, c'_{m,t}) \quad (11)$$

$$\vec{a}'_t = (a'_{1,t}, a'_{2,t}, \ldots, a'_{k,t}, \ldots, a'_{p,t}) \quad (12)$$

where the vector $a'_t$ represents channel-data p bits at a time point "t," and the vector $c'_t$ represents reconstructed code-data m bits at the time point "It." Further, $a'_{k,t}$ represents the "k"th bit within the vector $a'_t$, and $c'_{j,t}$ represents the "j"th bit within the vector $c'_t$. Furthermore, $f_1$ is a logical operation function for calculating the vector $c'_t$ of m-bit code data from the vector $a'_t$ of the received p-bit channel data. The time point "t" represents a time sequence for calculation of Equation (10), the calculation being done every m×Tb=n×Tw interval in this RLL demodulation. It is noted that Tb denotes a data interval before modulation, and Tw denotes a detection window width. It is assumed that a symbol with a prime (') indicates that the symbol is data reconstructed after reproduction, and a symbol without a prime (') indicates that the symbol is data before recording.

Generally, a number p of channel data bits targeted for the logical operation at a time is not less than the number n of post-modulation channel data bits. Also, the pre-modulation code-data m bits are modulated into channel-data n bits. That is, before and after modulation, code-data m bits correspond to channel-data n bits. Meanwhile, with regard to demodulation, when p is equal to n, corresponding post-demodulation m bits are calculated from these channel-data n bits. When p is larger than n, post-demodulation m bits are calculated from p bits including preceding and succeeding bits of these n bits. By performing demodulation based on sequential equations (10) at each time point as shown above, all of code data $c'_i$ can be determined from all of channel data $a'_i$.

The number of combinations of channel-data p bits is finite, its maximum being $2^P$ combinations including those not satisfying the RLL. Actually, there exists combinations not satisfying the RLL, so the number of cases is further smaller than $2^P$. This number of combinations is assumed to be H. Then, the combinations of code-data m bits corresponding to the H combinations of channel-data p bits can preliminarily be determined. Therefore, each correspondence of these H combinations is expressed as $(C_h, A_h)$, where $C_h$ represents the "h"th combination of the code-data m bits and $A_h$ represents the "h"th combination of the channel-data p bits. That is, as shown in Equation (13)

$$\vec{C}_h = f_1(\vec{A}_h) \quad (13)$$

$$\vec{c}_t \in \{\vec{C}_h\}, \vec{C}_h = (C_{h,1}, C_{h,2}, \ldots, C_{h,j}, \ldots, C_{h,m})$$

$$\vec{a}'_t \in \{\vec{A}_h\}, \vec{A}_h = (A_{h,1}, A_{h,2}, \ldots, A_{h,k}, \ldots, A_{h,p})$$

When channel data belongs to the vector $A_h$, code data after demodulation is demodulated to the vector $C_h$. It is noted that $A_{h,k}$ and $C_{h,j}$ are constants, either "+1" or "−1," and that h=1, 2, . . . , H. Further, since channel-data p bits before demodulation are treated as one unit, the unit of channel-data p bits before demodulation (i.e., the vector $a'_t$) is referred to as a symbol. Likewise, since post-demodulation code-data m bits are treated as one unit, the unit of post-demodulation code-data m bits (i.e., the vector $c'_t$) is referred to as a symbol. In addition, when p is larger than n, a symbol before demodulation shares a bit or bits with its adjacent symbols.

This correspondence $(C_h, A_h)$ among the H combinations is equivalent to the symbol correspondence rules between pre-demodulation and post-demodulation data expressed in a table. Also, above Equation (10) is equivalent to the symbol correspondence rules between pre-demodulation and post-modulation data expressed in a logical expression. That is, the logical operation circuit that calculates the logical expression or the reference to ROM in which the rule table has previously been stored as a lookup table makes it possible to calculate post-demodulation code data $c'_{j,t}$ from pre-demodulation channel data $a'_{k,t}$.

Figure 24:
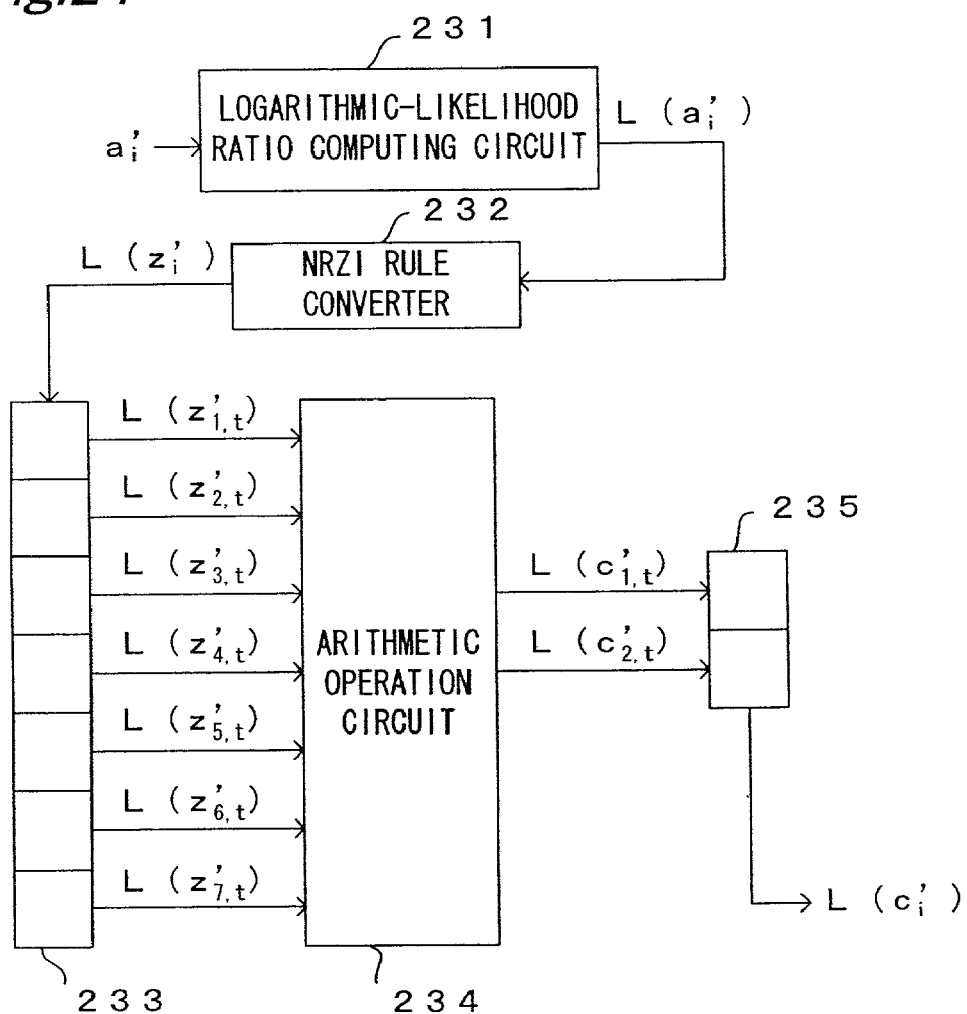
FIG. 24 is a block diagram of an RLL demodulator based on RLL(1, 7) in a ninth embodiment of the invention.

The conventional RLL demodulator shown in FIG. 24 treats $a'_{k,t}$ in above Equation (12) as binarized hard information. In this embodiment, by contrast, $a'_{k,t}$ are treated as soft information. That is, $a'_{k,t}$ are real numbers.

Below described is a method for performing demodulation based on the soft information $a'_{k,t}$ on the assumption that the likelihood of the channel data $a'_{k,t}$ is $$P(a'_{k,t}|a_{k,t}=+1)=1-P(a'_{k,t}|a_{k,t}=-1) \quad (14).$$

It is noted that $P(a'_{k,t}|a_{k,t}=+1)$ in Equation (14) is a conditional probability at which reproduced channel data become $a'_{k,t}$ under the condition that recorded channel data is "$a_{k,t}=+1$."

Also, likelihoods of $a'_t$ and $c'_t$ can be calculated by the following Equation (15).

$$P(\vec{c}'_t|\vec{c}_t = \vec{C}_h) = P(\vec{a}'_t|\vec{a}_t = \vec{A}_h) = \prod_{k=1}^{p} P(a'_{k,t}|a_{k,t} = A_{h,k}) \quad (15)$$

In Equation (15), $P(c'_t|c_t=C_h)$ is a conditional probability at which reconstructed code data become $c'_t$ under the condition that the code data $c_t$ is $C_h$. Equation (15) represents likelihoods for all the combinations of data trains before and after demodulation, i.e., likelihoods on the symbol-wise before and after demodulation.

Also, a likelihood of the "j"th code data $c'_{j,t}$ in the code data $c_t$ becomes $$P(c'_{j,t}|c_{j,t}=+1) = \frac{\displaystyle\sum_{\substack{C_{h,j}=+1}} P(\vec{c}'_t|\vec{c}_t = \vec{C}_h)}{\displaystyle\sum_{\substack{C_{h,j}=+1}} P(\vec{c}'_t|\vec{c}_t = \vec{C}_h) + \sum_{\substack{C_{h,j}=-1}} P(\vec{c}'_t|\vec{c}_t = \vec{C}_h)} \quad (16)$$

$$= \frac{\displaystyle\sum_{\substack{C_{h,j}=+1}} P(\vec{c}'_t|\vec{c}_t = \vec{C}_h)}{\displaystyle\sum_{h=1}^{H} P(\vec{c}'_t|\vec{c}_t = \vec{C}_h)}$$

where the numerator in above Equation (16) represents a total sum of $P(c'_t|c_t=C_h)$ only of $C_h$ in which the code data $C_{h,j}$ is equal to "+1" out of H different values of $C_h$. Also, the denominator represents a total sum of H different values of $P(c'_t|c_t=C_h)$. It is noted that the denominator of Equation (16) is generally other than "1." This is because the denominator does not include any combinations of channel data which do not satisfy the RLL. Equation (16) represents transform from likelihoods on a post-demodulation symbol-wise to likelihoods on a post-demodulation bit-wise.

Accordingly, use of Equations (15) and (16) allows the transform from likelihoods on a pre-modulation bit-wise to likelihoods on a post-modulation bit-wise to be achieved. That is, first, by Equation (15), transform from pre-modulation bit-wise likelihoods to post-modulation symbol-wise likelihoods is performed. Next, by Equation (16), transform from post-demodulation symbol-wise likelihoods to post-demodulation bit-wise likelihoods is performed.

In the turbo decoding, generally, soft information of code data is expressed as a logarithmic-likelihood ratio. Therefore, transform into logarithmic-likelihood ratios $L(c'_t)$ on the post-demodulation bit-wise is explained below. For example, a logarithmic-likelihood ratio $L(c'_{j,t})$ of code data $(c'_{j,t})$ can be defined as $$L(c'_{j,t}) = \ln P(c'_{j,t}|c_{j,t}=+1\frac{)}{P(c'_{j,t}|c_{j,t}=-1)} \quad (17)$$

where ln represents a natural logarithm function. Therefore, $L(c'_{j,t})$, when expressed with the likelihood $P(c'_t|c_t=C_h)$ of code data $c_t$, can be determined from Equations (16) and (17) as shown by the following Equation (18):

$$L(c'_{j,t}) = \ln \frac{\displaystyle\sum_{\substack{C_{h,j}=+1}} P(\vec{c}'_t|\vec{c}_t = \vec{C}_h)}{\displaystyle\sum_{\substack{C_{h,j}=-1}} P(c'_t|\vec{c}_t = \vec{C}_h)} \quad (18)$$

This Equation (18) is a transform equation from post-demodulation symbol-wise likelihoods to pre-modulation bit-wise logarithmic-likelihood ratios. Furthermore, the logarithmic-likelihood ratios $L(c'_{j,t})$ of above Equation (18), when expressed with the likelihoods $P(a'_{k,t}|a_{k,t}=+1)$ and $P(a'_{k,t}|a_{k,t}=-1)$ of channel data $a_{k,t}$, results in the following Equation (19) by the Equation (15):

$$L(c'_{j,t}) = \ln \frac{\sum\limits_{\substack{C^h_{h,j}=+1}} \left\{ \prod_{k=1}^{p} P(a'_{k,t}|a_{k,t}=A_{h,k}) \right\}}{\sum\limits_{\substack{C^h_{h,j}=-1}} \left\{ \prod_{k=1}^{p} P(a'_{k,t}|a_{k,t}=A_{h,k}) \right\}} \quad (19)$$

This Equation (19) is a transform equation from pre-modulation bit-wise likelihoods to post-demodulation bit-wise logarithmic-likelihood ratios.

Now the logarithmic-likelihood ratios $L(a'_k)$ of the channel data $a_k$ are defined as shown by the following Equation (20):

$$L(a'_{k,t}) = \ln P\left(a'_{k,t}|a_{k,t}=+1 \frac{)}{P(a'_{k,t}|a_{k,t}=-1)}\right) \quad (20)$$

Then, the following Equation (21) is obtained from this Equation (20):

$$P(a'_{k,t}|a_{k,t}=A_{h,k}) = \frac{\exp\{(1/2)\cdot L(a'_{k,t})\}}{1+\exp\{L(a'_{k,t})\}} \cdot \exp\{(1/2)\cdot L(a'_{k,t})A_{h,k}\} \quad (21)$$

$$= \frac{1}{1+\exp\{L(a'_{k,t})\}} \cdot \exp\{L(a'_{k,t})B_{h,k}\}$$

where $B_{h,k}=(\frac{1}{2})\cdot(A_{h,k}+1)$ $D_{h,k}=(\frac{1}{2})\cdot(C_{h,k}+1)$, that is, $B_{h,k} \in \{0,1\}$ since $A_{h,k} \in \{\pm 1\}$. Correspondingly to this, $D_{h,k}$ is also defined similarly. That is, $D_{h,k} \in \{0,1\}$ since $C_{h,k} \in \{\pm 1\}$. Thus, as $A_{h,k}$ and $C_{h,k}$ can be determined in advance, so $B_{h,k}$ and $D_{h,k}$ can also be determined in advance.

Therefore, with the use of the logarithmic-likelihood ratios $L(a'_{k,t})$ of channel data $a_{k,t}$, the post-demodulation bit-wise logarithmic-likelihood ratios $L(c'_{j,t})$ can be expressed from Equations (19) and (21) as shown in Equation (22):

$$L(c'_{j,t}) = \ln \frac{\sum\limits_{C^h_{h,j}=+1} \exp\left\{\sum_{k=1}^{p} \frac{1}{2} \cdot L(a'_{k,t})A_{h,k}\right\}}{\sum\limits_{C^h_{h,j}=-1} \exp\left\{\sum_{k=1}^{p} \frac{1}{2} \cdot L(a'_{k,t})A_{h,k}\right\}} \quad (22)$$

-continued $$= \ln \frac{\sum\limits_{D^h_{h,j}=1} \exp\left\{\sum_{k=1}^{p} L(a'_{k,t})B_{h,k}\right\}}{\sum\limits_{D^h_{h,j}=0} \exp\left\{\sum_{k=1}^{p} L(a'_{k,t})B_{h,k}\right\}}$$

In Equation (22), it is apparent that the computation using $B_{h,k}$ involves less computing amount than the computation using $A_{h,ks}$. This is because it is only for $B_{h,k}=1$ that the total summation of $L(a'_{k,t})$ is to be done. Therefore, in order to reduce the computing amount and computing time for the RLL demodulation, the computation using $B_{h,k}$ is more desirable.

Thus, with the use of above Equation (22), logarithmic-likelihood ratios $L(c'_{j,t})$ of post-demodulation code data can be computed from the logarithmic-likelihood ratios $L(a'_{k,t})$ of pre-demodulation channel data.

From the above description, assuming that an arithmetic operation function for performing the operation of Equation (22) for all code data numbers "j" is $g_1$, a demodulator using the likelihood transform method can be said to be a demodulator that performs an operation of the following Equation (23):

$$(L(c'_{1,t}),L(c'_{2,t}),\ldots,L(c'_{j,t}),\ldots,L(c'_{m,t}))=g_1(L(a'_{1,t}),L(a'_{2,t}),\ldots,L(a'_{k,t}),\ldots,L(a'_{p,t})) \quad (23)$$

where $g_1$ is an arithmetic operation function for computing individual logarithmic-likelihood ratios of code-data m bits from individual logarithmic-likelihood ratios of reproduced channel data p bits.

Thus, assuming that the serial train of code data is $c_i$ and that a serial train of its corresponding channel data is $a_i$, then the transform from pre-demodulation bit-wise logarithmic-likelihood ratios $L(a'_i)$ to post-demodulation bit-wise logarithmic-likelihood ratios $L(c'_i)$ can be achieved by using symbol correspondence rules between pre- and post-demodulation data.

In a similar fashion, transform from the bit-wise logarithmic-likelihood ratios $L(c'_i)$ of pre-modulation code data $c'_i$ to the bit-wise logarithmic-likelihood ratios $L(a'_i)$ of post-demodulation channel data $a'_i$ can be achieved by the likelihood-transform RLL modulator 51 described above. Now the constitution of the likelihood-transform RLL demodulator 44 for performing demodulation by the likelihood transform method as described above is described by way of a concrete example.

Figure 3:
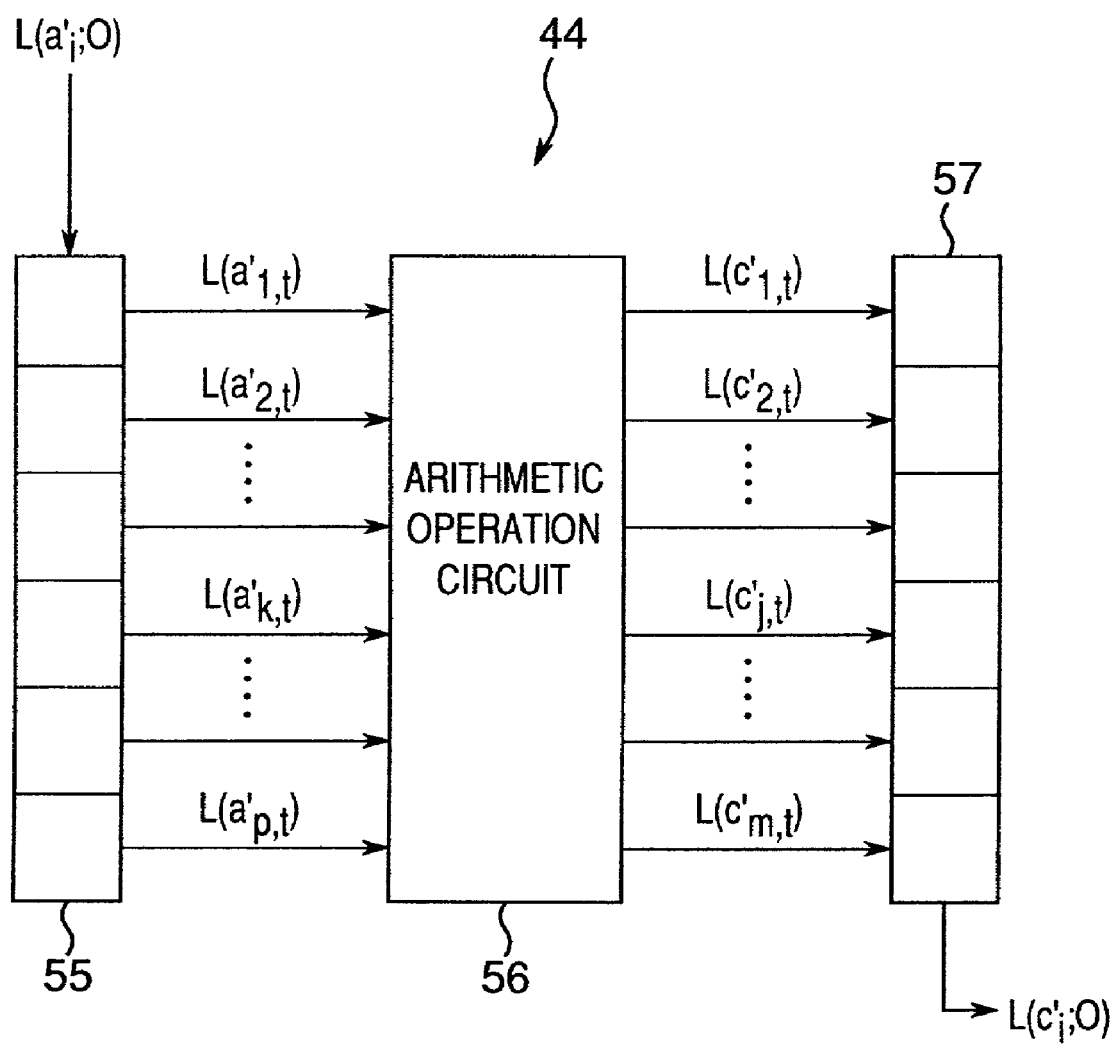
FIG. 3 is a block diagram showing the constitution of the likelihood-transform RLL demodulator in FIG. 1.

FIG. 3 is a block diagram showing the constitution of the likelihood-transform RLL demodulator. Logarithmic-likelihood ratios $L(a'_i;O)$ of channel data $a'_i$ outputted from the information output terminal u;O of the PR-channel APP decoder 43 (see FIG. 1) are inputted to a p-stage shift register 55. Then, data are shifted by the p-stage shift register 55 at Tw intervals so that parallel data $(L(a'_{1,t}), L(a'_{2,t}), \ldots, L(a'_{k,t}), \ldots, L(a'_{p,t}))$ are outputted to an arithmetic operation circuit 56. The arithmetic operation circuit 56 in turn performs arithmetic operations on the inputted parallel data $(L(a'_{1,t}), L(a'_{2,t}), \ldots, L(a'_{k,t}), \ldots, L(a'_{p,t}))$ according to Equations (22) and (23). Then, the arithmetic operation circuit 56 outputs logarithmic-likelihood ratio parallel data $(L(c'_{1,t}), L(c'_{2,t}), \ldots, L(c'_{j,t}), \ldots, L(c'_{m,t}))$ of post-demodulation code data to an m-stage shift register 57 equipped with a parallel load function.

The m-stage shift register 57 loads in parallel the inputted logarithmic-likelihood ratio parallel data ($L(c'_{1, t})$, $L(c'_{2, t})$, ..., $L(c'_{j, t})$, ..., $L(c'_{m, t})$) of post-demodulation code data, and shifts the data at Tb intervals, outputting logarithmic-likelihood ratios $L(c'_j;O)$ of post-demodulation code data. In this case, the arithmetic operations by the arithmetic operation circuit 56 and the parallel loading by the m-stage shift register 57 are performed synchronously at (m×Tb) intervals. In addition, since the logarithmic-likelihood ratios are real numbers, the p-stage shift register 55 and the m-stage shift register 57 are to hold real numbers.

As shown above, in the recording-medium reproducing apparatus of this embodiment, at the preceding stage of the PR-channel APP decoder 43 out of the two APP decoders constituting the turbo decoder is disposed the logarithmic-likelihood computing circuit 42 that computes logarithmic likelihoods $L(y'_i|y_i)$ of a reproduced signal $y'_i$, which is soft information. At the succeeding stage, on the other hand, the likelihood-transform RLL demodulator 44 and the likelihood-transform RLL modulator 51 capable of treating logarithmic likelihoods, which are soft information as described above, are disposed before the convolutional-code APP decoder 47. Thus, there can be realized a recording-medium reproducing apparatus which performs both RLL demodulation and turbo decoding. That is, according to this embodiment, in reproducing channel data $a_i$ recorded on a recording medium by the recording-medium recording apparatus that performs both turbo coding and RLL modulation method shown in FIG. 2, a turbo decoding of high error-correcting capability can be used. As a result, the recording density onto recording media can be enhanced as compared with cases where the PRML technique is used.

With regard to the likelihood-transform RLL demodulator 44 shown in FIG. 3, concrete operations of the arithmetic operation circuit 56 for performing arithmetic operations according to Equations (22) and (23) are described in detail below.

FIG. 4 is a demodulation table of RLL(1, 7) standardized by standard ECMA-195 of the Standardizing Information and Communication Systems. In this case, the number m of bits of code data after demodulation and the number n of bits of channel data before demodulation are so set that m=2 and n=3. In the demodulation table shown in FIG. 4, a "1" of channel bits represents a polarity inversion of the reproduced signal, and a "0" of channel bits represents an obtainment of the same polarity as the preceding bit (i.e., preceding-polarity holding). Such a signal is referred to as a signal based on the NRZI rules. Looking up to this demodulation table allows the arithmetic operation circuit 56 to compute two bits of post-demodulation code data (m=2) from seven channel bits (p=7) according to the NRZI rules.

FIGS. 5 and 6 are demodulation tables based on a reproduced signal in which X's in FIG. 4 are developed to 0's and 1's. It is noted that FIG. 4 is expressed in channel bits based on the NRZI rules, and FIGS. 5 and 6 are expressed in channel bits based on the reproduced signal. The development in this case may appropriately be performed by taking into consideration that channel bits XX based on the NRZI rules come in three combinations of 00, 01 and 10 under the run length limit. It is noted that the number of combinations of eight bits of channel bits based on a reproduced signal is 68 (H=68). FIG. 5 is a demodulation table of the 1st to 34th combinations out of them. Also, FIG. 6 is a demodulation table of the 35th to 68th combinations. Therefore, it is appropriate to compute Equation (23) based on these FIGS. 5 and 6. It is noted that p=7 of the demodulation table of the signal based on the NRZI rules of FIG. 4 changes to p=8 in the demodulation table based on the reproduced signal as shown in FIGS. 5 and 6. That is, the table shown in FIGS. 5 and 6 is the rule table representing the symbol correspondence rules between pre- and post-demodulation data.

Figure 7:
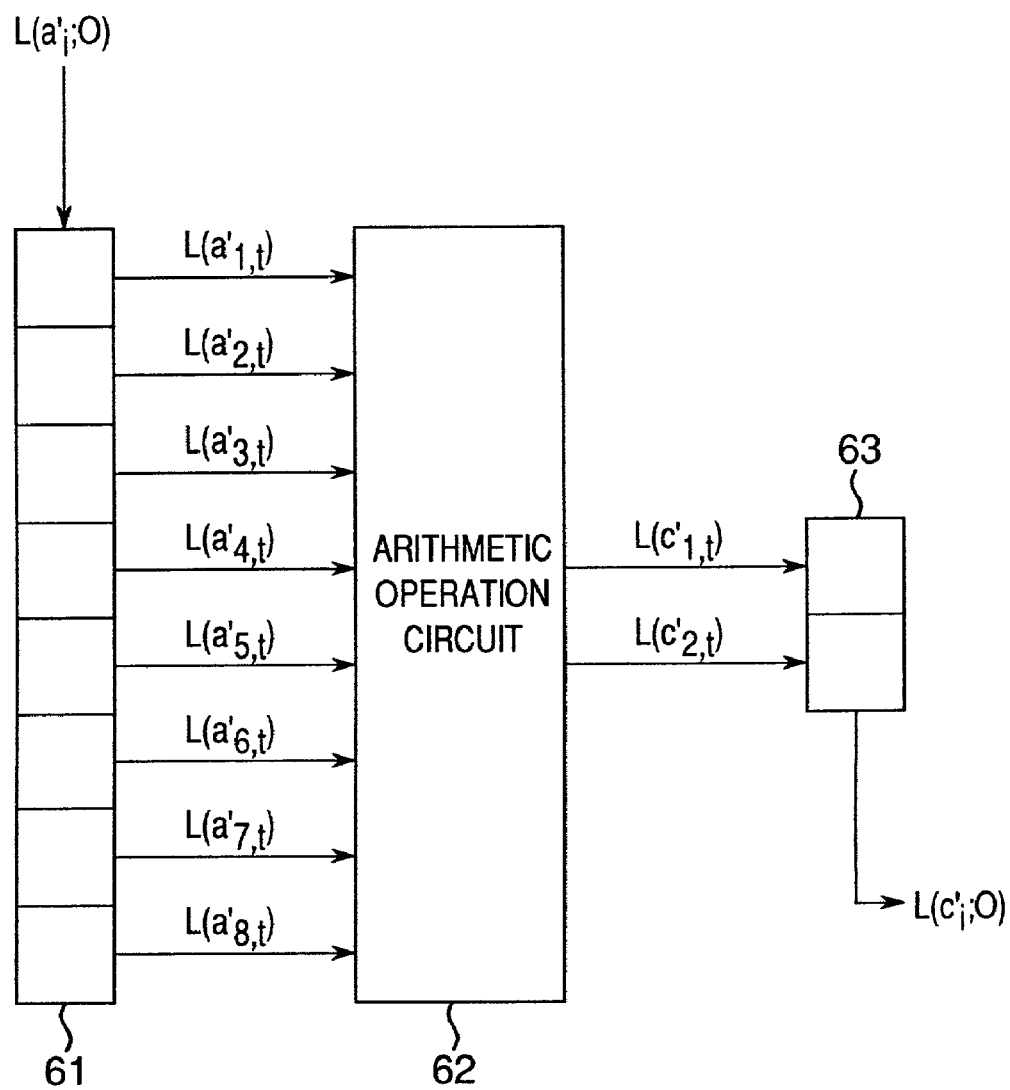
FIG. 7 is a block diagram of a likelihood-transform RLL demodulator based on RLL(1, 7)

FIG. 7 shows a block diagram of a likelihood-transform RLL demodulator based on RLL(1, 7). Logarithmic-likelihood ratios $L(a'i;O)$ outputted from the PR-channel APP decoder 43 (see FIG. 1) are inputted to an 8-stage shift register 61. Then, the logarithmic-likelihood ratios $L(a'_i;O)$ are shifted at Tw intervals in this 8-stage shift register 61, so that parallel data ($L(a'_{1, t}), L(a'_{2, t}), ..., L(a'_{k, t}), ..., L(a'_{8, t})$) are outputted. An arithmetic operation circuit 62 performs arithmetic operations based on Equations (22) and (23) with the parallel data ($L(a'_{1, t}), L(a'_{2, t}), ..., L(a'_{k, t}), ..., L(a'_{8, t})$), outputting logarithmic-likelihood ratio parallel data ($L(c'_{1, t}), L(c'_{2, t})$) of post-demodulation code data. The contents of arithmetic operations for RLL(1, 7) will be described later. A 2-stage shift register 63 with a parallel load function loads in parallel the logarithmic-likelihood ratio parallel data ($L(c'_{1, t}), L(c'_{2, t})$) of post-demodulation code data, and shifts the data at Tb intervals, outputting logarithmic-likelihood ratios $L(c'_j;O)$ of post-demodulation code data. These arithmetic operations and the parallel loading are performed synchronously at (2×Tb)=(3×Tw) intervals.

Next, the contents of arithmetic operations by the arithmetic operation circuit 62 are described in detail. First, the above Equation (22) is rewritten as Equation (24):

$$L(c'_{j,t}) = \ln \frac{\sum_{D^h_{h,j}=1} \exp(N_h)}{\sum_{D^h_{h,j}=0} \exp(N_h)} \qquad (24)$$

$$N_h = \sum_{k=1}^{p} L(a'_{k,t}) B_{h,k}$$

where $\exp(N_h)$ in Equation (24) corresponds to the "h"th row in the demodulation table shown in FIGS. 5 and 6. Also, $N_h$ represents a total sum of $L(a'_{k, t})$ satisfying that $B_{h, k}=1$ in the demodulation table shown in FIGS. 5 and 6. Now a case of calculating $L(c'_{1, t})$ is explained as an example. $N_1$ corresponding to h=1 in the demodulation table is $$N_1 = L(a'_{2, t}) + L(a'_{3, t}) + L(a'_{4, t}) + L(a'_{5, t}) + L(a'_{6, t}) + L(a'_{7, t}) + L(a'_{8, t}) \qquad (25)$$

Also, since $D_{1, 1}=0$ from the demodulation table (FIG. 5), $\exp(N_1)$ become elements of the total sum of the denominator in Equation (24). Likewise, since $D_{2, 1}, ..., D_{30, 1}$, $D_{43, 1}, ..., D_{48, 1}=0$, $\exp(N_h)$ at h=2, ..., 30 and h=43, ..., 48 also become elements of the total sum of the denominator.

Further, $N_{31}$ corresponding to h=31 in the demodulation table is $$N_{31} = L(a'_{5, t}) + L(a'_{6, t}) + L(a'_{7, t}) + L(a'_{8, t}) \qquad (26)$$

Also, since $D_{31, 1}=1$ from the demodulation table (FIG. 5), $\exp(N_{31})$ become elements of the total sum of the numerator in Equation (24). Likewise, since $D_{32, 1}, ..., D_{42, 1}$, $D_{49, 1}, ..., D_{68, 1}=1$, $\exp(N_h)$ at h=32, ..., 42 and h=49, ..., 68 also become elements of the total sum of the numerator.

Sixty-eight combinations of $N_h$ in the demodulation table are calculated in this way, and then $\exp(N_h)$ is calculated based on each result of $N_h$. Next, the total sum of the denominator in Equation (24) is calculated based on exp $(N_1), \ldots, \exp(N_{30}), \exp(N_{43}), \ldots, \exp(N_{48})$, and the total sum of the numerator is calculated based on $\exp(N_{31}), \ldots, \exp(N_{42}), \exp(N_{49}), \ldots, \exp(N_{68})$ Finally, $L(c'_{1,t})$ is calculated by Equation (24).

$L(c'_{2,t})$ can also be calculated in the same manner, and thus the contents of arithmetic operations by the arithmetic operation circuit 62 are specifically determined. That is, the arithmetic operation circuit 62 performs arithmetic operations based on Equations (25), (26) and (24), thereby outputting logarithmic-likelihood ratio parallel data $(L(c'_{1,t}), L(C'_{2,t}))$ of post-demodulation code data.

Furthermore, the arithmetic operations by the arithmetic operation circuit 62 can be simplified as shown below. That is, the above Equation (24) can be simplified in terms of computation contents by approximation as shown by Equation (27):

$$L(c'_{j,t}) = \max_{D^h_{h,j}=1} \{N_h\} - \max_{D^h_{h,j}=0} \{N_h\} \tag{27}$$

where the first term of Equation (27) represents an $N_h$ that is the largest of $N_h$'s with $D_{h,j}=1$. Likewise, the second term represents an $N_h$ that is the largest of $N_h$'s with $D_{h,j}=0$.

According to the above Equation (27), arithmetic operations for the exponential function "exp" and the natural logarithm function "ln" can be omitted, and logarithmic-likelihood ratio parallel data $(L(c'_{1,t}), L(c'_{2,t}))$ of post-demodulation code data can be calculated only by the additions for calculating individual $N_h$'s, the comparisons for determining maximum values, and the final subtraction. Accordingly, the arithmetic operations of the arithmetic operation circuit 62 can be simplified to a large extent.

Whereas approximation is performed by making only the largest $N_h$ left in the Equation (27), the approximation may also be done by making only a specified number of terms left in a descending order of magnitude of value out of $N_h$'s with $D_{h,j}=1$ and $N_h$'s with $D_{h,j}=0$. In this case, more accurate computations are enabled although the computing amount slightly increases, as compared with the cases using the Equation (27).

Further, the arithmetic operation circuit in the likelihood-transform RLL modulator based on the RLL(1, 7) is also enabled to compute post-modulation bit-wise logarithmic-likelihood ratios $L(a'_{k,t})$ from pre-modulation bit-wise logarithmic-likelihood ratios $L(c'_{j,t})$ in a similar fashion according to the demodulation table shown in FIG. 4. That is, the demodulation table shown in FIG. 4 may be exploited as a modulation table. However, in this case, since internal states are to be held within the likelihood-transform RLL modulator, the arithmetic operation circuit is to perform arithmetic operations according to Equations (36) and (40), which will be described later.

Figure 8:
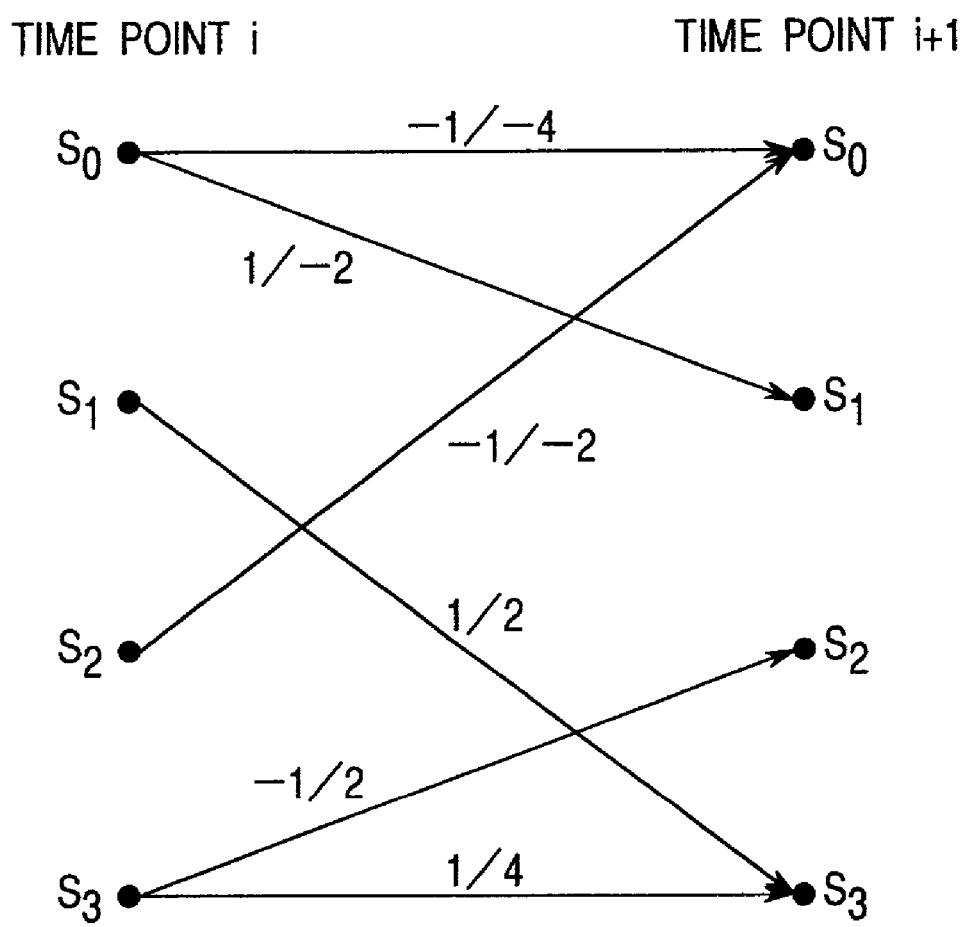
FIG. 8 shows an example of a trellis diagram of the PR-channel APP decoder in FIG. 1.

FIG. 8 shows an example of a trellis diagram necessary for the PR-channel APP decoder 43 to achieve APP decoding in the case where the RLL modulation method by the likelihood-transform RLL demodulator 44 and the likelihood-transform RLL modulator 51 in FIG. 1 is RLL(1, 7) and where the PR transfer characteristic in the PR channel composed of the recording circuit 34, the recording medium 35 and the reproduction circuit 41 is (1,2,1). This trellis diagram makes use of the minimum run length limit (d=1) and constraints concerning PR transfer characteristics, and not the maximum run length limit (k=7). In this PR transfer characteristic (1,2,1), the relationship between PR channel data $Y_1$ and channel data $a_1$ is as shown in Equation (7). This Equation (7) corresponds to the constraints concerning PR transfer characteristics.

The trellis diagram shown in FIG. 8 has four internal states of $S_0$, $S_1$, $S_2$ and $S_3$. In the figure, with regard to fractions added to arrows directed from internal states at a time point "i" to internal states at a time point "i+1", the numerator represents the channel data $a_i$ and the denominator represents the PR channel data $y_i$. For example, given an internal state $S_3$ at the time point "i," if the PR channel data $y_i$ is "2," then the channel data $a_i$ is "−1," and the internal state at the next time point "i+1" is $S_2$. The PR-channel APP decoder 43 may appropriately perform APP decoding according to this trellis diagram.

The logarithmic-likelihood RLL demodulator 44 shown in FIG. 3 performs RLL demodulation only from p bits of inputted channel data as described above. On the other hand, the logarithmic-likelihood RLL demodulator 44 and the logarithmic-likelihood RLL modulator 51 shown in FIG. 1 allow a demodulation method in which internal states are held and a modulation method in which internal states are held to be applied thereto as well. Below is described a logarithmic-likelihood RLL demodulation method in which internal states are held within the demodulator.

Generally, the demodulation in which internal states are held can be regarded as a function that performs the following Equation:

$$\vec{c}'_t = f_2(\vec{a}'_t, \vec{s}'_t) \tag{28}$$

where the vector $s'_t$ represents current-internal-state q bits as shown by Equation (29):

$$\vec{s}'_t = (s'_{1,t}, s'_{2,t}, \ldots, s'_{l,t}, \ldots, s'_{q,t}) \tag{29}$$

It is noted that $f_2$ represents a logical operation function for computing reconstructed code-data m bits $c'_t$ from reproduced p-bit channel data $a'_t$ and current q-bit internal states $s'_t$.

Also, the internal states can be calculated by the following Equation (30):

$$\vec{s}'_{t+1} = f_3(\vec{a}'_t, \vec{s}'_t) \tag{30}$$

The vector $s'_{t+1}$ represents succeeding-internal-state q bits as shown by Equation (31):

$$\vec{s}'_{t+1} = (s'_{1,t+1}, s'_{2,t+1}, \ldots, s'_{l,t+1}, \ldots, s'_{q,t+1}) \tag{31}$$

It is noted that $f_3$ represents a logical operation function for computing the succeeding internal states $s'_{t+1}$ from the received p-bit channel data $a'_t$ and the current q-bit internal states $s'_t$.

Part or all of the bits of the succeeding internal states $s'_{t+1}$ may be identical to part or all of the bits of the reconstructed code-data $c'_t$. For example, if the internal state is of 1 bit (q=1) and moreover identical to $c'_{1,t}$ ($s'_{t+1}=c'_{1,t}$), $$\vec{c}'_t = f_2(\vec{a}'_t, \vec{c}'_{1,t-1}) \quad (32)$$

This means that the post-demodulation code data $c'_{1,t-1}$, which have been reconstructed immediately before, are also referred to in the demodulation of the channel data $a'_t$.

As described above, in the demodulation method in which the internal states are held within the demodulator, demodulation is performed based on Equations (28) and (30).

Also with the demodulation method based on the Equations (28) and (30), it is possible to input $a'_{k,t}$ as soft information and output $c'_{k,t}$ as soft information, as shown below. Now, from the formal point of view, the above Equations (28) and (30) are expressed by the following Equations (33) to (35).

$$\vec{c}''_t = f_4(\vec{a}''_t) \quad (33)$$

$$\vec{c}''_t = (\vec{c}'_t \vec{s}'_{t+1}) \quad (34)$$
$$= (c''_{1,t}, c''_{2,t}, \ldots, c''_{j,t}, \ldots, c''_{m+q,t})$$
$$= (c'_{1,t}, c'_{2,t}, \ldots, c'_{j,t}, \ldots, c'_{m,t}, s'_{1,t+1}, s'_{2,t+1}, \ldots, s'_{l,t+1}, \ldots, s'_{q,t+1})$$

$$\vec{a}''_t = (\vec{a}'_t \vec{s}'_t) \quad (35)$$
$$= (a''_{1,t}, a''_{2,t}, \ldots, a''_{k,t}, \ldots, a''_{p+q,t})$$
$$= (a'_{1,t}, a'_{2,t}, \ldots, a'_{k,t}, \ldots, a'_{p,t}, s'_{1,t}, s'_{2,t}, \ldots, s'_{l,t}, \ldots, s'_{q,t})$$

where $c''_t$ represents $c'_t$ and $s'_{t+1}$, being of (m+q) bits. Similarly, $a''_t$ represents $a'_t$ and $s'_t$, being of (p+q) bits.

The above Equation (33), formally equal to the foregoing Equation (10), allows demodulation by a likelihood transform method to be achieved in the same way as with the Equation (10). That is, $$L(c''_{j,t}) = \ln \sum_{C''_{h,j}=+1} \frac{\exp\left\{\sum_{k=1}^{p+q} \frac{1}{2} \cdot L(a''_{k,t}) A''_{h,k}\right\}}{\sum_{C''_{h,j}=-1} \exp\left\{\sum_{k=1}^{p+q} \frac{1}{2} \cdot L(a''_{k,t}) A''_{h,k}\right\}} \quad (36)$$

$$= \ln \frac{\sum_{D''_{h,j}=1} \exp\left\{\sum_{k=1}^{p+q} L(a''_{k,t}) B''_{h,k}\right\}}{\sum_{D''_{h,j}=0} \exp\left\{\sum_{k=1}^{p+q} L(a''_{k,t}) B''_{h,k}\right\}}$$

Based on that $B''_{h,k} = (½) \cdot (A''_{h,k}+1)$ $D''_{h,k} = (½) \cdot (C''_{h,k}+1)$ logarithmic-likelihood ratios $L(c'_{j,t})$ of post-demodulation code data can be calculated from the logarithmic-likelihood ratios $L(a'_{k,t})$ of pre-demodulation channel data.

In this connection, $B''_{h,k} \in \{0,1\}$ since $A''_{h,k} \in \{\pm 1\}$. Correspondingly to this, $D''_{h,k}$ is also defined similarly. That is, $D''_{h,k} \in \{0,1\}$ since $C''_{h,k} \in \{\pm 1\}$. Thus, as $A''_{h,k}$ and $C''_{h,k}$ can be determined in advance, so $B''_{h,k}$ and $D''_{h,k}$ can also be determined in advance.

Further, logarithmic-likelihood ratios can be defined as follows:

$$L(c''_{j,t}) = \begin{cases} \ln \frac{P(c'_{j,t} \mid c_{j,t} = +1)}{P(c'_{j,t} \mid c_{j,t} = -1)} & \text{where } 1 \leq j \leq m, \\ \ln \frac{P(s'_{l,t+1} \mid s_{l,t+1} = +1)}{P(s'_{l,t+1} \mid s_{l,t+1} = -1)} & \text{where } 1 \leq l = j - m \leq q. \end{cases} \quad (37)$$

-continued $$L(a''_{k,t}) = \begin{cases} \ln \frac{P(a'_{k,t} \mid a_{k,t} = +1)}{P(a'_{k,t} \mid a_{k,t} = -1)} & \text{where } 1 \leq k \leq p, \\ \ln \frac{P(s'_{l,t} \mid s_{l,t} = +1)}{P(s'_{l,t} \mid s_{l,t} = -1)} & \text{where } 1 \leq l = k - p \leq q. \end{cases} \quad (38)$$

In this case, assume that the number of combinations of (p+q) bits of ($c'_t, a''_t$) is H''. Also assume that the correspondence among the H'' individual combinations is ($C''_h, A'_h$). Then, $$\vec{c}''_t \in \{\vec{C}''_h\}, \vec{C}''_h = (C''_{h,1}, C''_{h,2}, \ldots, C''_{h,j}, \ldots, C''_{h,m+q}) \quad (39)$$
$$\vec{a}''_t \in \{\vec{A}''_h\}, \vec{A}''_h = (A''_{h,1}, A''_{h,2}, \ldots, A''_{h,k}, \ldots, A''_{h,p+q})$$

where h=1, 2, . . . ,H''. This correspondence ($C''_h, A''_h$) among the H'' combinations is equivalent to the correspondence rules between symbols of pre-modulation data as well as current internal states, and symbols of post-modulation data as well as succeeding internal states, as they are expressed in tables. Also, the above Equation (33) is equivalent to the correspondence rules between symbols of pre-modulation data as well as current internal states, and symbols of post-modulation data as well as succeeding internal states, as they are expressed in logical expressions. By the logical operation circuit that computes the logical expressions, or by looking up as a table to the ROM in which the rule table has previously been stored, it becomes possible to calculate post-demodulation code data $c'_{j,t}$ from pre-modulation channel data $a'_{k,t}$.

Thus, with the use of above Equation (36), logarithmic-likelihood ratios $L(c'_{j,t})$ of post-demodulation code data can be computed from the logarithmic-likelihood ratios $L(a'_{k,t})$ of pre-demodulation channel data by using the symbol correspondence rules among pre-modulation and post-modulation data, the current internal states and the succeeding internal states. Therefore, assuming that an arithmetic operation function for performing the operation of Equation (36) for all code data numbers "j" is $g_2$, a demodulator using the likelihood transform method can be said to be a demodulator that performs an operation of the following Equation (40):

$$(L(c'_{1,t}), L(c'_{2,t}), \ldots, L(c'_{j,t}), \ldots, L(c'_{m,t}), L(s'_{1,t+1}), L(s'_{2,t+1}),$$
$$\ldots, L(s'_{1,t+1}), \ldots, L(s'_{q,t+1})) = g_2(L(a'_{1,t}), L(a'_{2,t}), \ldots,$$
$$L(a'_{k,t}), \ldots, L(a'_{p,t}), L(s'_{1,t}), L(s'_{2,t}), \ldots, L(s'_{1,t}), \ldots, L(s'_{q,t})) \quad (40)$$

where $g_2$ is an arithmetic operation function for computing individual logarithmic-likelihood ratios of code-data m bits and succeeding-internal-state q bits from individual logarithmic-likelihood ratios of reproduced channel-data p bits and current-internal-state q bits.

Thus, assuming that the serial train of code data is $c_i$ and that a serial train of its corresponding channel data is $a_i$, then the transform from pre-demodulation bit-wise logarithmic-likelihood ratios $L(a'_i)$ to post-demodulation bit-wise logarithmic-likelihood ratios $L(c'_i)$ can be achieved even in the case of the demodulation method in which internal states are held within the demodulator.

In a similar fashion, transform from the bit-wise logarithmic-likelihood ratios $L(c'_i)$ of pre-modulation code data $c'_i$ to the bit-wise logarithmic-likelihood ratios $L(a'_i)$ of post-modulation channel data $a'_i$ can be achieved by the likelihood-transform RLL modulator 51 described above in the modulation method in which internal states are held within the modulator. Now the constitution of the likelihood-transform RLL demodulator 44 for performing demodulation by the likelihood transform method in which internal states are held within the demodulator as described above is described below.

Figure 9:
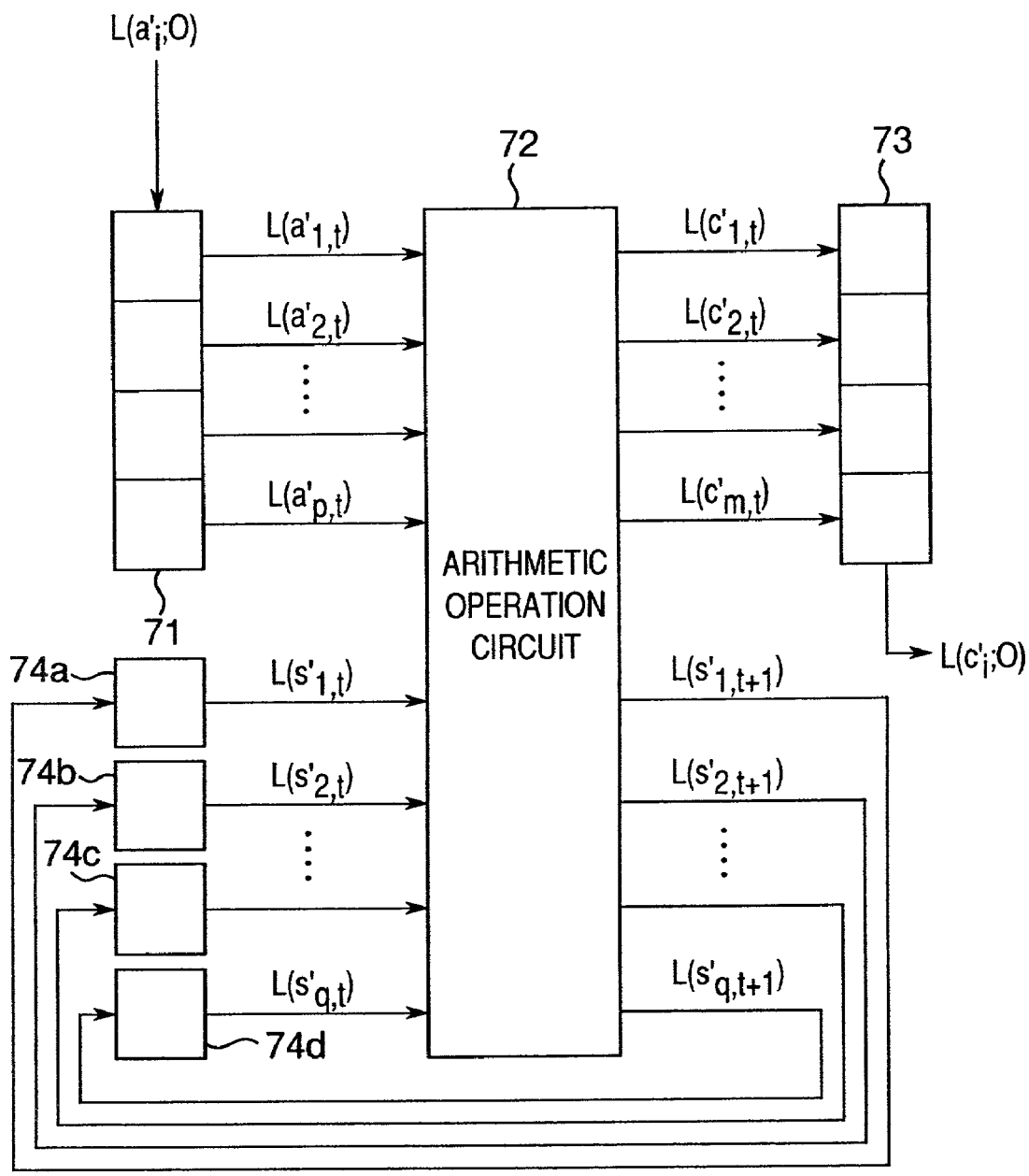
FIG. 9 is a block diagram of a likelihood-transform RLL demodulator in which internal states are held.

FIG. 9 is a block diagram in the case where the likelihood-transform RLL demodulator 44 is a likelihood-transform RLL demodulator using the likelihood transform method in which internal states are held within the demodulator. Logarithmic-likelihood ratios $L(a'_i;O)$ of channel data $a'_i$ outputted from the information output terminal u;O of the PR-channel APP decoder 43 (see FIG. 1) are inputted to a p-stage shift register 71. Then, data are shifted by the p-stage shift register 71 at Tw intervals so that parallel data $(L(a'_{1,t}), L(a'_{2,t}), \ldots, L(a'_{k,t}), \ldots, L(a'_{p,t}))$ are outputted to an arithmetic operation circuit 72. The arithmetic operation circuit 72 in turn performs arithmetic operations on the inputted parallel data $(L(a'_{1,t}), L(a'_{2,t}), \ldots, L(a'_{k,t}), \ldots, L(a'_{p,t}))$ and individual q-bit logarithmic-likelihood ratios $(L(s'_{1,t}), L(s'_{2,t}), \ldots, L(s'_{1,t}), \ldots, L(s'_{q,t}))$ representing the current internal states, which will be described later, according to Equations (36) and (40). Then, the arithmetic operation circuit 72 outputs logarithmic-likelihood ratio parallel data $(L(c'_{1,t}), L(c'_{2,t}), \ldots, L(c'_{j,t}), \ldots, L(c'_{m,t}))$ of post-demodulation code data and individual q-bit logarithmic-likelihood ratios $(L(s'_{1,t+1}), L(s'_{2,t+1}), \ldots, L(s'_{1,t+1}), \ldots, L(s'_{q,t+1}))$ representing the succeeding internal states.

An m-stage shift register 73 equipped with a parallel load function loads in parallel the logarithmic-likelihood ratio parallel data $(L(c'_{1,t}), L(c'_{2,t}), \ldots, L(c'_{j,t}), \ldots, L(c'_{m,t}))$ of post-demodulation code data derived from the arithmetic operation circuit 72, and shifts the data at Tb intervals, outputting logarithmic-likelihood ratios $L(c'_i)$ of post-demodulation code data. Also, the logarithmic-likelihood ratios $(L(s'_{1,t+1}), L(s'_{2,t+1}), \ldots, L(s'_{q,t+1}))$ representing the succeeding internal states and derived from the arithmetic operation circuit 72 are inputted to registers 74a, 74b, ..., 74d, respectively. It is noted that the registers 74a, 74b, 74d correspond to the bits representing internal states, respectively. Therefore, the total number of the registers 74a, 74b, ..., 74d is q. Then, the register 74a loads, and holds, the first logarithmic-likelihood ratio $L(s'_{1,t+1})$ of the succeeding internal states at (m×Tb) intervals, and outputs the first logarithmic-likelihood ratio $L(s'_{1,t+1})$ of the current internal states at the next time point to the arithmetic operation circuit 72. Similarly, the other registers 74b, ..., 74d also load and hold the second, ..., "q"th logarithmic-likelihood ratios $L(s'_{2,t+1}), \ldots, L(s'_{q,t+1})$ of the succeeding internal states, and output the second, ..., "q"th logarithmic-likelihood ratios $L(s'_{2,t}), \ldots, L(s'_{q,t})$ of the current internal states. In this case, the arithmetic operations by the arithmetic operation circuit 72, the parallel loading by the m-stage shift register 73 and the loading by the registers 74a, ..., 74d are performed synchronously at (m×Tb) intervals.

Of course, the simplified method in which the computations of the exponential function "exp" and the natural logarithm function "ln" are omitted can be applied to Equation (36) also in the case of the likelihood-transform RLL demodulator using the likelihood transform method in which internal states are held within the demodulator, as in the case of the likelihood-transform RLL demodulator using the likelihood transform method based solely on inputted channel-data p bits. Thus, arithmetic processing by the arithmetic operation circuit 72 can be simplified.

Even in the above-described likelihood-transform RLL modulator 51, in a similar fashion, transform from the bit-wise logarithmic-likelihood ratios $L(c'_i)$ of pre-modulation code data $c'_i$ to the bit-wise logarithmic-likelihood ratios $L(a'_i)$ of post-modulation channel data $a'_i$ can be achieved by the likelihood transform method in which internal states are held within the modulator.

In addition, in this embodiment, since the logarithmic-likelihood ratios are real numbers, the p-stage shift registers 55, 71, the m-stage shift registers 57, 73 and the registers 74a–74d are to hold real numbers. These real numbers may be numbers quantized with floating-point precision or fixed-point precision, and furthermore may be numbers of integer precision. Generally, the floating-point precision, the fixed-point precision and the integer precision are ranked in terms of arithmetic precision, higher to lower, in this order.

Also in this embodiment, logarithmic-likelihood ratios are used as likelihoods to be inputted or outputted by individual blocks. The reason of this is that using logarithmic-likelihood ratios allows the computing amount to be reduced. However, the present invention is not limited to logarithmic-likelihood ratios, and as an example, probability values may be inputted or outputted, as they are, by individual blocks. In this case, the subtracters 45, 49 in FIG. 1 should be replaced with dividers.

Also in this embodiment, the convolutional code suitable for the turbo code method is used as the error-correcting code. However, the present invention is not limited to the convolutional code, and any error-correcting code capable of soft-information input and soft-information output decoding process will do. In this case, the convolutional coder 31 in FIG. 2 should be replaced with an error-correcting coder, and the convolutional-code APP decoder 47 in FIG. 1 should be replaced with an APP decoder for error-correcting codes.

Also, the modulation method is not limited to the RLL modulation. Any modulation method and demodulation method based on symbol correspondence rules between pre-modulation and post-modulation data and between pre-demodulation and post-demodulation data, or any modulation method and demodulation method based on correspondence rules between pre-modulation and post-modulation data as well as symbols of current internal states, and post-modulation and post-demodulation data as well as symbols of succeeding internal states, will do for implementation of the modulator and the demodulator using the likelihood transform method.

Also, although a time invariant demodulation system is used in this embodiment, this is not limitative. It is noted here that the time invariant demodulation system means that the function of Equation (10) or (33) does not vary with respect to the time point "t." However, the present invention is applicable also to time variant demodulation methods. It is noted here that the time variant demodulation method means that the function of Equation (10) or (33) varies with respect to time point "t." In the case where a time variant demodulation method is applied, the function for performing likelihood transform may be varied in correspondence to variations of the function of Equation (10) or (33). That is, the function of Equation (23) or (40) may be varied on a time-point basis. In addition, with the time-variant modulation method used, a likelihood-transform RLL modulator using the likelihood transform method can also be implemented in the same manner as described above.

Furthermore, in order to further reduce the error rate, an error-correcting coder may be provided for outer codes in addition to the convolutional coder 31 serving for inner codes. Also, additionally providing an interleaver between the error-correcting coder for outer codes and the convolutional coder 31 for inner codes allows the error rate to be further reduced. In this case, in a recording-medium reproducing apparatus corresponding to this, the deinterleaver and error-correcting-code APP demodulator should be connected, in this order, to the information output terminal u;O of the convolutional-code decoder 47.

(Second Embodiment)

Figure 10:
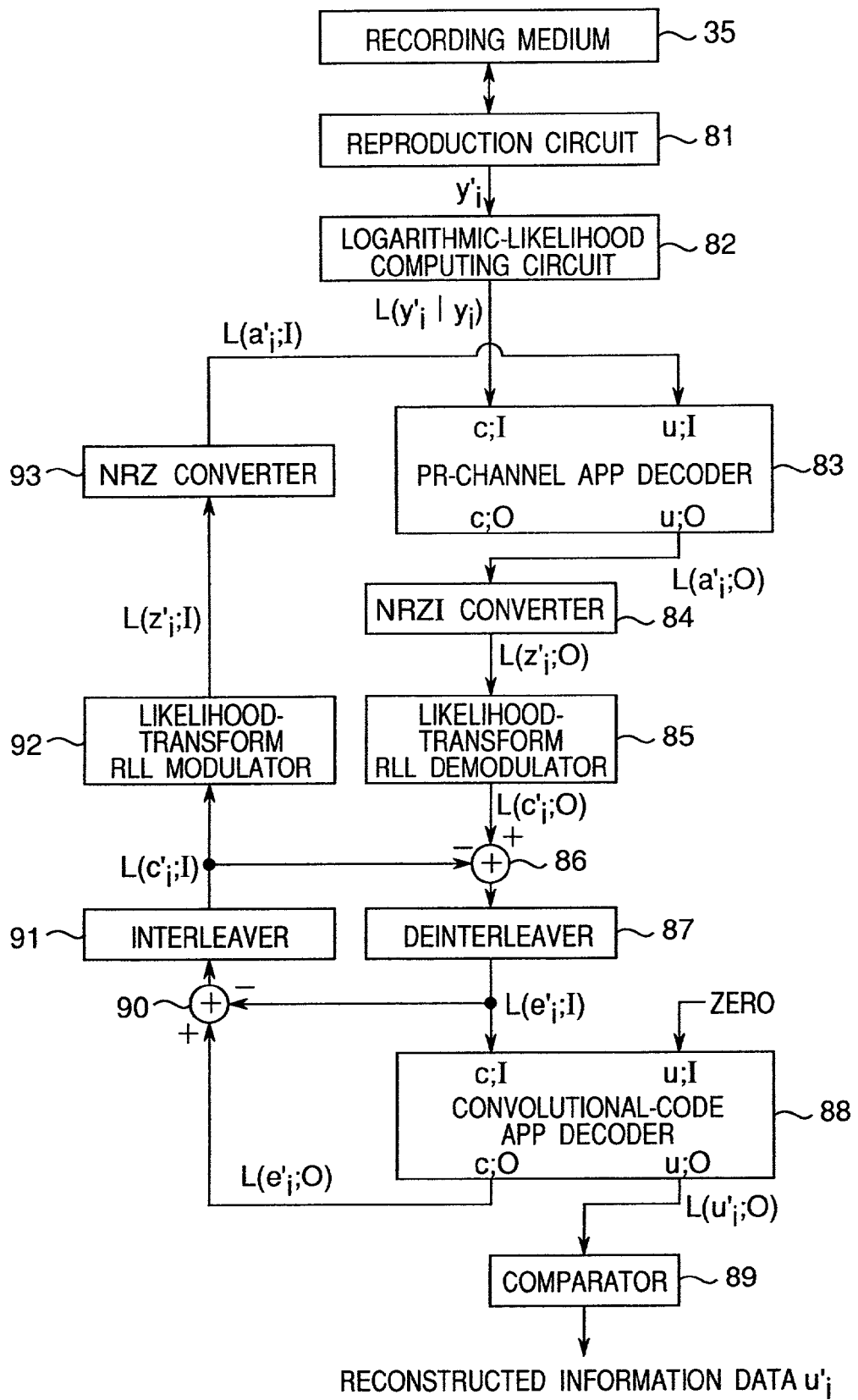
FIG. 10 is a block diagram of a recording-medium reproducing apparatus in a second embodiment of the invention.

FIG. 10 shows a block diagram of a recording-medium reproducing apparatus in a second embodiment of the invention. A reproduction circuit 81, a logarithmic-likelihood computing circuit 82, a PR-channel APP decoder 83, a subtracter 86, a deinterleaver 87, a convolutional-code APP decoder 88, a comparator 89, a subtracter 90 and an interleaver 91 are similar to the reproduction circuit 41, the logarithmic-likelihood computing circuit 42, the PR-channel APP decoder 43, the subtracter 45, the deinterleaver 46, the convolutional-code APP decoder 47, the comparator 48, the subtracter 49 and the interleaver 50, respectively, in the recording-medium reproducing apparatus shown in FIG. 1 in the first embodiment.

An NRZI converter 84, to which logarithmic-likelihood ratios $L(a'_i;O)$ of channel data $a'_i$ outputted from the information output terminal u;O of the PR-channel APP decoder 83 are inputted, computes and outputs logarithmic-likelihood ratios $L(z'_i;O)$ of channel data $z'_i$ based on the NRZI rules at Tw intervals. A likelihood-transform RLL demodulator 85 performs RLL demodulation by the likelihood transform method on the inputted logarithmic-likelihood ratios $L(z'_i;O)$ of channel data $z'_i$ before demodulation based on the NRZI rules, outputting logarithmic-likelihood ratios $L(c'_i;O)$ of post-demodulation code data $c'_i$. The outputted logarithmic-likelihood ratios $L(c'_i;O)$ are inputted to the subtracter 86.

A likelihood-transform RLL modulator 92, to which logarithmic-likelihood ratios $L(c'_i;I)$ of pre-modulation code data $c'_i$ derived from an interleaver 91 are inputted, computes and outputs logarithmic-likelihood ratios $L(z'_i;I)$ of channel data $z'_i$ based on the NRZI rules. An NRZ converter 93, to which these logarithmic-likelihood ratios $L(z'_i;I)$ are inputted, computes and outputs logarithmic-likelihood ratios $L(a'_i;I)$ of the channel data $a'_i$. The outputted logarithmic-likelihood ratios $L(a'_i;I)$ are inputted to the information input terminal u;I of the PR-channel APP decoder 83.

In this constitution, the combination of the NRZI converter 84 and the likelihood-transform RLL demodulator 85 offers the same functions as the likelihood-transform RLL demodulator 44 of the first embodiment. Also, the combination of the likelihood-transform RLL modulator 92 and the NRZ converter 93 offers the same functions as the likelihood-transform RLL modulator 51 of the first embodiment. Needless to say, only the likelihood-transform RLL demodulator 44 of the first embodiment may be replaced with the NRZI converter 84 and the likelihood-transform RLL demodulator 85. Further, only the likelihood-transform RLL modulator 51 of the first embodiment may be replaced with the likelihood-transform RLL modulator 92 and the NRZ converter 93.

Figure 11:
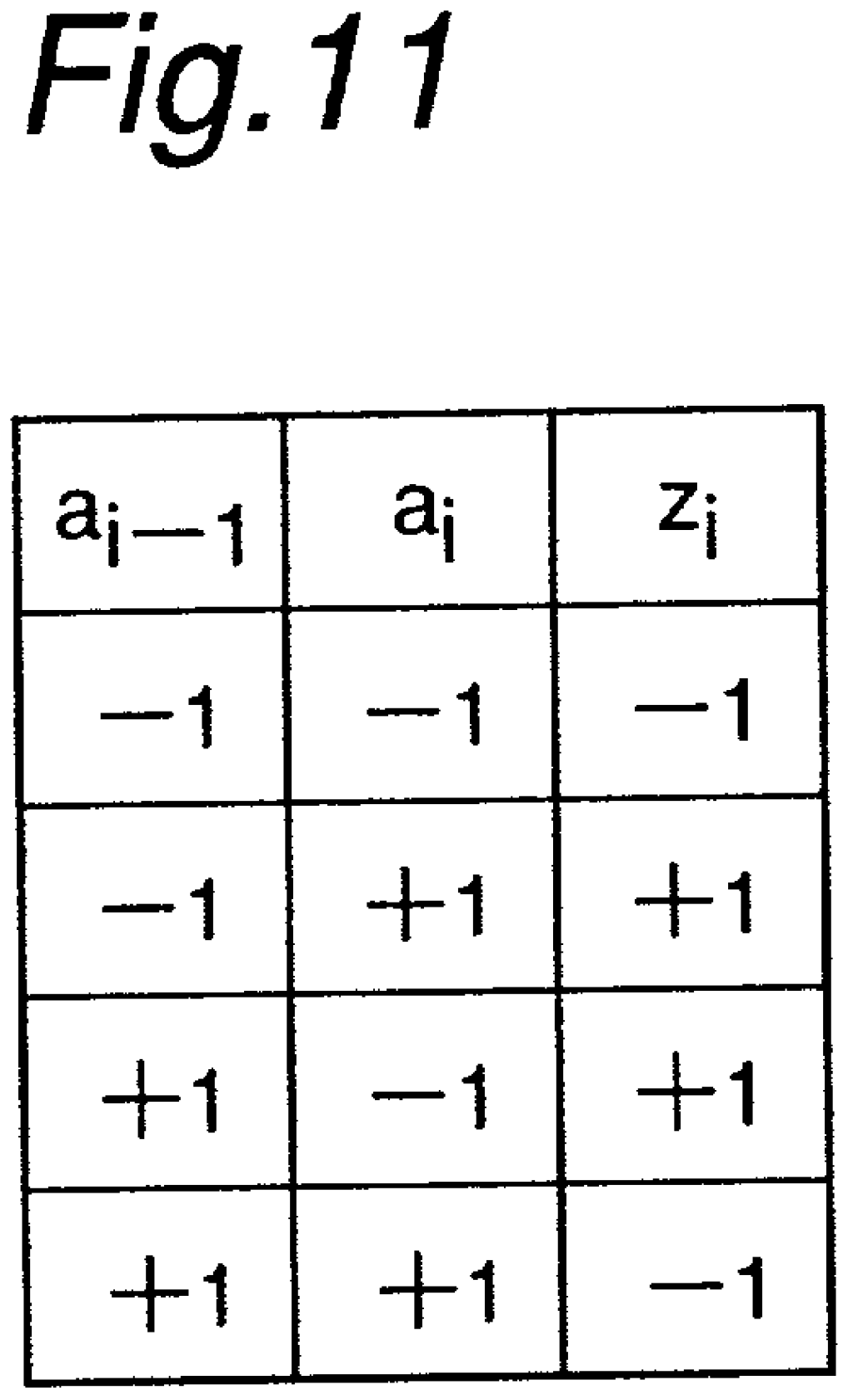

Next, contents of computations by the NRZI converter 84 are explained in detail. The NRZI converter 84, to which logarithmic-likelihood ratios $L(a'_i;O)$ of channel data $a'_i$ are inputted, computes and outputs logarithmic-likelihood ratios $L(z'_i;O)$ of channel data $z'_i$ according to the NRZI rules at Tw intervals. In this case, a "+1" of a channel bit $z_i$ represents a polarity inversion of the reproduced signal, and a "−1" of a channel bit $z_i$ represents an obtainment of the same polarity of the reproduced signal as the preceding bit, i.e. preceding-polarity holding. A conversion table of the NRZI converter 84 is shown in FIG. 11. Referring to FIG. 11, when adjacent two bits, "$a_{i-1}$" and "$a_i$," are of different signs, the polarity is inverted, so that the channel bit $z_i$ results in a "+1." Also, when the bits are of the same sign, there occurs no polarity inversion, so that the channel bit $z_i$ results in a "−1." Therefore, logarithmic-likelihood ratios of the channel bits $z_i$ can be calculated as follows:

$$L(z'_i) = \ln \frac{\begin{array}{l}P(a'_{i-1} \mid a_{i-1} = +1) \cdot P(a'_i \mid a_i = -1) + \\ P(a'_{i-1} \mid a_{i-1} = -1) \cdot P(a'_i \mid a_i = +1)\end{array}}{\begin{array}{l}P(a'_{i-1} \mid a_{i-1} = -1) \cdot P(a'_i \mid a_i = -1) + \\ P(a'_{i-1} \mid a_{i-1} = +1) \cdot P(a'_i \mid a_i = +1)\end{array}} \quad (41)$$

$$= \ln \frac{\exp\{L(a'_i)\} + \exp\{L(a'_{i-1})\}}{1 + \exp\{L(a'_i)\} + \{L(a'_{i-1})\}}$$

where $P(a'_{i-1}|a_{i-1}+1)$ is a conditional probability at which reproduced channel data becomes $a'_i$−1 under the condition that $a_{i-1}$ at recording is "+1."

Figure 12:
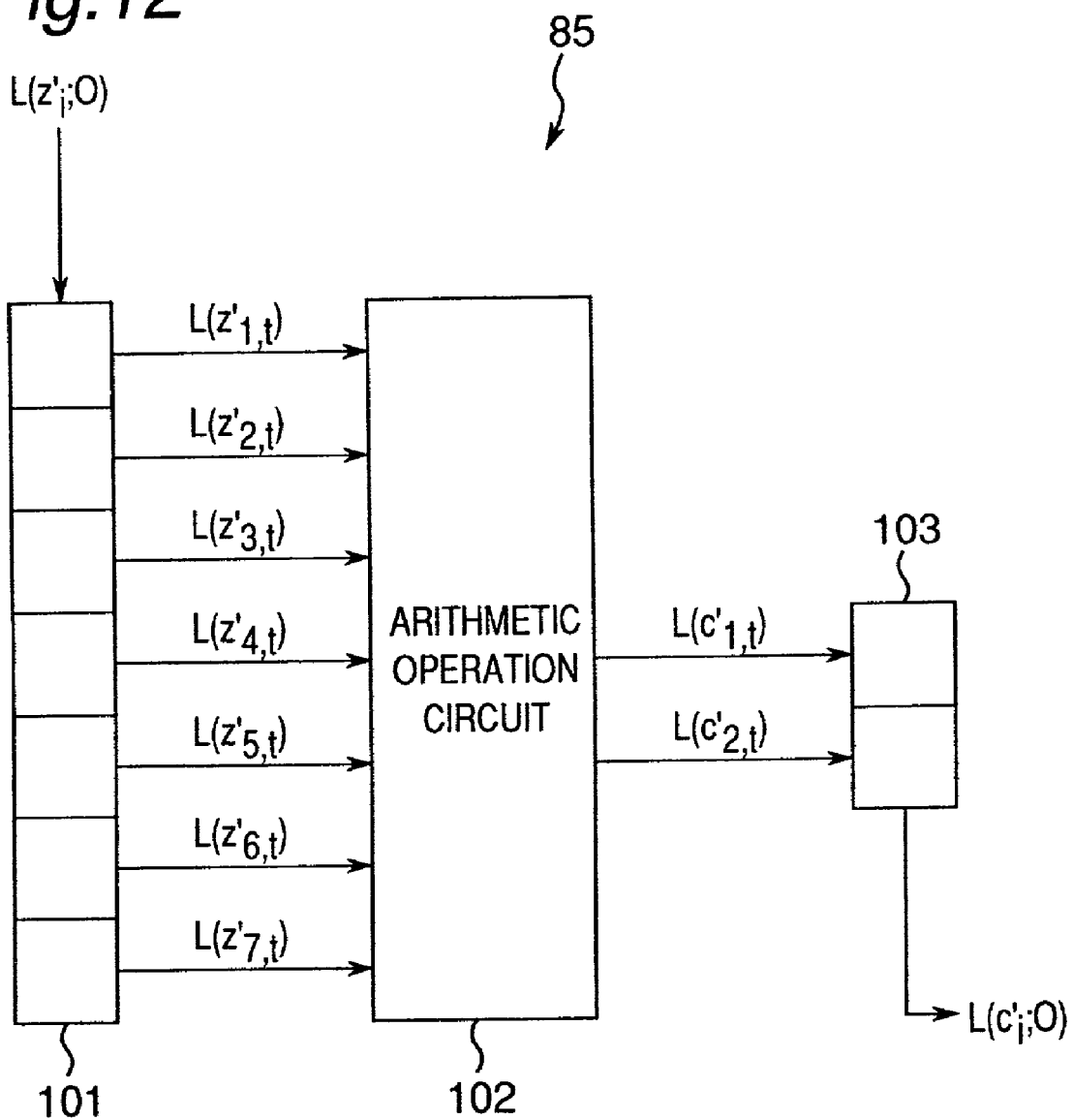
FIG. 12 is a block diagram of the likelihood-transform RLL demodulator based on RLL(1, 7) in FIG. 10.

Next, concrete operations of the likelihood-transform RLL demodulator 85 are described on a case where the RLL modulation method is RLL(1, 7) as an example. FIG. 12 is a block diagram showing a concrete constitution of the likelihood-transform RLL demodulator 85 in the case of RLL(1, 7). Logarithmic-likelihood ratios $L(z'_i;O)$ outputted from the NRZI converter 84 are inputted to a 7-stage shift register 101. Then, data are shifted by the 7-stage shift register 101 at Tw intervals so that parallel data ($L(z'_{1,t})$, $L(z'_{2,t})$, ..., $L(z'_{k,t})$, ..., $L(z'_{7,t})$) are outputted. An arithmetic operation circuit 102 performs arithmetic operations on the parallel data ($L(z'_{1,t})$, $L(z'_{2,t})$, ..., $L(z'_{k,t})$, ..., $L(z'_{7,t})$), outputting logarithmic-likelihood ratio parallel data ($L(c'_{1,t})$, $L(c'_{2,t})$) of post-demodulation code data. It is noted that contents of arithmetic operations in the case of RLL(1, 7) will be described later. A 2-stage shift register 103 equipped with the parallel load function loads in parallel the logarithmic-likelihood ratio parallel data ($L(c'_{1,t})$, $L(c'_{2,t})$) of post-demodulation code data, and shifts the data at Tb intervals, outputting logarithmic-likelihood ratios $L(c'_i)$ of post-demodulation code data. These arithmetic operations and parallel loading are performed synchronously at (2×Tb) intervals.

Contents of arithmetic operations by the arithmetic operation circuit 102 are described in detail below. FIG. 13 shows a demodulation table for determining post-demodulation data from channel data based on the NRZI rules. The demodulation table of FIG. 13 allows X's in FIG. 4 to be developed into 0's and 1's for achievement of the determination. It is noted that the number of combinations of seven bits of channel bits based on the NRZI rules is 34 (H=34) as shown in FIG. 13. Therefore, it is appropriate for the arithmetic operation circuit 102 to compute Equation (22) by looking up to the demodulation table of FIG. 13. In this case, the arithmetic operations of Equation (22) should be performed under the condition that the symbol $z'_i$ of channel data based on the NRZI rules to be inputted to the arithmetic operation circuit 102 is formally replaced with $a'_i$. In addition, rewriting $N_h$ of Equation (24) by using the symbol $z'_i$ of channel data based on the NRZI rules results in Equation (42):

$$N_h = \sum_{k=1}^{p} L(a'_{k,t}) B_{h,k} \quad (42)$$

In the case of the likelihood-transform RLL demodulator 85 in the recording-medium reproducing apparatus using the NRZI converter 84 shown in FIG. 10, the channel bits $z'_i$ come in 34 combinations. This number is one half of the number of combinations, 68, for the likelihood-transform RLL demodulator 44 in the recording-medium reproducing apparatus that does not use the NRZI converter shown in FIG. 1. Thus, the computing amount and the computing time can be reduced.

Next, contents of computations by the NRZ converter 93 are described. The NRZ converter 93, to which logarithmic-likelihood ratios $L(z'_i;I)$ of channel data $z'_i$ based on the NRZI rules are inputted at Tw intervals, computes and outputs logarithmic-likelihood ratios $L(a'_i;I)$ of channel data $a'_i$. The conversion table for the NRZI converter 84 shown in FIG. 11 can be utilized as it is as the conversion table for the NRZ converter 93.

As described above, the NRZ converter 93, to which logarithmic-likelihood ratios $L(z'_i)$ are inputted, holds $L(a_{i-1})$ as internal states and outputs logarithmic-likelihood ratios $L(a'_i)$. The logarithmic-likelihood ratios $L(a'_i)$ of channel data $a'_i$ in this case are calculated by the following Equation (43):

$$L(a'_i) = \ln \frac{P(a'_{i-1} \mid a_{i-1} = +1) \cdot P(z'_i \mid z_i = -1) + P(a'_{i-1} \mid a_{i-1} = -1) \cdot P(z'_i \mid z_i = +1)}{P(a'_{i-1} \mid a_{i-1} = -1) \cdot P(z'_i \mid z_i = -1) + P(a'_{i-1} \mid a_{i-1} = +1) \cdot P(z'_i \mid z_i = +1)}$$

$$= \ln \frac{\exp\{L(z'_i)\} + \exp\{L(a'_{i-1})\}}{1 + \exp\{L(z'_i)\} + \{L(a'_{i-1})\}} \quad (43)$$

where logarithmic-likelihood ratios $L(a'_i)$ calculated at a time point "i" are used as logarithmic-likelihood ratios $L(a_{i-1})$ in the calculation at a time point "i+1."

FIG. 14 shows a modulation table of RLL(1, 7) standardized by ECMA-195 as described before. It is noted that FIG. 14 is expressed in channel bits based on the NRZI rules. The likelihood-transform RLL modulator 92 is enabled to calculate post-modulation 3-bit channel data from pre-modulation 4-bit code data by looking up to this table. In this calculation, one bit equal to channel data that has been modulated immediately before needs to be held as the internal state.

FIG. 15 shows a modulation table in which X's in FIG. 14 are developed to 0's and 1's. Referring to FIG. 15, $D''_{h,1}, \ldots, D''_{h,4}$ are code data of 4 bits (p=4) before modulation. Also, $D''_{h,5}$ is an internal state of 1 bit (q=1) that is channel data modulated immediately before. Further, $B''_{h,1}, \ldots, B''_{h,3}$ are channel data of post-modulation 3 bits (n=3) based on the NRZI rules. $B''_{h,4}$ is a succeeding internal state of 1 bit. In addition, logarithmic-likelihood ratios $L(a''_{k,t})$ of code data $a''_{j,t}$ in the modulation based on the above modulation table are as shown by the following Equation (44):

$$L(a''_{k,t}) = \ln \frac{\sum_{\substack{h \\ D''_{h,j}=1}} \exp(N_h)}{\sum_{\substack{h \\ D''_{h,j}=0}} \exp(N_h)} \quad (44)$$

$$N_h = \sum_{k=1}^{p+q} L(c''_{j,t}) D''_{h,k}$$

where $\exp(N_h)$ in Equation (44) corresponds to the "th"th row in the modulation table shown in FIG. 15. Also, $N_h$ represents a total sum of $L(c'_{k,t})$ satisfying that $D''_{h,k}=1$ in the modulation table shown in FIG. 15.

Further, using the modulation table shown in FIG. 15 as a demodulation table allows the computations of the arithmetic operation circuit in the likelihood-transform RLL demodulator 85 to be implemented.

As shown above, in the recording-medium reproducing apparatus of this embodiment, the NRZI converter 84 that receives inputs of logarithmic-likelihood ratios $L(a'_i;O)$ and produces outputs of logarithmic-likelihood ratios $L(z'_i;O)$ of channel data $z'_i$ based on the NRZI rules is disposed between the PR-channel APP decoder 83, which is one of the two APP decoders constituting the turbo decoder, and the likelihood-transform RLL demodulator 85. Also, the NRZ converter 93 that receives inputs of logarithmic-likelihood ratios $L(z'_i;I)$ based on the NRZI rules and produces outputs of logarithmic-likelihood ratios $L(a'_i;I)$ of channel data $a'_i$ is disposed between the likelihood-transform RLL modulator 92 and the PR-channel APP decoder 83.

Accordingly, the likelihood-transform RLL demodulator 85 has no need of performing NRZI conversion based on the NRZI rules, and the likelihood-transform RLL modulator 92 has no need of performing NRZ conversion based on the NRZI rules. Consequently, computing amount and computing time of the likelihood-transform RLL demodulator 85 and the likelihood-transform RLL modulator 92 can be considerably reduced, compared with those of the likelihood-transform RLL demodulator 44 and the likelihood-transform RLL modulator 51 in the first embodiment.

(Third Embodiment)

Figure 16:
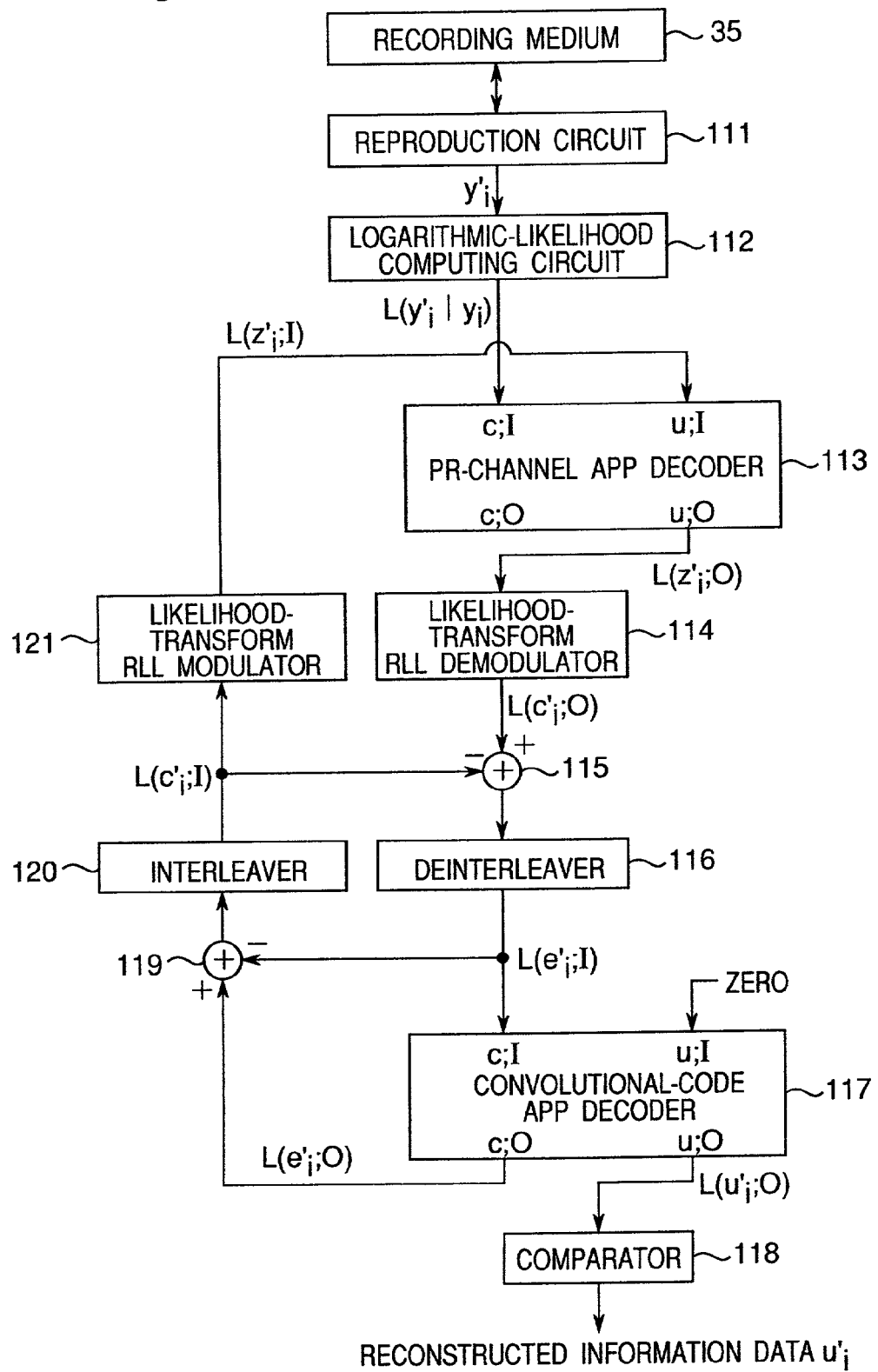
FIG. 16 is a block diagram of a recording-medium reproducing apparatus in a third embodiment of the invention.

FIG. 16 shows a block diagram of a recording-medium reproducing apparatus in a third embodiment. A reproduction circuit 111, a logarithmic-likelihood computing circuit 112, a subtracter 115, a deinterleaver 116, a convolutional-code APP decoder 117, a comparator 118, a subtracter 119 and an interleaver 120 are similar to the reproduction circuit 41, the logarithmic-likelihood computing circuit 42, the subtracter 45, the deinterleaver 46, the convolutional-code APP decoder 47, the comparator 48, the subtracter 49 and the interleaver 50, respectively, of the recording-medium reproducing apparatus shown in FIG. 1 in the first embodiment. Also, a likelihood-transform RLL demodulator 114 and a likelihood-transform RLL modulator 121 are similar to the likelihood-transform RLL demodulator 85 and the likelihood-transform RLL modulator 92 of the recording-medium reproducing apparatus shown in FIG. 10 in the second embodiment.

In a PR-channel APP decoder 113, logarithmic likelihoods $L(y'_i|y_i)$ of a reproduced signal $y'_i$ derived from the logarithmic-likelihood computing circuit 112 are inputted to a code input terminal c;I, and logarithmic-likelihood ratios $L(z'_i;I)$ of channel data $z_i$ based on the NRZI rules, which are outputs of the likelihood-transform RLL modulator 121, are inputted to an information input terminal u;I. Also, logarithmic-likelihood ratios $L(z'_i;O)$ of channel data $z_i$ based on the NRZI rules are outputted from an information output terminal u;O. It is noted that the code output terminal c;O, from which the logarithmic likelihoods $L(y'_i;O)$ of the PR channel data $y'_i$ are outputted, is connected to none.

Figure 17:
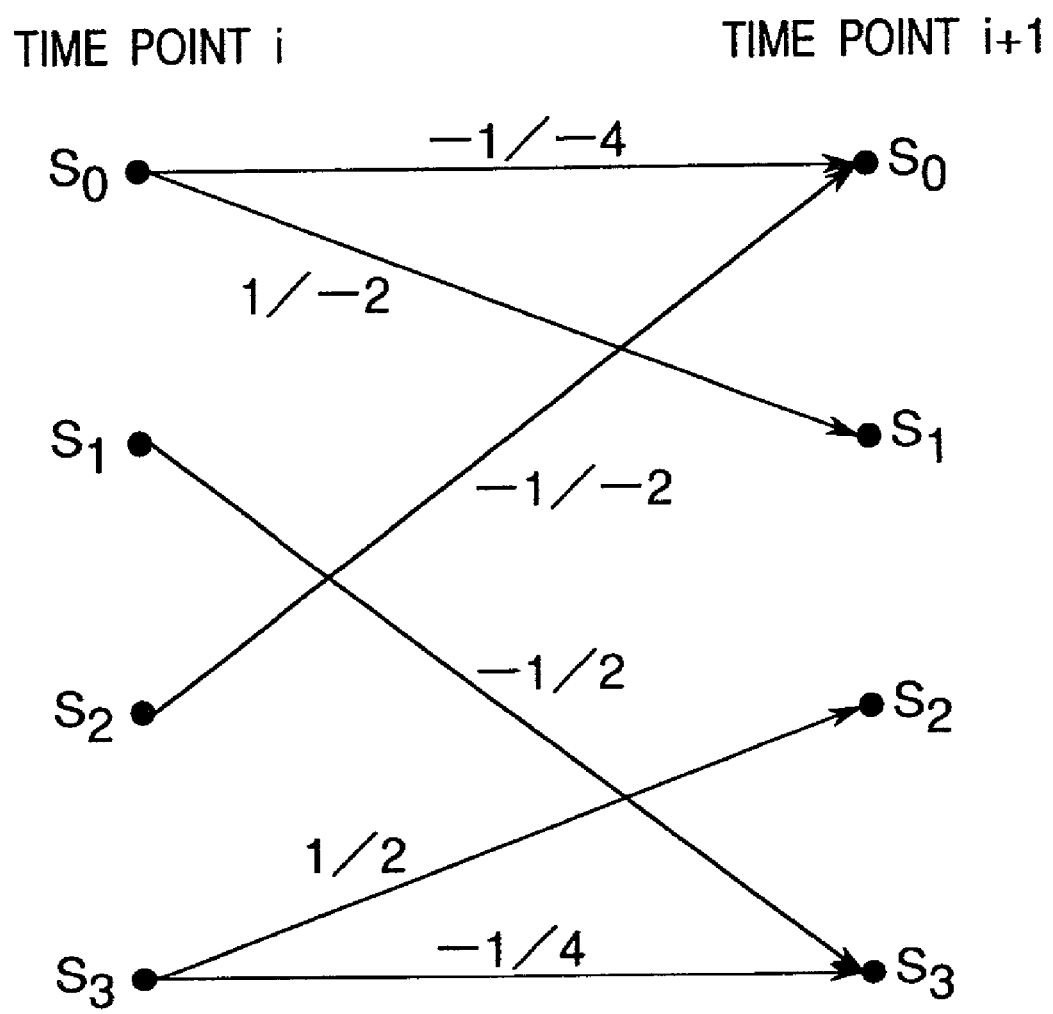
FIG. 17 shows an example of a trellis diagram of the PR-channel APP decoder in FIG. 16.

FIG. 17 shows a trellis diagram necessary for the PR-channel APP decoder 113 to achieve APP decoding in the case where the RLL modulation method by the likelihood-transform RLL demodulator 114 and the likelihood-transform RLL modulator 121 in FIG. 16 is RLL(1, 7) and where the PR transfer characteristic in the PR channel composed of the recording circuit 34, the recording medium 35 and the reproduction circuit 111 is (1,2,1). This trellis diagram makes use of the minimum run length limit (d=1) and constraints concerning PR transfer characteristics, and not the maximum run length limit (k=7). The trellis diagram shown in FIG. 17 has four internal states of $S_0$, $S_1$, $S_2$ and $S_3$. In the figure, with regard to fractions added to arrows directed from internal states at a time point "i" to internal states at a time point "i+1," the numerator represents the channel data $z_i$ based on the NRZI rules and the denominator represents the PR channel data $y_i$. For example, given an internal state $S_3$ at the time point "i," if the PR channel data $y_i$ is "2," then the channel data $z_i$ based on the NRZI rules is "1," and the internal state at the next time point "i+1" is $S_2$. The PR-channel APP decoder 113 may appropriately perform APP decoding according to this trellis diagram.

The PR transfer characteristic of this PR-channel APP decoder 113 is not limited to the above shown (1, 2, 1). Any PR transfer characteristic suitable for the recording medium may be applied as the PR transfer characteristic for the recording-medium reproducing apparatus of the invention. The trellis diagram may be defined according to the PR transfer characteristic, and the PR-channel APP decoder 113 may be operated based on the defined trellis diagram. Therefore, in the case where the recording medium is a hard disk or other magnetic recording medium as an example, PR transfer characteristics such as so-called PR4 (1,0, −1) or so-called EPR4 (1,1,−1,−1) may be used. Furthermore, this embodiment is applicable even to cases where the PR transfer characteristic is 1 (i.e., other than PR). In such a case, the PR-channel APP decoder 113 should perform APP decoding using only the minimum run length limit (d=1), where PR channel data $y_i$ equals to channel data $a_i$.

In addition, neither the trellis diagram shown in FIG. 8 in the first embodiment nor the trellis diagram shown in FIG. 17 uses the maximum run length limit (k=7). However, even a trellis diagram further using the maximum run length limit (k=7) will do without problems.

As shown above, in the recording-medium reproducing apparatus of this embodiment, the PR-channel APP decoder 113, which is one of the two APP decoders constituting the turbo decoder, has an APP decoding function of receiving inputs of logarithmic likelihoods $L(y'_i|y_i)$ of PR channel data $y_i$ and producing outputs of logarithmic-likelihood ratios $L(z'_i;O)$ of channel data $z_i$ based on the NRZI rules.

Accordingly, the likelihood-transform RLL demodulator 114 has no need of performing NRZI conversion based on the NRZI rules, and the likelihood-transform RLL modulator 121 has no need of performing NRZ conversion based on the NRZI rules. Consequently, computing amount and computing time of the likelihood-transform RLL demodulator 114 and the likelihood-transform RLL modulator 121 can be considerably reduced, compared with those of the likelihood-transform RLL demodulator 44 and the likelihood-transform RLL modulator 51 in the first embodiment.

(Fourth Embodiment)

Figure 18:
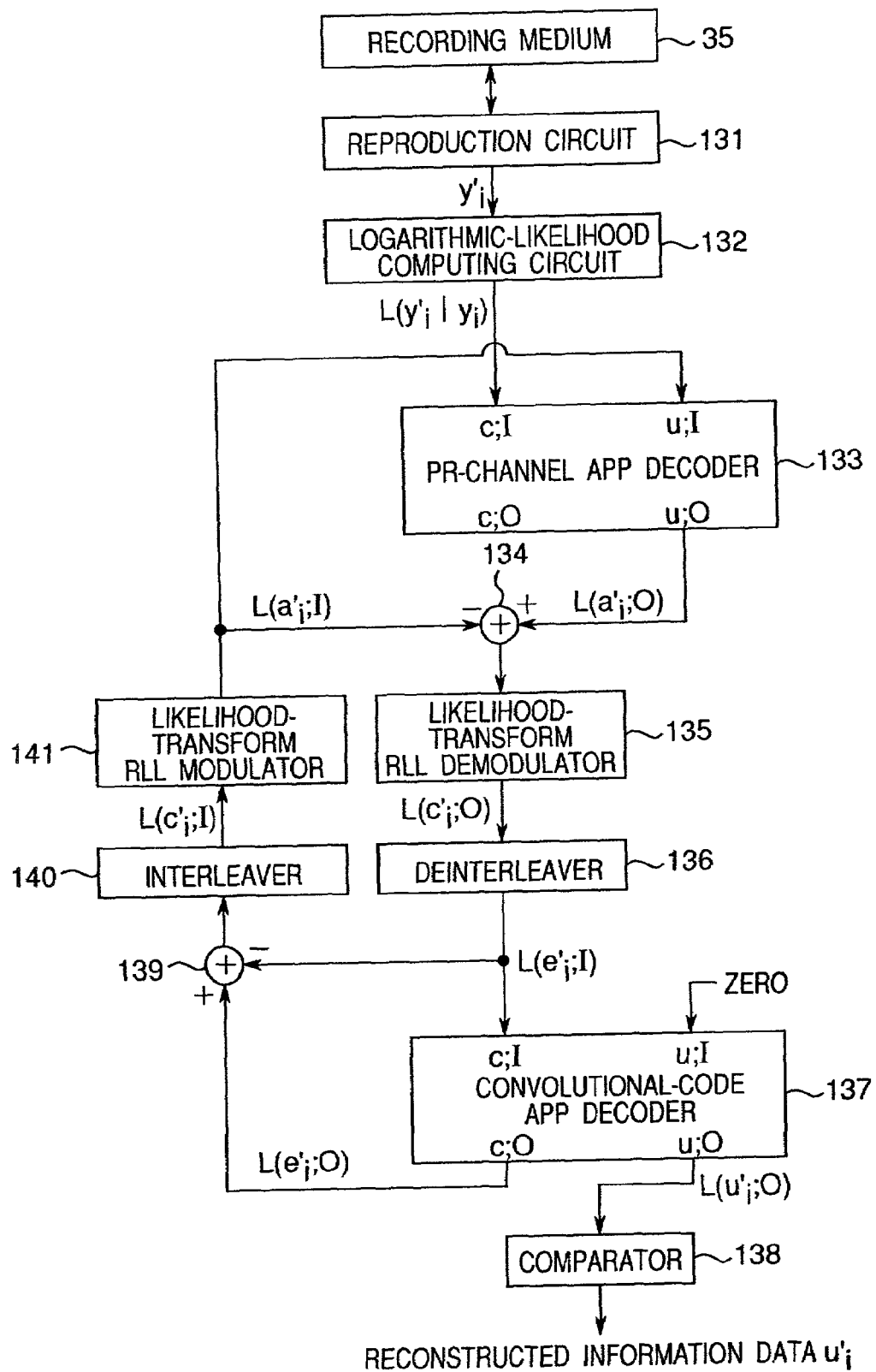
FIG. 18 is a block diagram of a recording-medium reproducing apparatus in a fourth embodiment of the invention.

FIG. 18 shows a block diagram of a recording-medium reproducing apparatus in a fourth embodiment of the invention. A reproduction circuit 131, a logarithmic-likelihood computing circuit 132, a PR-channel APP decoder 133, a likelihood-transform RLL demodulator 135, a deinterleaver 136, a convolutional-code APP decoder 137, a comparator 138, a subtracter 139, an interleaver 140 and a likelihood-transform RLL modulator 141 are similar to the reproduction circuit 41, the logarithmic-likelihood computing circuit 42, the PR-channel APP decoder 43, the likelihood-transform RLL demodulator 44, the deinterleaver 46, the convolutional-code APP decoder 47, the comparator 48, the subtracter 49, the interleaver 50 and the likelihood-transform RLL modulator 51, respectively, in the recording-medium reproducing apparatus shown in FIG. 1 in the first embodiment.

The subtracters 45, 86, 115 in the first to third embodiments are so designed to compute differences between logarithmic-likelihood ratios $L(c'_i;O)$ of code data $c'_i$ derived from the likelihood-transform RLL demodulators 44, 85, 114 and logarithmic-likelihood ratios $L(c'_i;I)$ of code data $c'_i$ derived from the interleavers 50, 91, 120. It is noted that the code data $c'_i$ in this case are data after demodulation (i.e., before modulation). A subtracter 134 of this embodiment, in contrast, computes differences Lext($a'_i$) between logarithmic-likelihood ratios $L(a'_i;O)$ of channel data $a'_i$ before demodulation (i.e., after modulation) derived from the PR-channel APP decoder 133 and logarithmic-likelihood ratios $L(a'_i;I)$ of channel data $a'_i$ derived from the likelihood-transform RLL modulator 141.

The subtracter 134 operates immediately after the PR-channel APP decoder 133 has outputted logarithmic-likelihood ratios $L(a'_i;O)$. Then, as described above, the subtracter 134 subtracts logarithmic-likelihood ratios $L(a'_i;I)$, which are outputs of the likelihood-transform RLL modulator 141, from the logarithmic-likelihood ratios $L(a'_i;O)$, outputting its subtraction results as $Lext(a'_i)$. The $Lext(a'_i)$ outputted in this way are inputted to the likelihood-transform RLL demodulator 135. That is, the subtracter 134 calculates differences with respect to the logarithmic-likelihood ratios of channel data $a'_i$ updated by the PR-channel APP decoder 133.

(Fifth Embodiment)

Figure 19:
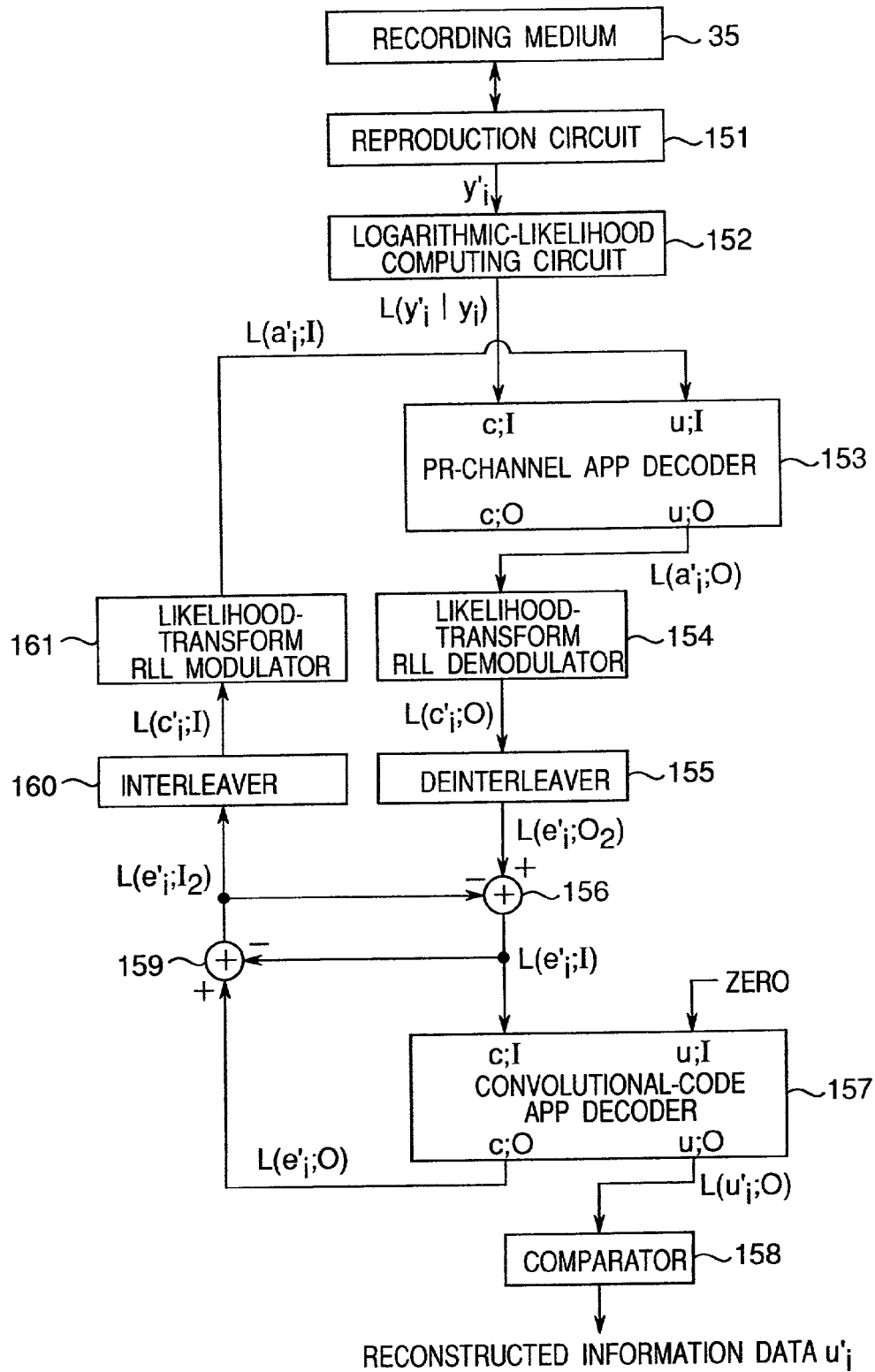
FIG. 19 is a block diagram of a recording-medium reproducing apparatus in a fifth embodiment of the invention.

FIG. 19 shows a block diagram of a recording-medium reproducing apparatus in a fifth embodiment. A reproduction circuit 151, a logarithmic-likelihood computing circuit 152, a PR-channel APP decoder 153, a likelihood-transform RLL demodulator 154, a deinterleaver 155, a convolutional-code APP decoder 157, a comparator 158, a subtracter 159, an interleaver 160 and a likelihood-transform RLL modulator 161 are similar to the reproduction circuit 41, the logarithmic-likelihood computing circuit 42, the PR-channel APP decoder 43, the likelihood-transform RLL demodulator 44, the deinterleaver 46, the convolutional-code APP decoder 47, the comparator 48, the subtracter 49, the interleaver 50 and the likelihood-transform RLL modulator 51, respectively, in the recording-medium reproducing apparatus shown in FIG. 1 in the first embodiment.

A subtracter 156 operates immediately after the deinterleaver 155 has outputted logarithmic-likelihood ratios $L(e'_i;O_2)$ of code data $e'_i$. Then, the subtracter 156 subtracts logarithmic-likelihood ratios $L(e'_i;I_2)$ of code data $e'_i$, which are outputs of the subtracter 159, from the logarithmic-likelihood ratios $L(e'_i;O_2)$, outputting its subtraction results as logarithmic-likelihood ratios $L(e'_i;I)$. The logarithmic-likelihood ratios $L(e'_i;I)$ outputted in this way are inputted to the code input terminal c;I of the convolutional-code APP decoder 157. That is, the subtracter 156 calculates differences of the logarithmic-likelihood ratios of code data $e'_i$ updated by the PR-channel APP decoder 133.

The subtracter 159 operates immediately after the convolutional-code APP decoder 157 has outputted logarithmic-likelihood ratios $L(e'_i;O)$ of code data $e'_i$. Then, the subtracter 159 subtracts logarithmic-likelihood ratios $L(e'_i;I)$, which are outputs of the subtracter 156, from the logarithmic-likelihood ratios $L(e'_i;O)$, outputting its subtraction results as logarithmic-likelihood ratios $L(e'_i;I_2)$. The logarithmic-likelihood ratios $L(e'_i;I_2)$ outputted in this way are inputted to the interleaver 160. That is, the subtracter 159 calculates differences with respect to the logarithmic-likelihood ratios of code data $e'_i$ updated by the convolutional-code APP decoder 157.

As can be seen from the first, fourth and fifth embodiments, the subtracter 45, 134, 156 has only to calculate the differences with respect to logarithmic-likelihood ratios (i.e., external information) updated by the PR-channel APP decoder 43, 133, 153. Accordingly, the subtracter may well subtract the logarithmic-likelihood ratios of any one of channel data $a'_i$, code data $c'_i$ and deinterleaved code data $e'_i$.

Therefore, the subtracter 86 in the second embodiment shown in FIG. 10 may subtract the logarithmic-likelihood ratios of any one of channel data $a'_i$, channel data $z'_i$ based on the NRZI rules, code data $c'_i$ and deinterleaved code data $e'_i$. Also, the subtracter 115 in the third embodiment shown in FIG. 16 may subtract the logarithmic-likelihood ratios of any one of channel data $z'_i$ based on the NRZI rules, code data $c'_i$ and deinterleaved code data $e'_i$.

Similarly, the subtracter 49, 90, 119, 139, 159 in the first to fifth embodiments has only to calculate differences of the logarithmic-likelihood ratios (i.e., external information) updated by the convolutional-code APP decoder 47, 88, 117, 137, 157. Accordingly, the subtracter may well subtract the logarithmic-likelihood ratios of any one of channel data $a'_i$, channel data $z'_i$ based on the NRZI rules, code data $c'_i$ and deinterleaved code data $e'_i$.

(Sixth Embodiment)

Figure 20:
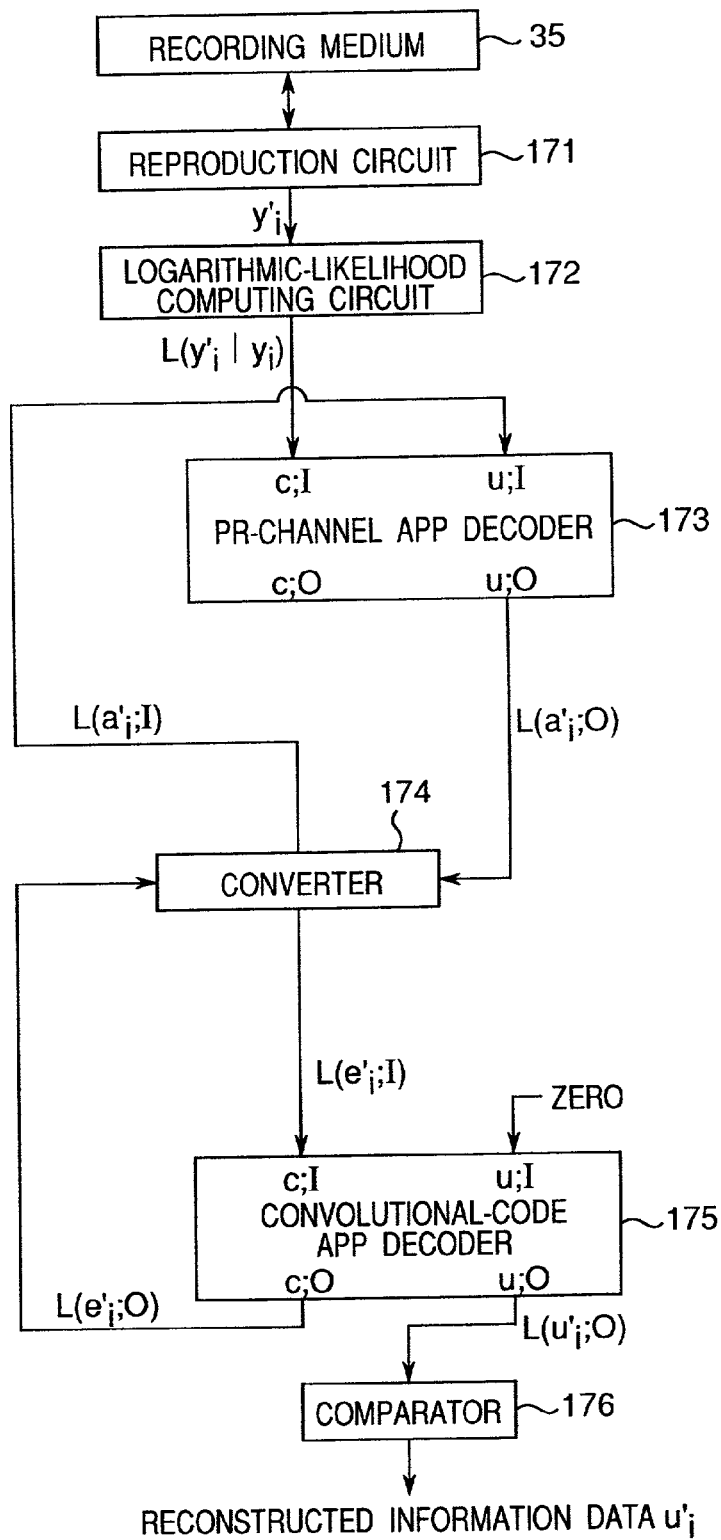
FIG. 20 is a block diagram of a recording-medium reproducing apparatus in a sixth embodiment of the invention.

This embodiment relates to a recording-medium reproducing apparatus resulting from generalizing the first embodiment. FIG. 20 shows a block diagram of a recording-medium reproducing apparatus in a sixth embodiment. A reproduction circuit 171, a logarithmic-likelihood computing circuit 172, a PR-channel APP decoder 173, a convolutional-code APP decoder 175 and a comparator 176 are similar to the reproduction circuit 41, the logarithmic-likelihood computing circuit 42, the PR-channel APP decoder 43, the convolutional-code APP decoder 47 and the comparator 48, respectively, in the recording-medium reproducing apparatus shown in FIG. 1 in the first embodiment.

A converter 174 as the information conversion means receives, as inputs, logarithmic-likelihood ratios $L(a'_i;O)$ of channel data $a'_i$ outputted from the information output terminal u;O of the PR-channel APP decoder 173, and logarithmic-likelihood ratios $L(e'_i;O)$ of code data $e'_i$ outputted from the code output terminal c;O of the convolutional-code APP decoder 175. Then, the converter 174 performs a first process of subjecting the logarithmic-likelihood ratios $L(a'_i;O)$ sequentially to demodulation by the likelihood transform method and deinterleaving, thereby outputting logarithmic-likelihood ratios $L(e'_i;I)$ of the code data $e'_i$. Also, the converter 174 performs a second process of subjecting the logarithmic-likelihood ratios $L(e'_i;O)$ sequentially to interleaving and modulation by the likelihood transform method, thereby outputting logarithmic-likelihood ratios $L(a'_i;I)$ of the code data $a'_i$. Further, on the way of the first and second processes, an intermediate result of the second process on the logarithmic-likelihood ratios $L(e'_i;O)$ is preliminarily subtracted from an intermediate result of the first process on the logarithmic-likelihood ratios $L(a'_i;O)$. Similarly, an intermediate result of the first process on the logarithmic-likelihood ratios $L(a'_i;O)$ is preliminarily subtracted from an intermediate result of the second process on the logarithmic-likelihood ratios $L(e'_i;O)$.

That is, the converter 174 functions as the likelihood-transform RLL demodulator 44, the subtracter 45, the deinterleaver 46, the subtracter 49, the interleaver 50 and the likelihood-transform RLL modulator 51 in the first embodiment.

(Seventh Embodiment)

Figure 21:
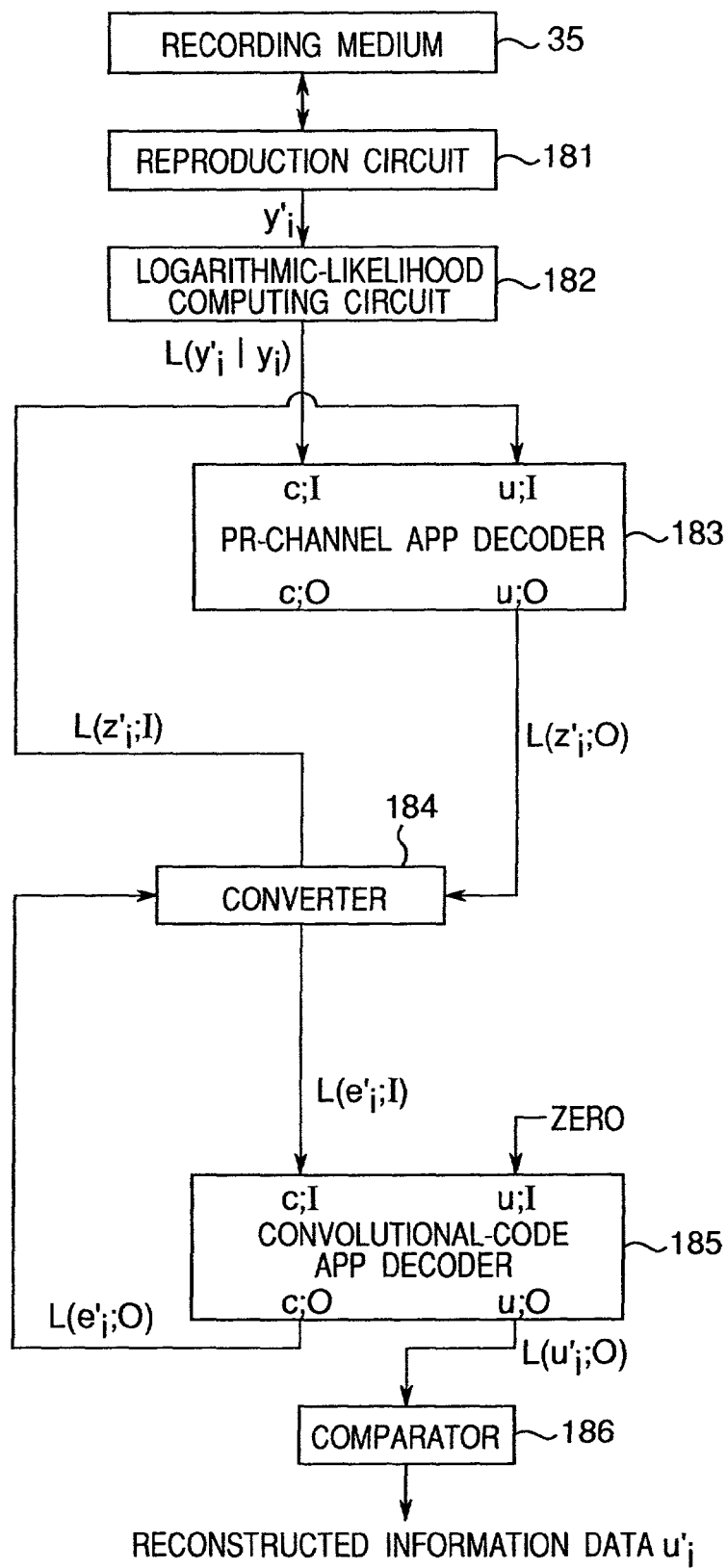
FIG. 21 is a block diagram of a recording-medium reproducing apparatus in a seventh embodiment of the invention.

This embodiment relates to a recording-medium reproducing apparatus resulting from generalizing the third embodiment. FIG. 21 shows a block diagram of a recording-medium reproducing apparatus in a seventh embodiment. A reproduction circuit 181, a logarithmic-likelihood computing circuit 182, a PR-channel APP decoder 183, a convolutional-code APP decoder 185 and a comparator 186 are similar to the reproduction circuit 111, the logarithmic-likelihood computing circuit 112, the PR-channel APP decoder 113, the convolutional-code APP decoder 117 and the comparator 118, respectively, in the recording-medium reproducing apparatus shown in FIG. 16 in the third embodiment.

A converter 184 as the information conversion means receives, as inputs, logarithmic-likelihood ratios $L(z'_i;O)$ of channel data $z'_i$ based on the NRZI rules outputted from the information output terminal u;O of the PR-channel APP decoder 183, and logarithmic-likelihood ratios $L(e'_i;O)$ of code data $e'_i$ outputted from the code output terminal c;O of the convolutional-code APP decoder 185. Then, the converter 184 performs a first process of subjecting the logarithmic-likelihood ratios $L(z'_i;O)$ sequentially to demodulation by the likelihood transform method and deinterleaving, thereby outputting logarithmic-likelihood ratios $L(e'_i;I)$ of the code data $e'_i$. Also, the converter 184 performs a second process of subjecting the logarithmic-likelihood ratios $L(e'_i;O)$ sequentially to interleaving and modulation by the likelihood transform method, thereby outputting logarithmic-likelihood ratios $L(z'_i;I)$ of the channel data $z'_i$ based on the NRZI rules. Further, on the way of the first and second processes, an intermediate result of the second process on the logarithmic-likelihood ratios $L(e'_i;O)$ is preliminarily subtracted from an intermediate result of the first process on the logarithmic-likelihood ratios $L(z'_i;O)$. Similarly, an intermediate result of the first process on the logarithmic-likelihood ratios $L(z'_i;O)$ is subtracted from an intermediate result of the second process on the logarithmic-likelihood ratios $L(e'_i;O)$.

That is, the converter 184 functions as the likelihood-transform RLL demodulator 144, the subtracter 115, the deinterleaver 116, the subtracter 119, the interleaver 120 and the likelihood-transform RLL modulator 121 in the third embodiment.

(Eighth Embodiment)

This embodiment relates to an RLL demodulation method for performing demodulation by the likelihood transform method only from p bits (p: positive integer) of received channel data.

An RLL demodulator for performing demodulation by the above-described likelihood transform method (see the first embodiment) is described below with respect to its constitution by referring to a concrete example thereof.

Figure 22:
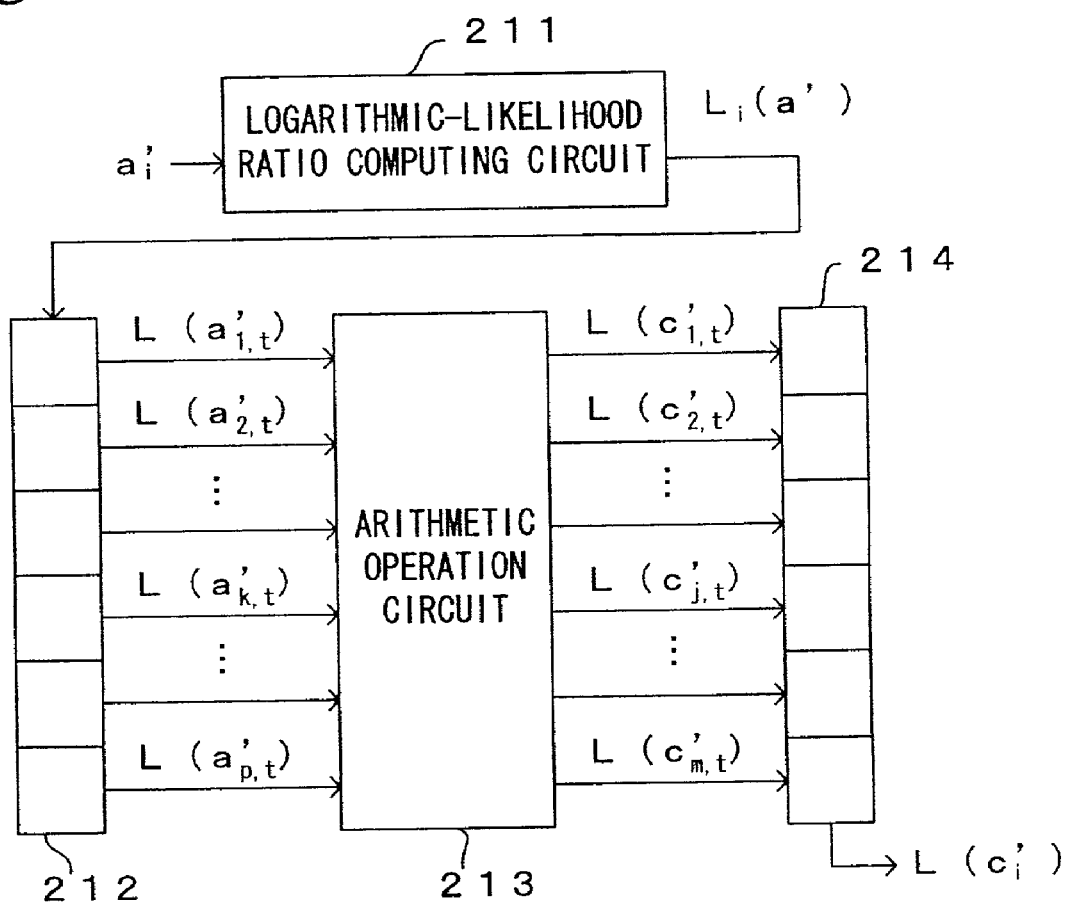
FIG. 22 is a block diagram showing the constitution of an RLL demodulator in an eighth embodiment which performs demodulation by the likelihood transform method as a demodulation method of the invention.

FIG. 22 is a block diagram showing the constitution of an RLL demodulator which performs demodulation by the likelihood transform method. Channel data $a'_i$ before demodulation reproduced from a recording medium serving as a channel are inputted to a logarithmic-likelihood ratio computing circuit 211 at Tw intervals. Then, logarithmic-likelihood ratios are computed by the logarithmic-likelihood ratio computing circuit 211, and logarithmic-likelihood ratios $L(a'_i)$ of the pre-modulation channel data are outputted. Contents of the computations by the logarithmic-likelihood ratio computing circuit 211 in this process will be described later.

The logarithmic-likelihood ratios $L(a'_i)$ of the channel data outputted from the logarithmic-likelihood ratio computing circuit 211 in this way are inputted to a p-stage shift register 212. Then, data are shifted by the p-stage shift register 212 at Tw intervals so that parallel data ($L(a'_{1,t})$, $L(a'_{2,t})$, ..., $L(a'_{k,t})$, ..., $L(a'_{p,t})$) are outputted to an arithmetic operation circuit 213. The arithmetic operation circuit 213 in turn performs arithmetic operations on the inputted parallel data ($L(a'_{1,t})$, $L(a'_{2,t})$, ..., $L(a'_{k,t})$, ..., $L(a'_{p,t})$) based on Equations (22) and (23). Then, the arithmetic operation circuit 213 outputs logarithmic-likelihood ratio parallel data ($L(c'_{1,t})$, $L(c'_{2,t})$, ..., $L(c'_{j,t})$, ..., $L(c'_{m,t})$) of post-demodulation code data to an m-stage shift register 214 (m: positive integer)equipped with a parallel load function.

The m-stage shift register 214 loads in parallel the inputted logarithmic-likelihood ratio parallel data ($L(c_{1,t})$, $L(C'_{2,t})$, ..., $L(c'_{j,t})$, ..., $L(c'_{m,t})$) of post-demodulation code data, and shifts the data at Tb intervals, outputting logarithmic-likelihood ratios $L(c'_i)$ of post-demodulation code data. In this case, the arithmetic operations by the arithmetic operation circuit 213 and the parallel loading by the m-stage shift register 214 are performed synchronously at (m×Tb) intervals. In addition, since the logarithmic-likelihood ratios are real numbers, the p-stage shift register 212 and the m-stage shift register 214 are to hold real numbers.

Next, contents of the operation by the logarithmic-likelihood ratio computing circuit 211 is explained in detail. Generally, this operation is carried out on the assumption that the channel is a simple noise-addition source. That is, channel data $a'_i$ before demodulation is defined by Equation (45):

$$a'_i = a_i + n_i \quad (45)$$

$n_i$: noise added to the channel data $a_i$,

In this case, assuming that the channel (recording medium) is a white Gaussian channel, the logarithmic-likelihood ratios $L(a'_i)$ of channel data outputted from the logarithmic-likelihood ratio computing circuit 211 can be determined from Equation (45) as shown by the following Equation (46):

$$L(a'_i) = Lc \cdot a'_i \quad (46)$$

Lc: constant determined by CNR (Carrier to Noise Ratio).

The CNR is defined by a ratio C/No of the amplitude C of channel data to the power spectrum density No of noise $n_i$, and Lc=2×CNR for the case where the channel is a white Gaussian channel. Accordingly, by multiplying the inputted pre-demodulation channel data $a'_i$ by the constant Lc, the logarithmic-likelihood ratio computing circuit 211 obtains the logarithmic-likelihood ratio $L(a'_i)$ of the channel data.

As described above, the RLL demodulator in this embodiment has the logarithmic-likelihood ratio computing circuit 211 to which the pre-demodulation channel data $a'_i$ reproduced from the channel (recording medium) are inputted at Tw intervals. Then, assuming that the channel is a white Gaussian channel, the logarithmic-likelihood ratios $L(a'_i)$ of channel data are computed and outputted by Equation (46). Further, the logarithmic-likelihood ratios $L(a'_i)$ of real numbers are shifted and transformed into parallel data by the p-stage shift register 212. Then, with respect to the parallel data derived from the p-stage shift register 212, logarithmic-likelihood ratios parallel data of post-demodulation m-bit code data are calculated based on Equations (22) and (23) by the arithmetic operation circuit 213. Finally, the post-demodulation parallel data are loaded in parallel by the m-stage shift register 214 with a parallel load function, and shifted at Tb intervals, so that logarithmic-likelihood ratios $L(c'_i)$ of post-demodulation code data are outputted.

Therefore, the post-demodulation code data outputted from the RLL demodulator in this embodiment are real values, and reconstructed code data, which is soft information, can be outputted to the succeeding-stage turbo decoder. Thus, with the use of the RLL demodulator using the likelihood transform method in which likelihoods before and after demodulation are transformed, turbo decoding is enabled so that the recording density onto recording media can be enhanced, as compared with cases where Viterbi decoders or the like, which are lower in error-correcting capability, are used.

With regard to the RLL demodulator that performs demodulation by the likelihood transform method shown in FIG. 22, concrete operations of the arithmetic operation circuit 213 for performing arithmetic operations based on above Equations (22) and (23) are described in detail below.

As described in conjunction with the first embodiment, FIG. 4 is a demodulation table of RLL(1, 7) standardized by standard ECMA-195 of the Standardizing Information and Communication Systems. Looking up to this demodulation table allows the arithmetic operation circuit 213 to compute two bits of post-demodulation code data (m=2) from seven channel bits (p=7) based on the NRZI rules.

Figure 23:
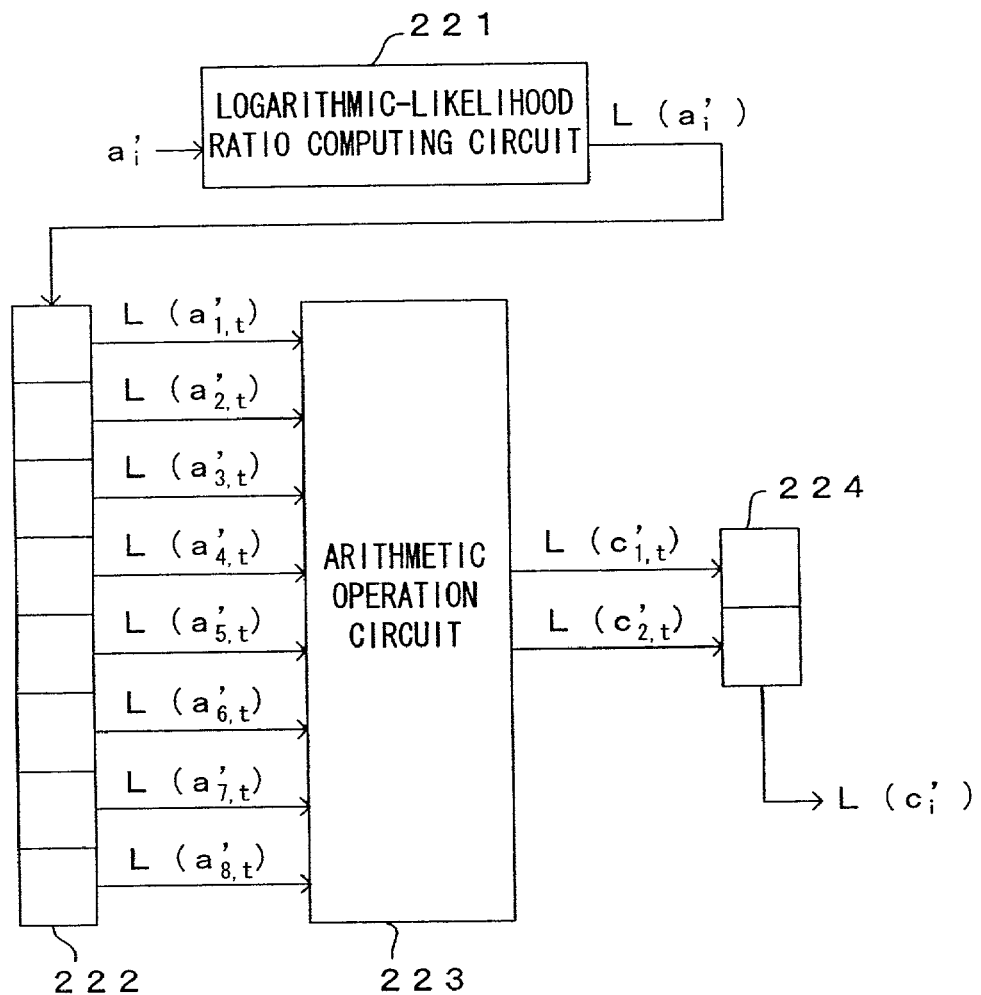
FIG. 23 is a block diagram of an RLL demodulator based on RLL (1, 7)

FIG. 23 shows a block diagram of an RLL demodulator by the likelihood transform method based on RLL(1, 7). The logarithmic-likelihood ratio computing circuit 221, as described above, computes and outputs logarithmic-likelihood ratios $L(a'_i)$ according to the Equation (46) based on a reproduced signal $a'_i$ inputted at Tw intervals.

The $L(a'_i)$ outputted from the logarithmic-likelihood ratio computing circuit 221 are inputted to an 8-stage shift register 222. Then, data are shifted at Tw intervals in the 8-stage shift register 222 so that parallel data $(L(a'_{1,t}), L(a'_{2,t}), \ldots, L(a'_{k,t}), \ldots, L(a'_{8,t}))$ are outputted. An arithmetic operation circuit 223 in turn performs arithmetic operations based on Equations (22) and (23) with the inputted parallel data $(L(a'_{1,t}), L(a'_{2,t}), \ldots, L(a'_{k,t}), \ldots, L(a'_{8,t}))$, outputting logarithmic-likelihood ratio parallel data $(L(c'_{1,t}), L(c'_{2,t}))$ of post-demodulation code data. The contents of arithmetic operations by the arithmetic operation circuit 223 for RLL(1, 7) are similar to the contents of arithmetic operations by the arithmetic operation circuit 62 in the first embodiment, and the description given in conjunction with the arithmetic operation circuit 62 all applies also to this arithmetic operation circuit 223. A 2-stage shift register 224 with a parallel load function loads in parallel the logarithmic-likelihood ratio parallel data $(L(c'_{1,t}), L(c'_{2,t}))$ of post-demodulation code data, and shifts the data at Tb intervals, outputting logarithmic-likelihood ratios $L(c'_i)$ of post-demodulation code data. These arithmetic operations and the parallel loading are performed synchronously at (2×Tb)=(3×Tw) intervals.

(Ninth Embodiment)

FIG. 24 shows a block diagram, different from FIG. 23, of an RLL demodulator using the likelihood transform method based on RLL(1, 7). A logarithmic-likelihood ratio computing circuit 231, as described above, computes and outputs logarithmic-likelihood ratios $L(a'_i)$ according to the above Equation (46) based on a reproduced signal $a'_i$ inputted at Tw intervals.

An NRZI rule converter 232, like the NRZI converter 84 in the second embodiment, receives inputs of the logarithmic-likelihood ratios $L(a'_i)$, and computes and outputs logarithmic-likelihood ratios $L(z'_i)$ of channel data $z'_i$ based on the NRZI rules at Tw intervals. In this case, a "+1" of a channel bit $z_i$ based on the NRZI rules represents a polarity inversion of the reproduced signal, and a "−1" of a channel bit $z_i$ based on the NRZI rules represents an obtainment of the same polarity of the reproduced signal as the preceding bit, i.e. preceding-polarity holding. A conversion table of the NRZI rule converter 232 is as shown in FIG. 11, as in the second embodiment. Logarithmic-likelihood ratios of the channel bits $z_i$ based on the NRZI rules can be calculated according to the foregoing Equation (41).

The logarithmic-likelihood ratios $L(z'_i)$ outputted from the NRZI rule converter 232 are inputted to a 7-stage shift register 233. Then, data are shifted at Tw intervals in the 7-stage shift register 233 so that parallel data $(L(z'_{1,t}), L(z'_{2,t}), \ldots, L(z'_{k,t}), \ldots, L(z'_{7,t}))$ are outputted. An arithmetic operation circuit 234 in turn performs arithmetic operations on the inputted parallel data $(L(z'_{1,t}) L(z'_{2,t}), \ldots, (z'_{k,t}), \ldots, L(z'_{7,t}))$, outputting logarithmic-likelihood ratio parallel data $(L(c'_{1,t}), L(c'_{2,t}))$ of post-demodulation code data. It is noted that contents of arithmetic operations in the case of RLL(1, 7) will be described later. A 2-stage shift register 235 with a parallel load function loads in parallel the logarithmic-likelihood ratio parallel data $(L(c'_{1,t}), L(c'_{2,t}))$ of post-demodulation code data, and shifts the data at Tb intervals, outputting logarithmic-likelihood ratios $L(c'_i)$ of post-demodulation code data. These arithmetic operations and the parallel loading are performed synchronously at (2×Tb) intervals.

Next, contents of arithmetic operations by the arithmetic operation circuit 234 are described in detail. A demodulation table for determining post-demodulation data from channel data based on the NRZI rules is the same as the demodulation table shown in FIG. 13 and used in the second embodiment, and this demodulation table is as already explained. The number of combinations of seven bits of channel bits is 34 (H=34) as shown in FIG. 13. Therefore, it is appropriate for the arithmetic operation circuit 234 to compute Equation (22) by looking up to the demodulation table of FIG. 13. In this case, the arithmetic operations of Equation (22) should be performed under the condition that the symbol $z'_i$ of channel data based on the NRZI rules to be inputted to the arithmetic operation circuit 234 is formally replaced with $a'_i$. In addition, rewriting Equation (22) by using the symbol $z'_i$ of channel data based on the NRZI rules results in the following Equation (47):

$$L(c'_{j,t}) = \ln \frac{\sum_{\substack{h \\ D_{h,j}=1}} \exp\left\{\sum_{k=1}^{7} L(z'_{k,t}) B_{h,k}\right\}}{\sum_{\substack{h \\ D_{h,j}=0}} \exp\left\{\sum_{k=1}^{7} L(z'_{k,t}) B_{h,k}\right\}}$$

In the case of an RLL demodulator using the NRZI rule converter 232 shown in FIG. 24, the channel bits $z'_i$ come in 34 combinations. Thus, since the number of combinations is one half of the number of combinations, 68, for the RLL demodulator that does not use the NRZI converter shown in FIG. 23, the computing amount and the computing time can be reduced.

(Tenth Embodiment)

Figure 25:
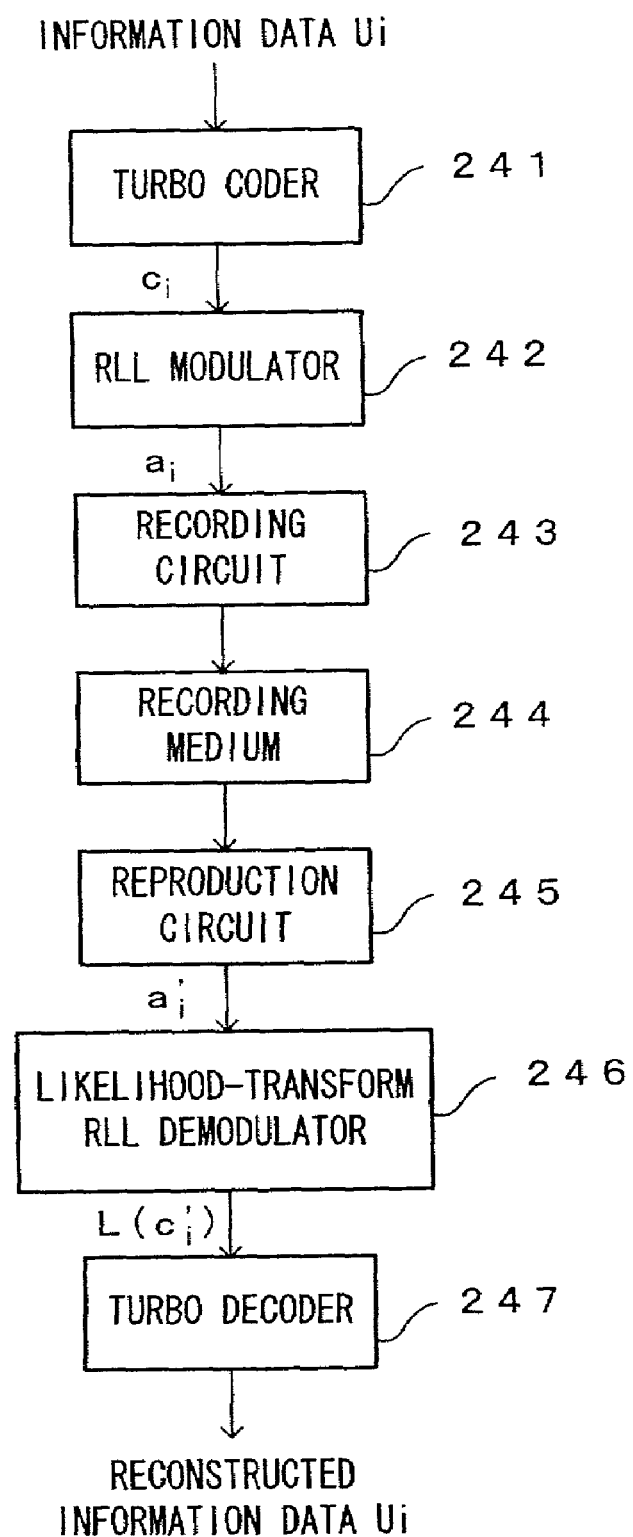
FIG. 25 is a configurational diagram of a recording and reproducing apparatus in a tenth embodiment of the invention, using the RLL demodulator shown in FIG. 23 or 24.

Next, an error-correcting method using the above-described RLL demodulator that performs demodulation by the likelihood transform method is explained. FIG. 25 is a schematic diagram showing the constitution of a recording and reproducing apparatus which implements the error-correcting method. A turbo coder 241 performs error-correcting coding on inputted information data $u_i$, outputting code data $c_i$. An RLL modulator 242 performs RLL modulation on the inputted code data $c_i$, outputting channel data $a_i$. The channel data $a_i$ outputted in this way are recorded on a recording medium 244 by a recording circuit 243. It is noted that the recording circuit 243 implements the recording by magnetic recording, magneto-optical recording, optical recording or the like.

A reproduction circuit 245 reproduces the channel data $a_i$ recorded on the recording medium 244, outputting the reproduced channel data $a'_i$. The channel data $a'_i$ reproduced in this way have undergone deformation such as noise addition, band limiting, intersymbol interference or crosstalk depending on individual characteristics of the recording circuit 243, the recording medium 244 and the reproduction circuit 245. That is, in FIG. 25, the recording circuit 243, the recording medium 244 and the reproduction circuit 245 constitute a channel. As a result, the channel data $a'_i$ reproduced from the recording medium 244 has errors added thereto. The likelihood-transform RLL demodulator 246, which is the likelihood-transform RLL demodulator shown in FIG. 23 or 24 (eighth or ninth embodiment), performs RLL demodulation by the likelihood transform method on the inputted, pre-demodulation channel data $a'_i$ in the way described above, outputting logarithmic-likelihood ratios $L(c'_i)$ of post-demodulation code data. The turbo decoder 247 corrects the errors added by the channel in the inputted logarithmic-likelihood ratios $L(c'_i)$, thus outputting reconstructed information data $u'_i$.

In this case, as already described, the likelihood-transform RLL demodulator 246 can output logarithmic-likelihood ratios $L(c'_i)$ of code data, which are soft information. Therefore, according to the recording and reproducing apparatus shown in FIG. 25, the turbo decoding method can be applied even to cases where the RLL modulation is used. As a result, the recording density onto recording media can be enhanced as compared with cases where the Viterbi coding method, which is lower in error-correcting capability, is used.

(Eleventh Embodiment)

The RLL demodulation in the eighth to tenth embodiments is an RLL demodulation method in which demodulation is performed only from p bits of received channel data as described above. This demodulation by the likelihood transform method can also be applied to demodulation methods in which internal states are held within the demodulator. This embodiment relates to an RLL demodulation method in which internal states are held within the demodulator. The principle of such an RLL demodulation method has already been described in detail in the first embodiment and so its description is omitted here (see Equations (28) to (40)).

Operations of the RLL demodulator that performs demodulation by the likelihood transform method in which internal states are held within the demodulator are explained below by referring to a concrete example thereof.

Figure 26:
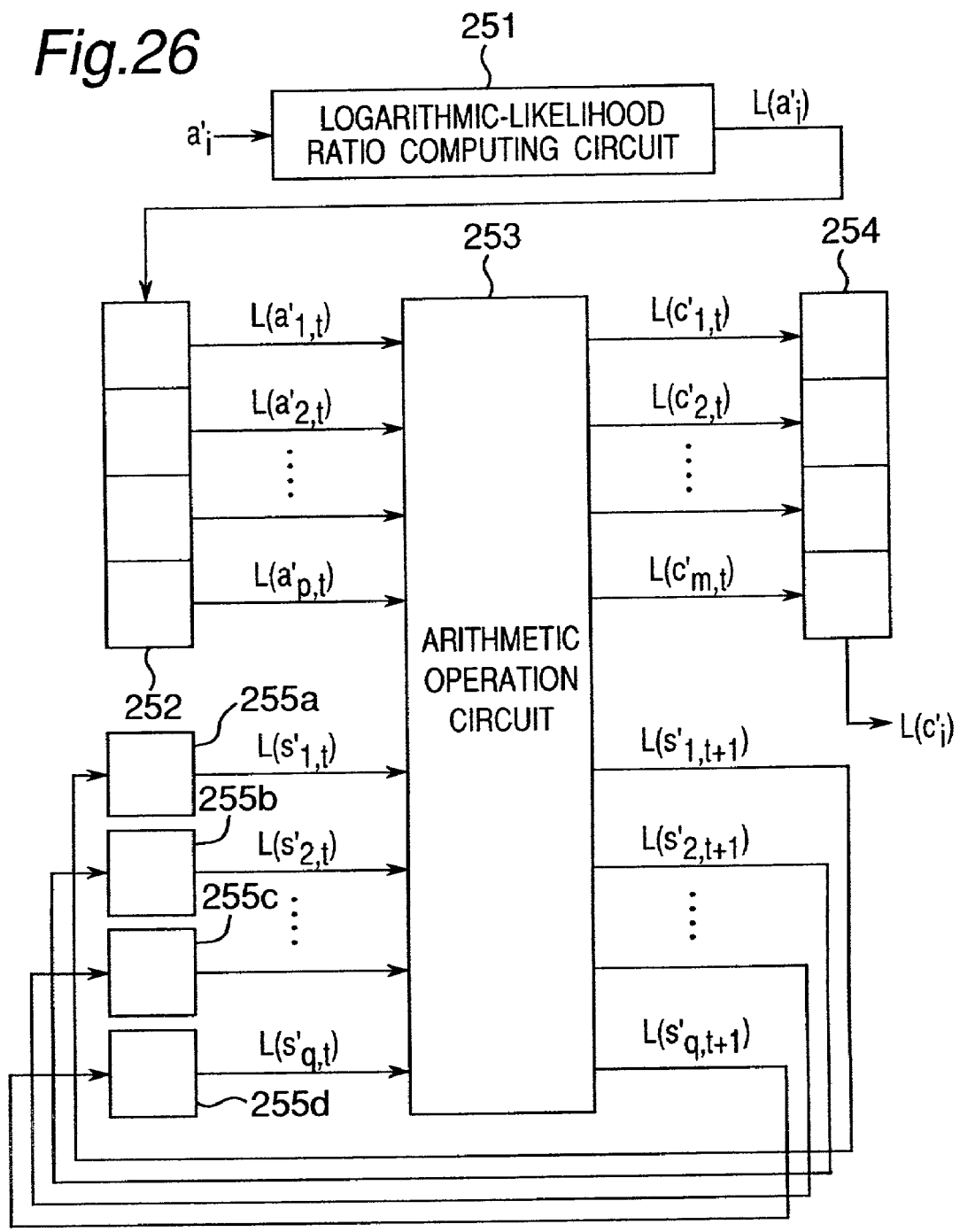
FIG. 26 is a block diagram of an RLL demodulator in an eleventh embodiment of the invention, which performs demodulation by a likelihood transform method in which internal states are held.
Figure 27:
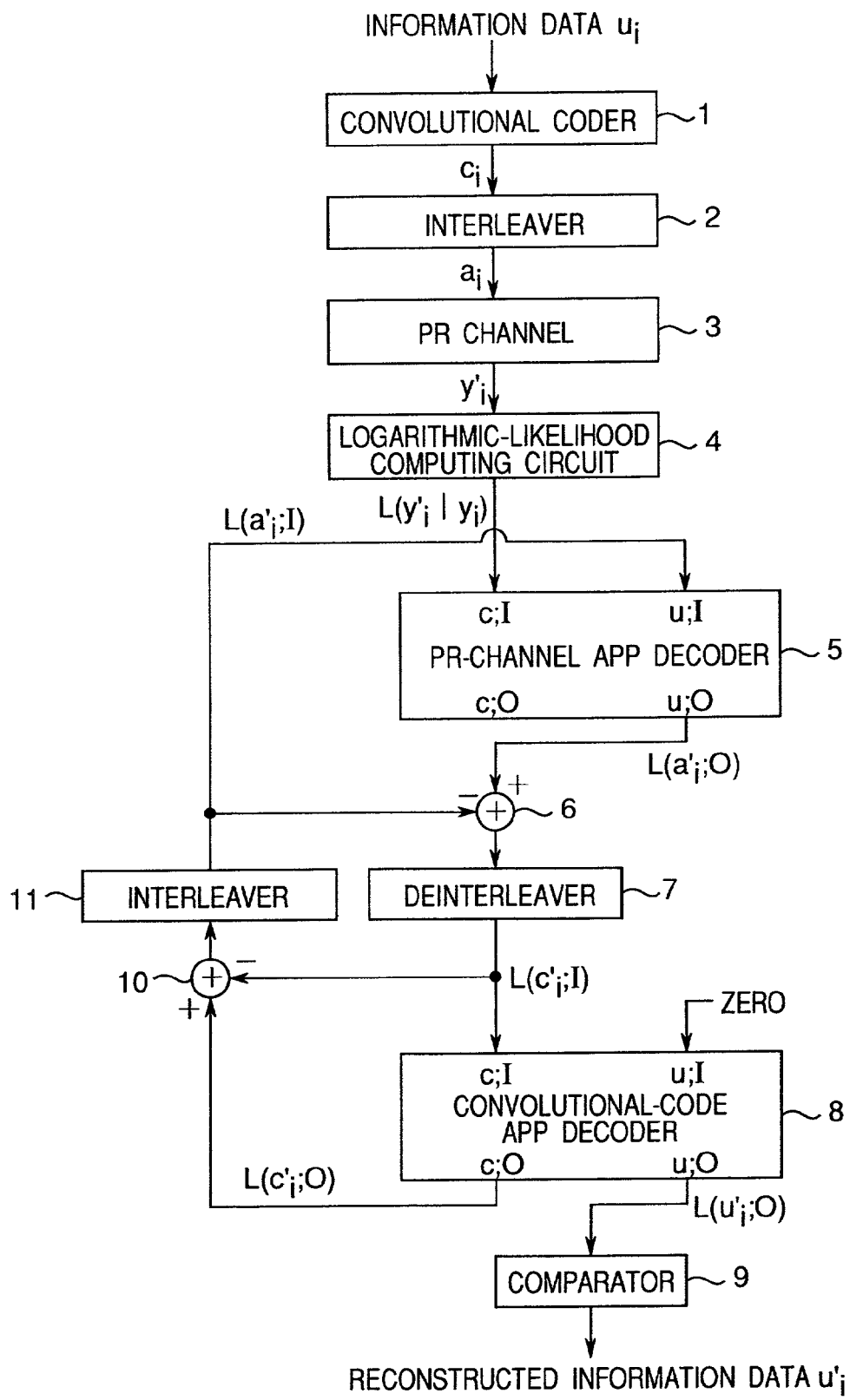
FIG. 27 is a block diagram of a background art recording and reproducing apparatus which performs coding and decoding processes of turbo code s.
Figure 28:
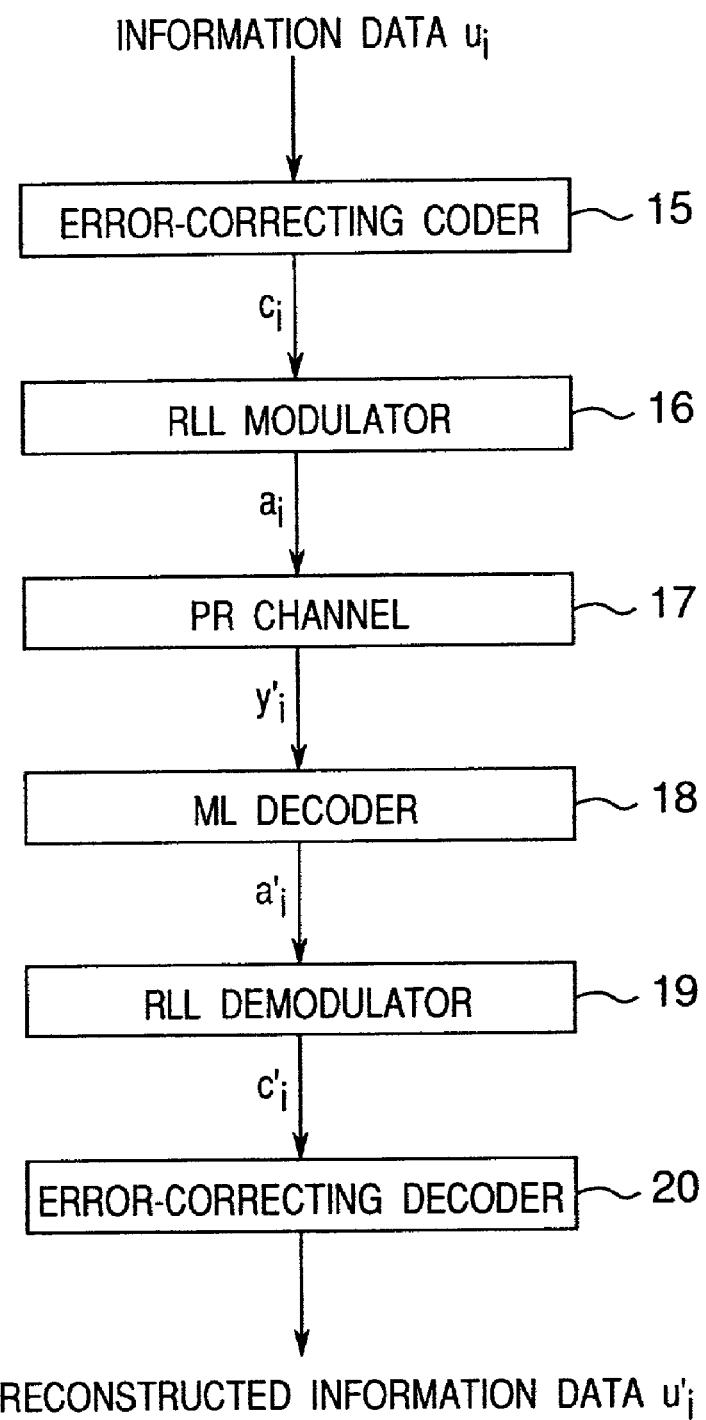
FIG. 28 is a block diagram of a background art recording and reproducing apparatus to which an RLL modulation method is applied.
Figure 29:
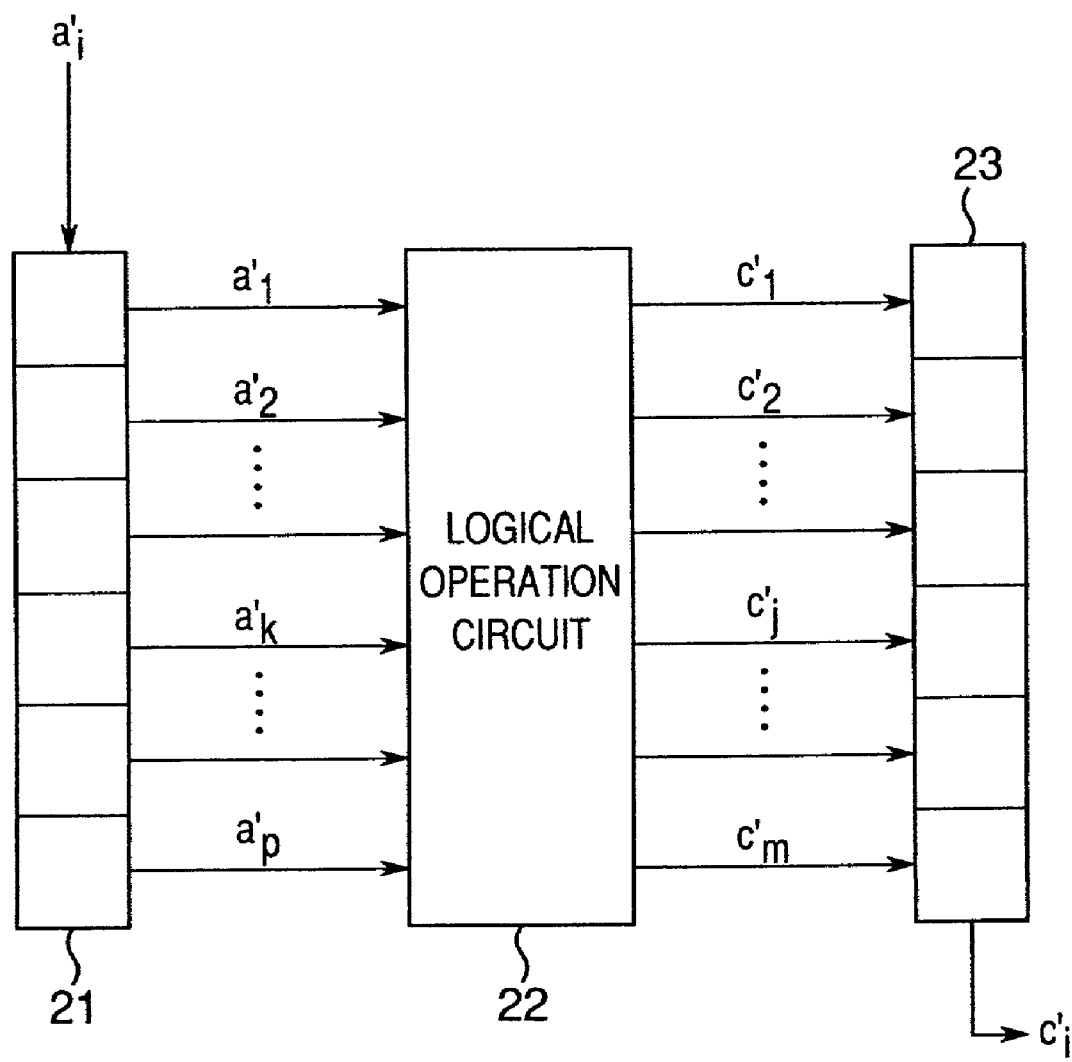
FIG. 29 is a block diagram of a background art RLL demodulator.

FIG. 26 is a block diagram showing the constitution of an RLL demodulator that performs demodulation by the likelihood transform method in which internal states are held within the demodulator. A logarithmic-likelihood ratio computing circuit 251 receives inputs of pre-demodulation channel data $a'_i$ reproduced from a recording medium serving as a channel at the Tw intervals. Then, the logarithmic-likelihood ratio computing circuit 251 computes logarithmic-likelihood ratios and outputs the logarithmic-likelihood ratios $L(a'_i)$ of pre-demodulation channel data.

The logarithmic-likelihood ratios $L(a'_i)$ of channel data outputted from the logarithmic-likelihood ratio computing circuit 251 in this way are inputted to a p-stage (p: positive integer) shift register 252. Then, data are shifted by the p-stage shift register 252 at Tw intervals so that parallel data $(L(a'_{1,t}), L(a'_{2,t}), \ldots, L(a'_{k,t}), \ldots, L(a'_{p,t}))$ are outputted to an arithmetic operation circuit 253. The arithmetic operation circuit 253 in turn performs arithmetic operations on the inputted parallel data $(L(a'_{1,t}), L(a'_{2,t}), \ldots, L(a'_{k,t}), \ldots, L(a'_{p,t}))$ as well as later-described logarithmic-likelihood ratios $(L(s'_{1,t}), L(S'_{2,t}), \ldots, L(s'_{l,t}), \ldots, L(s'_{q,t}))$ of q bits (q: positive integer) representing current internal states based on Equations (36) and (40). Then, the arithmetic operation circuit 253 outputs logarithmic-likelihood ratio parallel data $(L(c'_{1,t}), L(c'_{2,t}), \ldots, L(c'_{j,t}), \ldots, L(c'_{m,t}))$ of post-demodulation code data as well as individual logarithmic-likelihood ratios $(L(s'_{1,t+1}) L(s'_{2,t+1}), \ldots, L(s'_{l,t+1}), \ldots, L(s'_{q,t+1}))$ of q bits (q: Positive integer) representing succeeding internal states.

An m-stage shift register 254 with a parallel load function loads in parallel the logarithmic-likelihood ratio parallel data $(L(c'_{1,t}), L(c'_{2,t}), \ldots, L(c'_{j,t}), L(c'_{m,t}))$ of post-demodulation code data derived from the arithmetic operation circuit 253, and shifts the data at Tb intervals, outputting logarithmic-likelihood ratios $L(c'_i)$ of post-demodulation code data. Also, the logarithmic-likelihood ratios $(L(s'_{1,t+1}), L(S'_{2,t+1}), \ldots, L(s'_{q,t+1}))$ representing succeeding internal states and derived from the arithmetic operation circuit 253 are inputted to registers 255a, 255b, ..., 255d, respectively. It is noted that the registers 255a, 255b, ..., 255d correspond to the bits representing the internal states, respectively, hence the registers 255a, 255b, ..., 255d counting q as a total number of registers. The register 255a loads, and holds, the first logarithmic-likelihood ratio $L(s'_{1,t+1})$ of the succeeding internal states at (m×Tb) intervals. The register 255a outputs the first logarithmic-likelihood ratio $L(s'_{1,t})$ of the current internal states at the next time point to the arithmetic operation circuit 253. Similarly, the other registers 255b, ..., 255d also load and hold the second, ..., "q"th logarithmic-likelihood ratios $L(s'_{2,t+1}), \ldots, L(s'_{q,t+1})$ of the succeeding internal states, and output the second, ..., "q"th logarithmic-likelihood ratios $L(s'_{2,t}), \ldots, L(s'_{q,t})$ of the current internal states. In this case, the arithmetic operations by the arithmetic operation circuit 253, the parallel loading by the m-stage shift register 254 and the loading by the registers 255a, ..., 255d are performed synchronously at (m×Tb) intervals.

Thus, in the RLL demodulator of this embodiment, logarithmic-likelihood ratios $L(a'_i)$ of pre-demodulation channel data inputted from the logarithmic-likelihood ratio computing circuit 251 are shifted and transformed into parallel data by the p-stage shift register 252. Then, the arithmetic operation circuit 253 performs arithmetic operations of Equations (36) and (40) on the parallel data derived from the p-stage shift register 252 and the individual logarithmic-likelihood ratios representing the current internal states derived from the registers 255a to 255d, thereby computing logarithmic-likelihood ratio parallel data of post-demodulation code data and logarithmic-likelihood ratios representing succeeding internal states. Finally, by the m-stage shift register 254 with a parallel load function, the post-demodulation parallel data are loaded in parallel, shifted at Tb intervals, by which logarithmic-likelihood ratios $L(c'_i)$ of post-demodulation code data are outputted.

Also, the individual logarithmic-likelihood ratios representing the succeeding internal states derived from the arithmetic operation circuit 253 are loaded and held at (m×Tb) intervals to the registers 255a to 255d. Then, at the next time point, the data are outputted to the arithmetic operation circuit 253 as logarithmic-likelihood ratios of the current internal states.

Therefore, the post-demodulation code data outputted from the RLL demodulator in this embodiment are real numbers, and reconstructed code data as soft information can be outputted to the succeeding-stage turbo decoder. Thus, use of an error-correcting decoder or the like of high error-correcting capability is enabled so that the recording density onto recording media can be enhanced.

Also in this embodiment, of course, the simplified method in which the computations of the exponential function "exp" and the natural logarithm function "in" are omitted can be applied to Equation (36), as in the case of the eighth embodiment. Thus, arithmetic processing by the arithmetic operation circuit 253 can be simplified.

Further, the RLL demodulator of this embodiment may be used as the likelihood-transform RLL demodulator 246 in the recording and reproducing apparatus shown in FIG. 25.

In addition, in the eighth to eleventh embodiments, since the logarithmic-likelihood ratios are real numbers, the p-stage shift registers 212, 222, 233, 252, the m-stage shift registers 214, 224, 235, 254 and the registers 255a–255d are to hold real numbers. These real numbers may be numbers quantized with floating-point precision or fixed-point precision, and furthermore may be numbers of integer precision. Generally, the floating-point precision, the fixed-point precision and the integer precision are ranked in terms of arithmetic precision, higher to lower, in this order.

Also in the eighth to eleventh embodiments, turbo coding is used as the error-correcting coding. However, the present invention is not limited to this, and any error-correcting method of soft-information inputs will do. In this case, the turbo coder 241 in FIG. 25 may be replaced with an error-correcting coder, and the turbo decoder 247 may be replaced with an error-correcting decoder.

Also, the modulation method is not limited to the Run Length Limited modulation. The present invention is applicable to any modulation method based on symbol correspondence rules between post-demodulation data and pre-demodulation data, or to any modulation method based on correspondence rules between symbols of pre-demodulation data as well as current internal states and symbols of post-demodulation data as well as succeeding internal states.

Also, although time invariant demodulation methods are used in the eighth to eleventh embodiments, this is not limitative. It is noted here that the time invariant demodulation method means that the function of Equation (10) or (33) does not vary with respect to the time point "t." However, the present invention is applicable also to time variant demodulation methods. It is noted here that the time variant demodulation method means that the function of Equation (10) or (33) varies with respect to the time point "t." In the case where a time variant demodulation method is applied, the function for performing likelihood transform may be varied in correspondence to variations of the function of Equation (10) or (33). That is, the function of Equation (22) or (40) may be varied on a time-point basis.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A coding method comprising: subjecting information data sequentially to a convolutional coding by coding means, a pseudo-random interleaving means and a Run Length Limited modulation by modulation means to thereby create channel data.

2. A recording medium on which channel data created by the coding method as defined in claim 1 is recorded.

3. A decoding method for decoding of information data which has been subjected sequentially to an error-correcting coding, a pseudo-random interleaving and a modulation so as to be formed into channel data, the channel data being generated to be reproduced over a passage through a channel, where the information data is decoded based on reproduced data of the channel data, the decoding method comprising the steps of:

computing bit-wise probabilities of the reproduced data by probability computing means;

performing a first APP decoding process for, upon receiving inputs of bit-wise probabilities of the reproduced data and a priori information concerning channel data, creating and outputting a posteriori probabilities of the channel data in compliance with constraints concerning the channel data by a first APP decoding means;

performing a second APP decoding process for, upon receiving inputs of a priori information concerning code data, creating and outputting a posteriori probabilities of the information data and a posteriori probabilities of the code data in compliance with constraints concerning error-correcting codes by a second APP decoding means; and performing a transform process for, upon receiving inputs of the a posteriori probabilities of channel data created by the first APP decoding process and the a posteriori probabilities of code data created by the second APP decoding process, demondulating information concerning the a posteriori probabilities of channel data as well as modulating information concerning the a posteriori probabilities of code data and moreover creating extrinsic information concerning code data updated by the first APP decoding process and outputting the extrinsic information as a priori information concerning the code data to the second APP decoding process while creating extrinsic information concerning channel data updated by the second APP decoding process and outputting the extrinsic information as a priori information concerning the channel data to the first APP decoding process, where the first APP decoding process, second APP decoding process and transform process iteratively performed to implement an iterative decoding.

4. The decoding method according to claim 3, wherein the probabilities and the a posteriori probabilities are given by using logarithmic-likelihood ratios, and the a priori information and the extrinsic information are given by using values of the logarithmic-likelihood ratios.

5. The decoding method according to claim 3, wherein the error-correcting coding to which the information data is subjected to create channel data to be passed through the channel is convolutional coding.

6. A recording-medium reproducing apparatus comprising:

reproduction means for, from a recording medium on which channel data is recorded, the channel data resulting from subjecting information data sequentially to error-correcting coding, pseudo-random substitution and modulation, reproducing the recorded channel data and outputting the reproduced data; and decoding means for obtaining a posteriori probabilities of the information data from the reproduced data by the decoding method as defined in claim 3 and reconstructing the information data according to the a posteriori probabilities of the information data.

7. The decoding method according to claim 3, wherein the constraints concerning channel data applied to the first APP decoding process are at least one of either constraints concerning the modulation method of the modulation to which the information data is subjected or constraints concerning the channel.

8. The decoding method according to claim 7, wherein the constraints concerning the modulation method are given by RLL.

9. The decoding method according to claim 7, wherein the constraints concerning the channel are given by constraints concerning partial response transfer characteristics.

10. The decoding method according to claim 3, wherein the transform process comprises:
a first process of subjecting the inputted a posteriori probabilities of channel data to a demodulation process that is based on a probability transform method followed by a pseudo-random interleaving process;
a second process of subjecting the inputted a posteriori probabilities of code data to a pseudo-random interleaving process, followed by a modulation process that is based on a probability transform method;
a third process of, based on intermediate results of the first process for the a posteriori probabilities of channel data as well as intermediate results of the second process for the a posteriori probabilities of code data, transforming a posteriori probabilities obtained as the intermediate results of the first process into extrinsic information, and moreover making the first process proceed with the resulting extrinsic information, during performance of the first and second processes; and
a fourth process of, based on intermediate results of the second process for the a posteriori probabilities of code data as well as intermediate results of the first process for the a posteriori probabilities of channel data, transforming a posteriori probabilities obtained as the intermediate results of the second process into extrinsic information, and moreover making the second process proceed with the resulting extrinsic information, during performance of the first and second processes,
whereby extrinsic information concerning the code data and extrinsic information concerning the channel data are created.

11. The decoding method according to claim 10, wherein the demodulation by the probability transform method comprises the steps of:
calculating post-demodulation data from pre-demodulation data according to symbol correspondence rules between pre-demodulation data and post-demodulation data by demodulation computing means, where a unit of concatenated bits in digital data is taken as a symbol; and
computing symbol-wise probabilities of post-demodulation data from bit-wise probabilities of the pre-demodulation data according to the symbol correspondence rules and computing bit-wise probabilities of the post-demodulation data from symbol-wise probabilities of the post-demodulation data, by the demodulation computing means, to thereby obtain bit-wise probabilities of the post-demodulation data from bit-wise probabilities of the pre-demodulation data.

12. The decoding method according to claim 11, wherein the symbol correspondence rules are given by a rule table or a logical expression.

13. The decoding method according to claim 11, wherein the probabilities are given by using logarithmic-likelihood ratios.

14. The decoding method according to claim 11, wherein the modulation to which the information data is subjected to create channel data to be passed through the channel is RLL modulation, and
the symbol correspondence rules are symbol correspondence rules based on an RLL modulation method.

15. The decoding method according to claim 10, wherein the demodulation by the probability transform method comprises the steps of:
calculating post-demodulation data from pre-demodulation data by demodulation computing means according to correspondence rules between symbols of pre-demodulation data as well as current internal states of the demodulation computing means and symbols of post-demodulation data as well as succeeding internal states of the demodulation computing means, where a unit of concatenated bits in digital data is taken as a symbol; and
computing symbol-wise probabilities of post-demodulation data and symbol-wise probabilities of succeeding internal states from bit-wise probabilities of the pre-demodulation data and bit-wise probabilities of current internal states according to the symbol correspondence rules, computing bit-wise probabilities of the post-demodulation data from symbol-wise probabilities of the post-demodulation data, and computing bit-wise probabilities of the succeeding internal states from symbol-wise probabilities of the succeeding internal states, by the demodulation computing means, to thereby obtain bit-wise probabilities of the post-demodulation data from bit-wise probabilities of the pre-demodulation data.

16. The decoding method according to claim 15, wherein the symbol correspondence rules are given by a rule table or a logical expression.

17. The decoding method according to claim 15, wherein the probabilities are given by using logarithmic-likelihood ratios.

18. The decoding method according to claim 15, wherein the modulation to which the information data is subjected to create channel data to be passed through the channel is RLL modulation, and
the symbol correspondence rules are symbol correspondence rules based on an RLL modulation method.

19. The decoding method according to claim 10, wherein the modulation by the probability transform method comprises the steps of:
calculating post-modulation data from pre-modulation data according to symbol correspondence rules between pre-modulation data and post-modulation data by modulation computing means, where a unit of concatenated bits in digital data is taken as a symbol; and
computing symbol-wise probabilities of post-modulation data from bit-wise probabilities of the pre-modulation data according to the symbol correspondence rules and computing bit-wise probabilities of post-modulation data from symbol-wise probabilities of the post-modulation data, by the modulation computing means, to thereby obtain bit-wise probabilities of the post-modulation data from bit-wise probabilities of the pre-modulation data.

20. The decoding method according to claim 19, wherein the symbol correspondence rules are given by a rule table or a logical expression.

21. The decoding method according to claim 19, wherein the probabilities are given by using logarithmic-likelihood ratios.

22. The decoding method according to claim 19, wherein the modulation to which the information data is subjected to create channel data to be passed through the channel is RLL modulation, and
the symbol correspondence rules are symbol correspondence rules based on an RLL modulation method.

23. The decoding method according to claim 10, wherein the modulation by the probability transform method comprises the steps of:
calculating post-modulation data from pre-modulation data according to correspondence rules between symbols of pre-modulation data as well as current internal states of a modulation computing means and symbols of post-modulation data as well as succeeding internal states of the modulation computing means by the modulation computing means, where a unit of concatenated bits in digital data is taken as a symbol; and
computing symbol-wise probabilities of post-modulation data and symbol-wise probabilities of succeeding internal states from bit-wise probabilities of the pre-modulation data and bit-wise probabilities of current internal states according to the symbol correspondence rules, computing bit-wise probabilities of the post-modulation data from symbol-wise probabilities of the post-modulation data, and computing bit-wise probabilities of the succeeding internal states from symbol-wise probabilities of the succeeding internal states, by the modulation computing means, to thereby obtain bit-wise probabilities of the post-modulation data from bit-wise probabilities of the pre-modulation data.

24. The decoding method according to claim 23, wherein the symbol correspondence rules are given by a rule table or a logical expression.

25. The decoding method according to claim 23, wherein the probabilities are given by using logarithmic-likelihood ratios.

26. The decoding method according to claim 23, wherein the modulation to which the information data is subjected to create channel data to be passed through the channel is RLL modulation, and
the symbol correspondence rules are symbol correspondence rules based on an RLL modulation method.

27. A demodulation method for calculating post-demodulation data from pre-demodulation data by demodulation computing means according to symbol correspondence rules between pre-demodulation data and post-demodulation data, where a unit of concatenated bits in digital data is taken as a symbol, the demodulation method comprising the steps of:
computing bit-wise likelihoods of the inputted pre-demodulation data by likelihood computing means; and
computing symbol-wise likelihoods of post-demodulation data from bit-wise likelihoods of the pre-demodulation data by the demodulation computing means according to the symbol correspondence rules, and computing bit-wise likelihoods of post-demodulation data from the symbol-wise likelihoods of the post-demodulation data, to thereby obtain bit-wise likelihoods of the post-demodulation data from the bit-wise likelihoods of the pre-demodulation data.

28. The demodulation method according to claim 27, wherein
the symbol correspondence rules are given by a rule table or a logical expression.

29. The demodulation method according to claim 27, wherein
the bit-wise likelihoods are given by using logarithmic-likelihood ratios.

30. The demodulation method according to claim 27, wherein
the symbol correspondence rules are symbol correspondence rules based on an RLL modulation method.

31. An error-correcting method comprising the step of performing error correction by error-correcting means on the bit-wise likelihoods of the post-demodulation data obtained from the pre-demodulation data by the demodulation method as defined in claim 27.

32. A recording-medium reproducing apparatus comprising:
reproduction means for reproducing channel data recorded on a recording medium;
demodulation means for obtaining bit-wise likelihoods of post-demodulation data from the reproduced channel data by the demodulation method as defined in claim 27; and
error-correction decoding means for correcting any errors of the bit-wise likelihoods of the post-demodulation data and reconstructing the data to information data.

33. A demodulation method for calculating post-demodulation data from pre-demodulation data by demodulation computing means according to correspondence rules between symbols of pre-demodulation data and current internal states of the demodulation computing means and symbols of post-demodulation data as well as succeeding internal states of the demodulation computing means, where a unit of concatenated bits in digital data is taken as a symbol, the demodulation method comprising the steps of:
computing bit-wise likelihoods of the inputted pre-demodulation data by likelihood computing means; and
by the demodulation computing means, computing symbol-wise likelihoods of post-demodulation data and symbol-wise likelihoods of succeeding internal states from bit-wise likelihoods of the pre-demodulation data and bit-wise likelihoods of current internal states according to the symbol correspondence rules, computing bit-wise likelihoods of post-demodulation data from the symbol-wise likelihoods of the post-demodulation data, and computing bit-wise likelihoods of succeeding internal states from the symbol-wise likelihoods of the succeeding internal states, to thereby obtain bit-wise likelihoods of the post-demodulation data from the bit-wise likelihoods of the pre-demodulation data.

34. The demodulation method according to claim 33, wherein
the symbol correspondence rules are given by a rule table or a logical expression.

35. The demodulation method according to claim 33, wherein
the bit-wise likelihoods are given by using logarithmic-likelihood ratios.

36. The demodulation method according to claim 33, wherein
the symbol correspondence rules are symbol correspondence rules based on an RLL modulation method.

37. An error-correcting method comprising the step of performing error correction by error-correcting means on the bit-wise likelihoods of the post-demodulation data obtained from the pre-demodulation data by the demodulation method as defined in claim 33.

38. A recording-medium reproducing apparatus comprising:

reproduction means for reproducing channel data recorded on a recording medium;

demodulation means for obtaining bit-wise likelihoods of post-demodulation data from the reproduced channel data by the demodulation method as defined in claim 33; and error-correction decoding means for correcting any errors of the bit-wise likelihoods of the post-demodulation data and reconstructing the data to information data.

* * * * *